(12) United States Patent
Chiu et al.

(10) Patent No.: US 12,336,251 B2
(45) Date of Patent: *Jun. 17, 2025

(54) FORMATION OF TRANSISTOR GATES

(71) Applicant: TAIWAN SEMICONDUCTOR MANUFACTURING COMPANY, LTD., Hsinchu (TW)

(72) Inventors: Yen-Jui Chiu, Hsinchu (TW); Yao-Teng Chuang, Hsinchu (TW); Kuei-Lun Lin, Keelung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/403,523

(22) Filed: Jan. 3, 2024

(65) Prior Publication Data
US 2024/0154024 A1 May 9, 2024

Related U.S. Application Data

(63) Continuation of application No. 17/340,037, filed on Jun. 6, 2021, now Pat. No. 11,901,436.

(60) Provisional application No. 63/157,499, filed on Mar. 5, 2021.

(51) Int. Cl.
*H10D 64/01* (2025.01)
*H10D 30/67* (2025.01)
*H10D 86/01* (2025.01)

(52) U.S. Cl.
CPC .......... *H10D 64/017* (2025.01); *H10D 64/01* (2025.01); *H10D 86/0221* (2025.01); *H10D 86/0231* (2025.01); *H10D 30/6735* (2025.01)

(58) Field of Classification Search
CPC ............ H01L 29/66545; H01L 27/127; H01L 27/1288; H01L 29/401; H01L 29/42392
See application file for complete search history.

(56) References Cited

U.S. PATENT DOCUMENTS

| | | | |
|---|---|---|---|
| 11,901,436 B2* | 2/2024 | Chiu | H01L 29/401 |
| 2009/0047790 A1 | 2/2009 | Raghu et al. | |
| 2017/0330972 A1* | 11/2017 | Kloster | H01L 21/31058 |
| 2018/0138045 A1* | 5/2018 | Xu | H01L 29/66795 |
| 2019/0006487 A1* | 1/2019 | Huang | H01L 21/02321 |
| 2020/0058548 A1 | 2/2020 | Han et al. | |
| 2020/0091348 A1 | 3/2020 | Guha et al. | |
| 2021/0327760 A1 | 10/2021 | Ho et al. | |

* cited by examiner

*Primary Examiner* — Monica D Harrison
*Assistant Examiner* — Andre C Stevenson
(74) *Attorney, Agent, or Firm* — Maschoff Brennan

(57) ABSTRACT

A method includes following steps. A first gate dielectric layer is deposited over a first semiconductor channel and a second semiconductor channel. A second gate dielectric layer is deposited over the first gate dielectric layer. A layer is formed over the second gate dielectric layer using atomic layer deposition (ALD) cycles each comprising sequentially performing a first pulse step for a first pulse time, a first purge step for a first purge time, a second pulse step for a second pulse time, and a second purge step for a second purge time. A ratio of the first purge time to the first pulse time is greater than a ratio of the second purge time to the second pulse time. The layer is patterned to expose a portion of the second gate dielectric layer. The exposed portion of the second gate dielectric layer is etched.

20 Claims, 54 Drawing Sheets

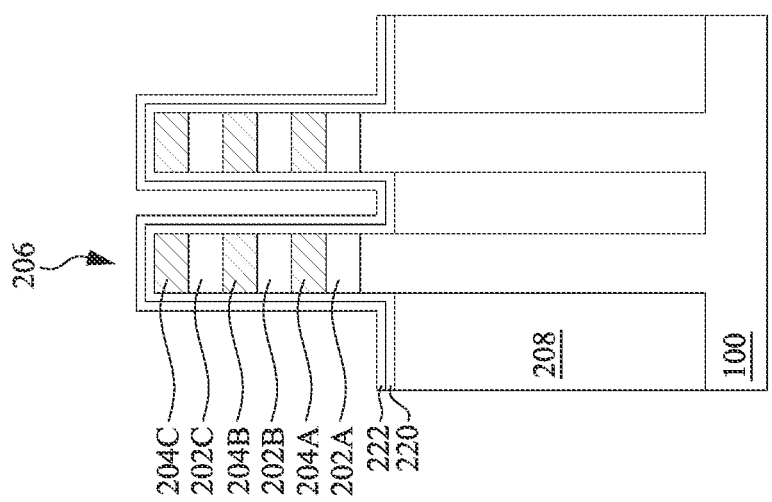

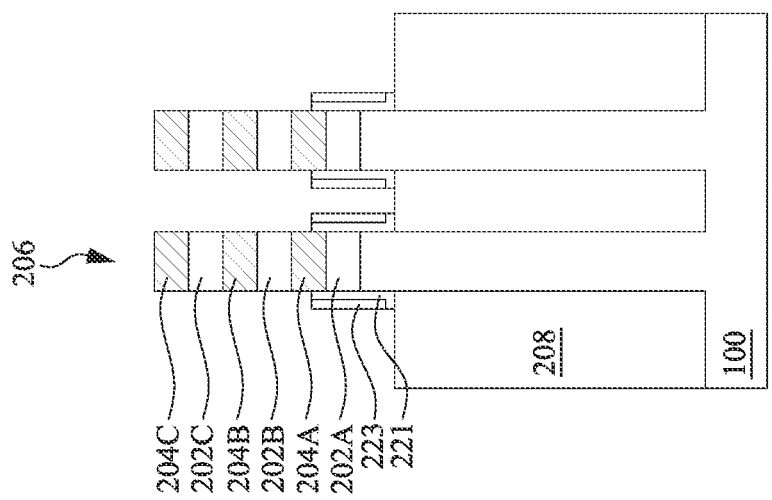

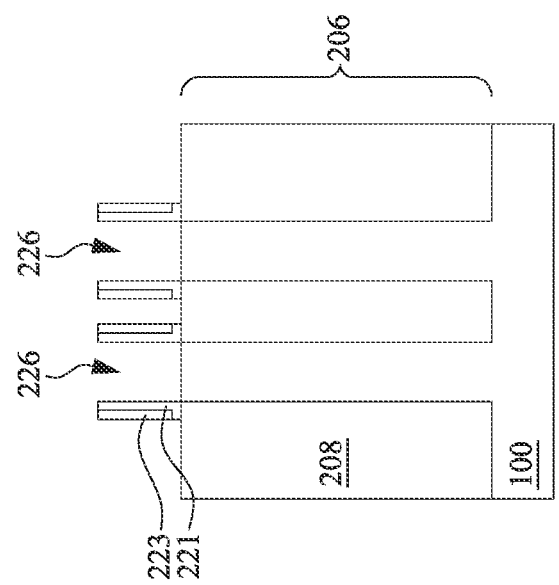

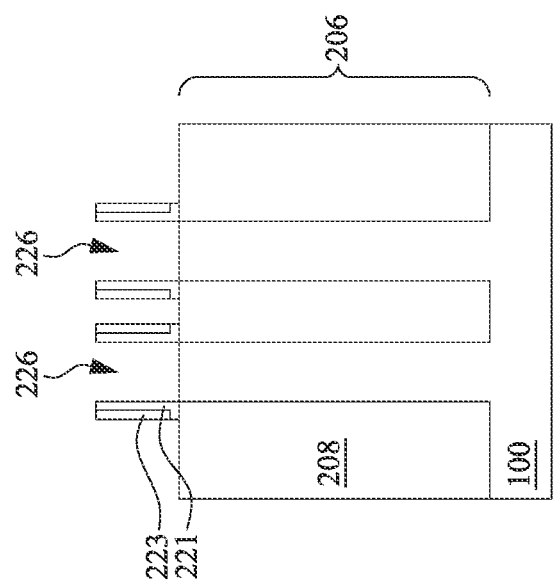

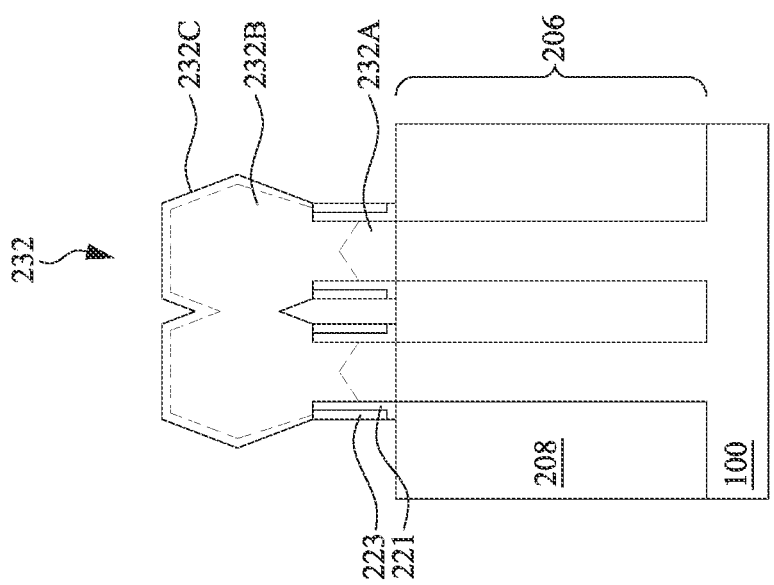

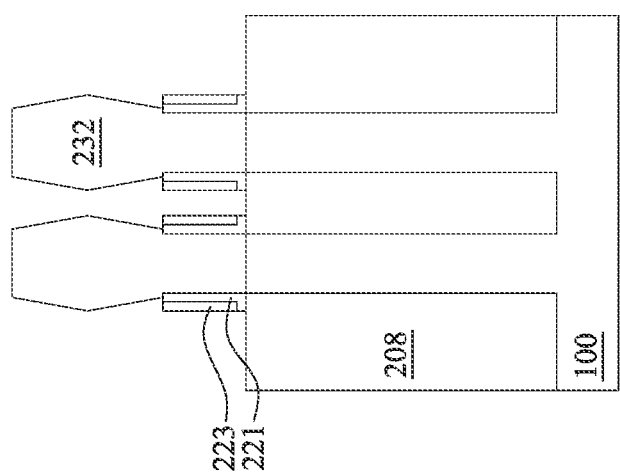

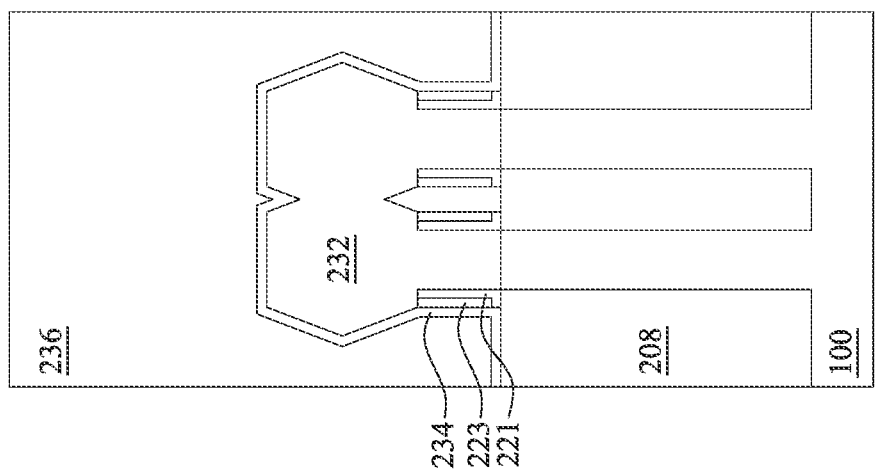

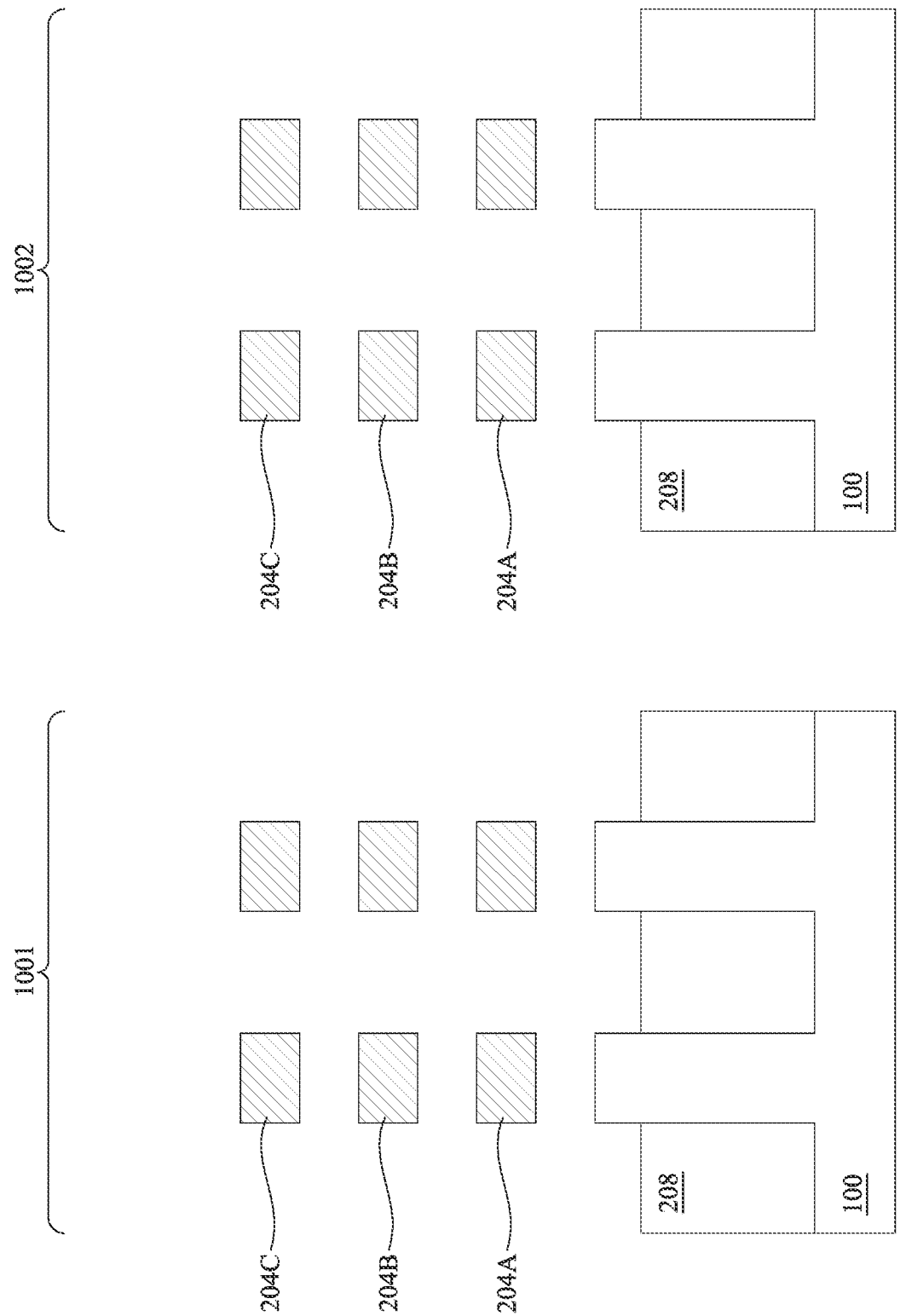

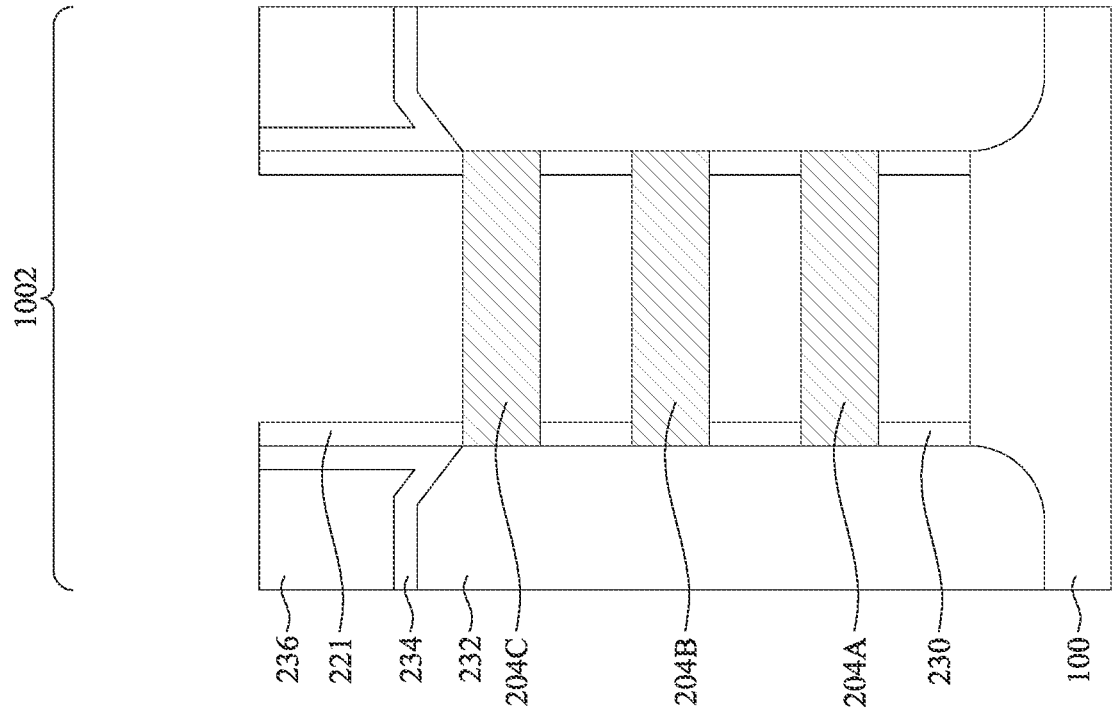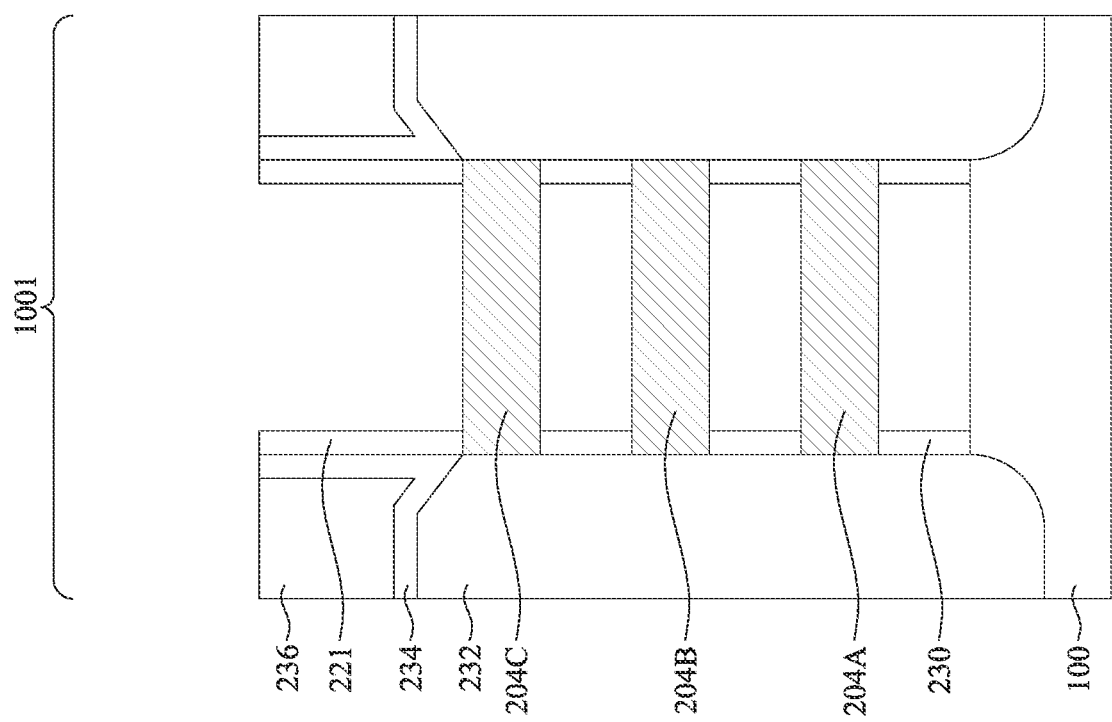
Fig. 16B

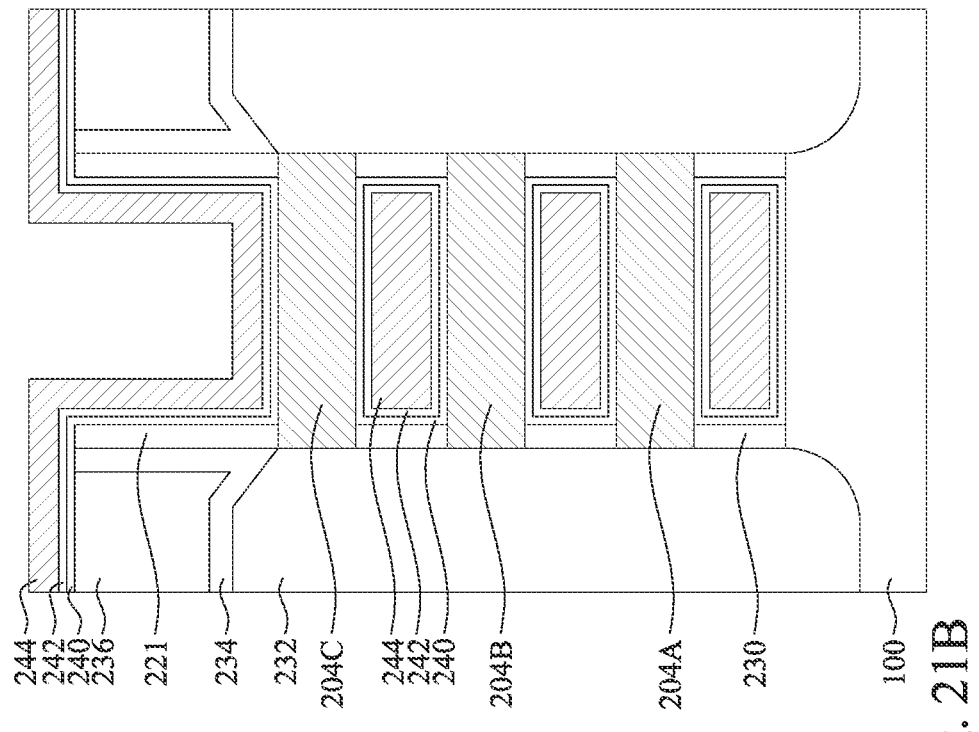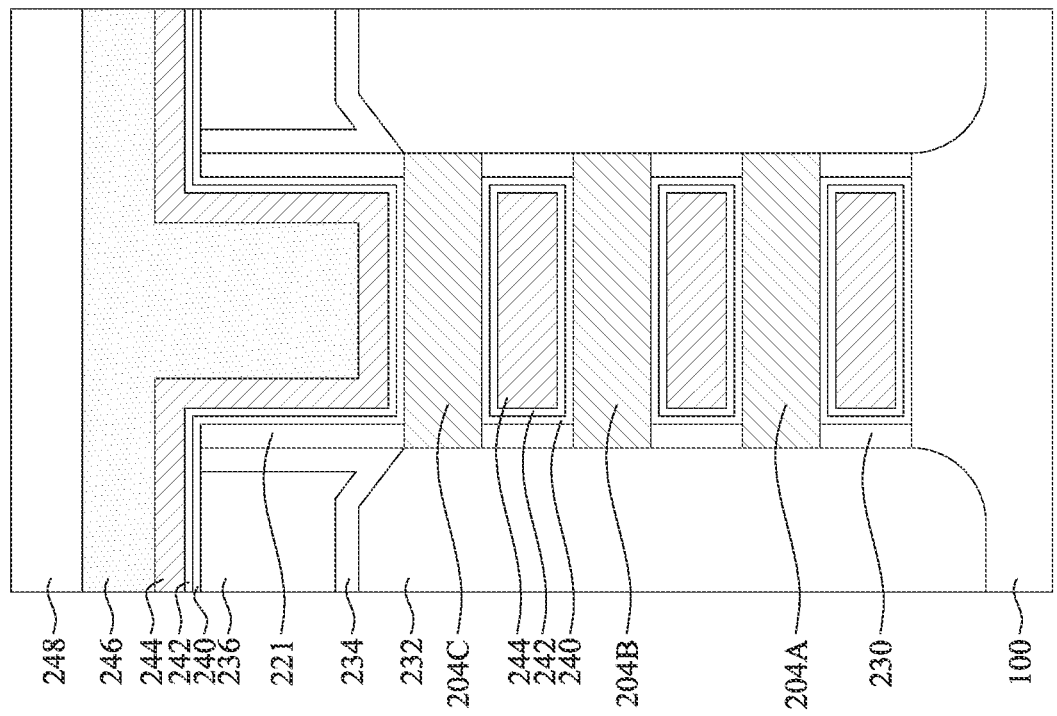
Fig. 21B

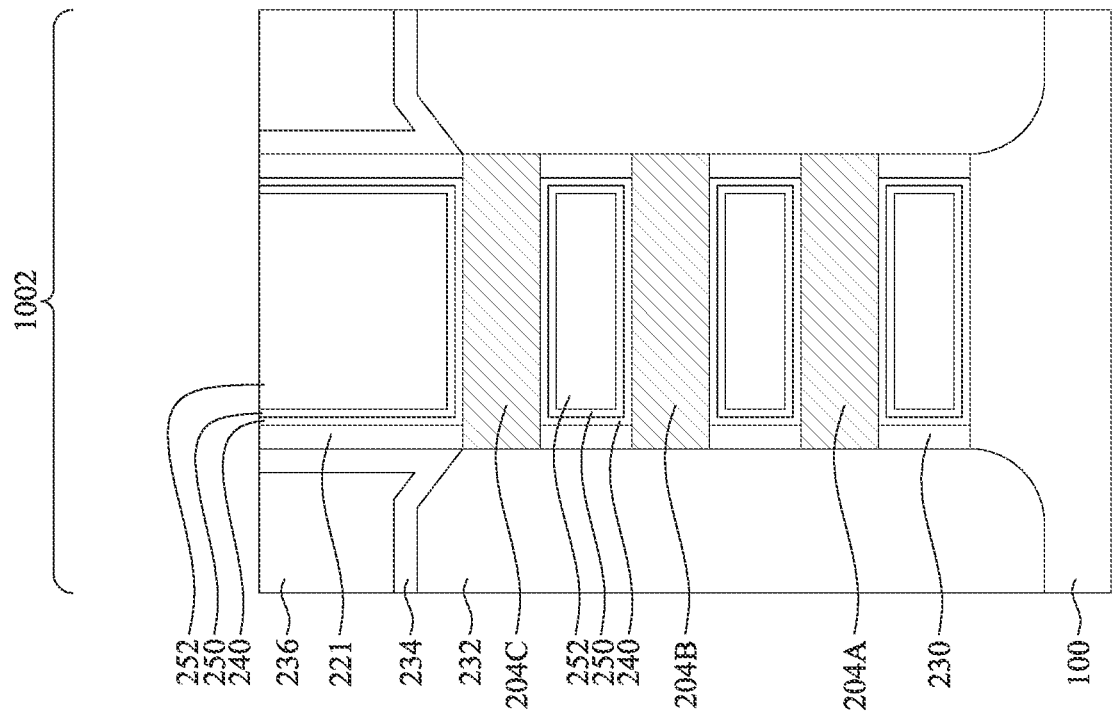
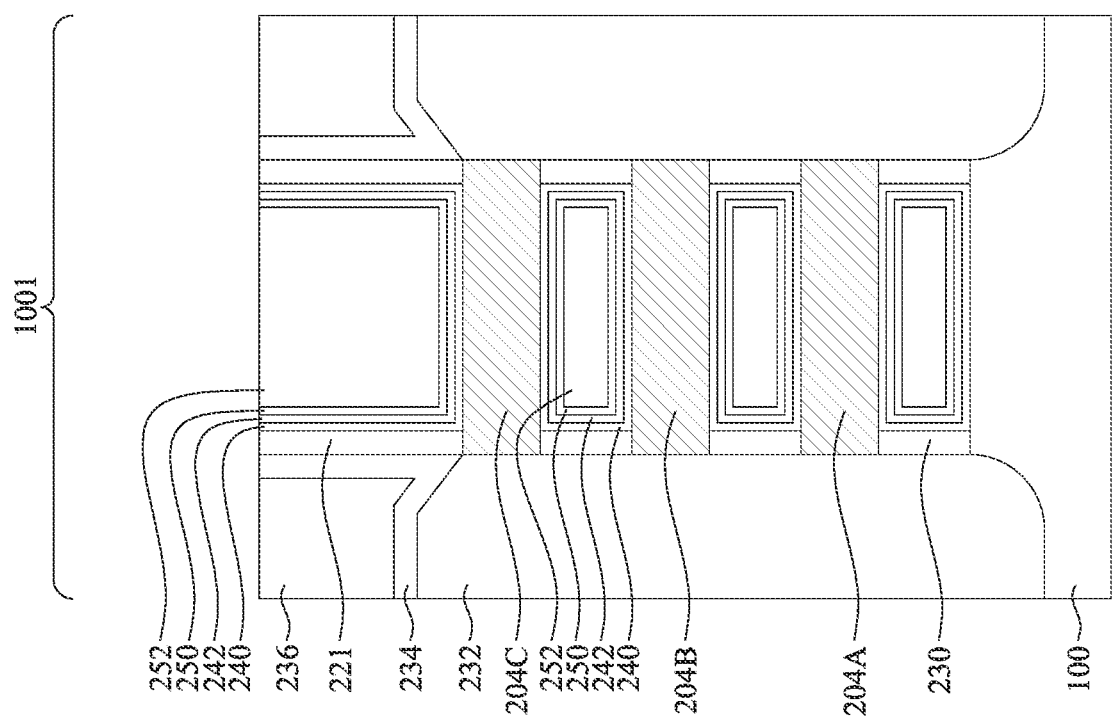
Fig. 24B

FORMATION OF TRANSISTOR GATES

PRIORITY CLAIM AND CROSS-REFERENCE

This application is a continuation of U.S. patent application Ser. No. 17/340,037, filed Jun. 6, 2021, which claims the benefit of U.S. Provisional Application No. 63/157,499, filed on Mar. 5, 2021, all of which are herein incorporated by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-5, 6A, 13A, 14A, 15A, 16A, 17A, 18A, 19A, 19C, 19E, 20A, 20C, 21A, 22A, 23A, and 24A are cross-sectional views at intermediate fabrication stages, illustrating reference cross-section A-A' illustrated in FIG. 1 that extends through a gate region along a longitudinal axis of the gate region.

FIGS. 6B, 7B, 8B, 9B, 10B, 11B, 11C, 12B, 12D, 13B, 14B, 15B, 16B, 17B, 18B, 19B, 19D, 20B, 20D, 21B, 22B, 23B, and 24B are cross-sectional views at intermediate fabrication stages, illustrating reference cross-section B-B' illustrated in FIG. 1 that extends through a fin along a longitudinal axis of the fin.

FIGS. 7A, 8A, 9A, 10A, 11A, 12A, 12C, and 13C are cross-sectional views at intermediate fabrication stages, illustrating reference cross-section C-C' illustrated in FIG. 1 that extends through source/drain regions along the longitudinal direction of the gate region.

DETAILED DESCRIPTION

Figure 1:
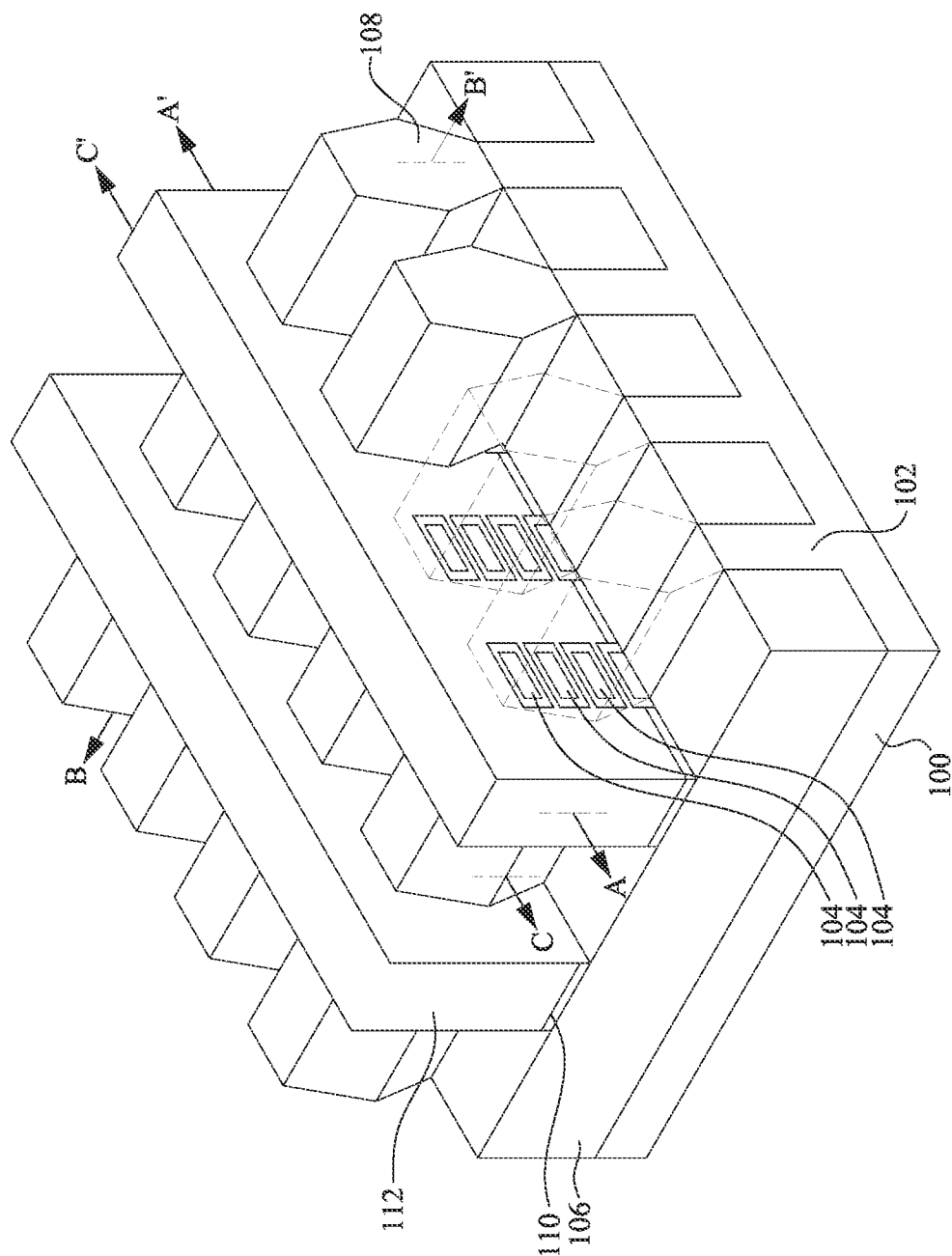
FIG. 1 illustrates an example of gate-all-around field-effect transistors (GAA-FETs) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit (IC) structures and methods of forming the same, and more particularly to fabricating gate-all-around (GAA) transistors having different high-k gate dielectric compositions. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In transistor gate stacks, the high-k gate dielectric compositions and/or thicknesses affect effective work functions of gate stacks and hence threshold voltages ($V_{TH}$) of transistors. Therefore, the GAA transistors having different threshold voltages can be achieved through the uses of different high-k gate dielectric compositions and/or thicknesses. For example, a gate stack of a high voltage (HV) device (e.g., input/output (I/O) device) may have more or fewer layers of high-k dielectric materials than a gate stack of a low voltage (LV) device (e.g., logic device), a gate stack of a p-type transistor may also have more or fewer layers of high-k dielectric materials than a gate stack of an n-type transistor. The gate stacks having different high-k dielectric compositions and/or thicknesses may be fabricated by using one or more photolithography and etching processes. For example, first and second high-k gate dielectric layers can be globally deposited over the first device region and the second device region, a hard mask layer is then deposited over the first and second high-k gate dielectric layers and patterned to expose the first device region or the second device region, followed by removing an exposed portion of the second high-k gate dielectric layer.

However, depositing the hard mask layer in spaces between neighboring nanosheets (interchangeably referred to as sheet-sheet spaces) may be accompanied by seam-holes, voids, or gaps in the hard mask layer in the sheet-sheet spaces. In a following photolithography process for patterning the hard mask layer, a bottom anti-reflective coating (BARC) may inadvertently flow into the seam-holes in hard mask layer, which in turn may leave BARC residues in the sheet-sheet spaces after the patterning the high-k gate dielectric layers, which in turn may impede following deposition of the gate metal materials in the sheet-sheet spaces.

Therefore, the present disclosure in various embodiments forms a hard mask layer by using an improved atomic layer deposition (ALD) process for seam-hole reduction. For example, the improved ALD process may reduce a number of seam-holes to an acceptable amount or to form a seam-free hard mask layer by controlling pulse time and/or purge time in the ALD process. A seam-free hard mask layer may aid in reducing the risk that the BARC flows in the sheet-sheet spaces. A hard mask layer having an acceptable amount of seam-holes may be advantageous for the hard mask removal process, because it takes less time to remove the hard mask layer by wet etching.

FIG. 1 illustrates an example of GAA-FETs (e.g., nanowire FETs, nanosheet FETs, or the like) in a three-dimensional view, in accordance with some embodiments. The GAA-FETs comprise nanostructures 104 (e.g., nanosheets, nanowires, nanorings, nanoslabs, or other structures having nano-scale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106.

Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectric layers 110 and the gate electrodes 112.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 108 of a GAA-FET. Cross-section B-B' is perpendicular to cross-section A-A' and is parallel to a longitudinal axis of a fin 102 of the GAA-FET and in a direction of, for example, a current flow between the epitaxial source/drain regions 108 of the GAA-FET. Cross-section C-C' is parallel to cross-section A-A' and extends through epitaxial source/drain regions of the GAA-FETs. Subsequent figures refer to these reference cross-sections for clarity.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 2 through 24B are cross-sectional views of intermediate stages in the manufacturing of GAA-FETs, in accordance with some embodiments. FIGS. 2 through 5, 6A, 13A, 14A, 15A, 16A, 17A, 18A, 19A, 19C, 19E, 20A, 20C, 21A, 22A, 23A, and 24A illustrate reference cross-section A-A' illustrated in FIG. 1 that extends through a gate region along a longitudinal axis of the gate region. FIGS. 6B, 7B, 8B, 9B, 10B, 11B, 11C, 12B, 12D, 13B, 14B, 15B, 16B, 17B, 18B, 19B, 19D, 20B, 20D, 21B, 22B, 23B, and 24B illustrate reference cross-section B-B' illustrated in FIG. 1 that extends through a fin along a longitudinal axis of the fin. FIGS. 7A, 8A, 9A, 10A, 11A, 12A, 12C, and 13C illustrate reference cross-section C-C' illustrated in FIG. 1 that extends through source/drain regions along the longitudinal direction of the gate region.

Figure 2:
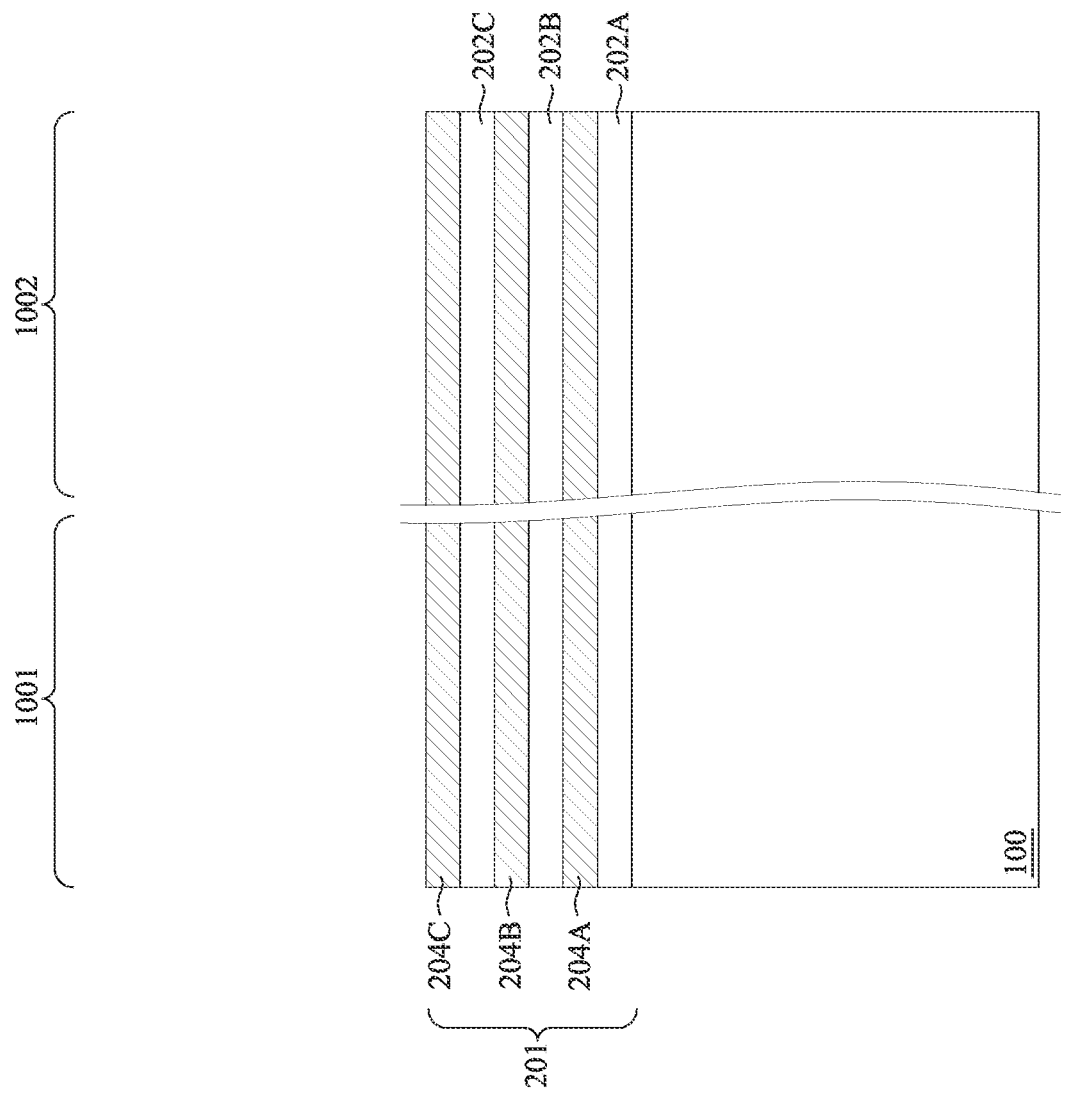

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has a first device region 1001 and a second device region 1002. The first device region 1001 is a region in which first transistors will reside, and the second device region 1002 is a region in which second transistors will reside. In some embodiments, the first transistors are different from the second transistors at least in threshold voltage. For example, first transistors in the first device region 1001 may be HV devices (e.g., I/O devices), and second transistors in the second device region 1002 may be LV devices (e.g., logic devices). In some other embodiments, the first transistors are different from the second transistors at least in conductivity type. For example, first device region 1001 can be for forming n-type devices, such as NMOS transistors, e.g., n-type GAA-FETs, and the second device region 1002 can be for forming p-type devices, such as PMOS transistors, e.g., p-type GAA-FETs.

The first device region 1001 may be separated from the second device region 1002, and any number of device features (e.g., other active devices, doped regions, isolation structures, etc.) may be disposed between the first device region 1001 and the second device region 1002. Although one first device region 1001 and one second device region 1002 are illustrated, any number of first device regions 1001 and second device regions 1002 may be provided.

Further in FIG. 2, a multi-layer stack 201 is formed over the substrate 100. The multi-layer stack 201 includes alternating layers of first semiconductor layers 202A-C (collectively referred to as first semiconductor layers 202) and second semiconductor layers 204A-C (collectively referred to as second semiconductor layers 204). For purposes of illustration and as discussed in greater detail below, the first semiconductor layers 202 will be removed and the second semiconductor layers 204 will be patterned to form channel regions of GAA-FETs.

The multi-layer stack 201 is illustrated as including three layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of GAA-FETs.

Figure 3:
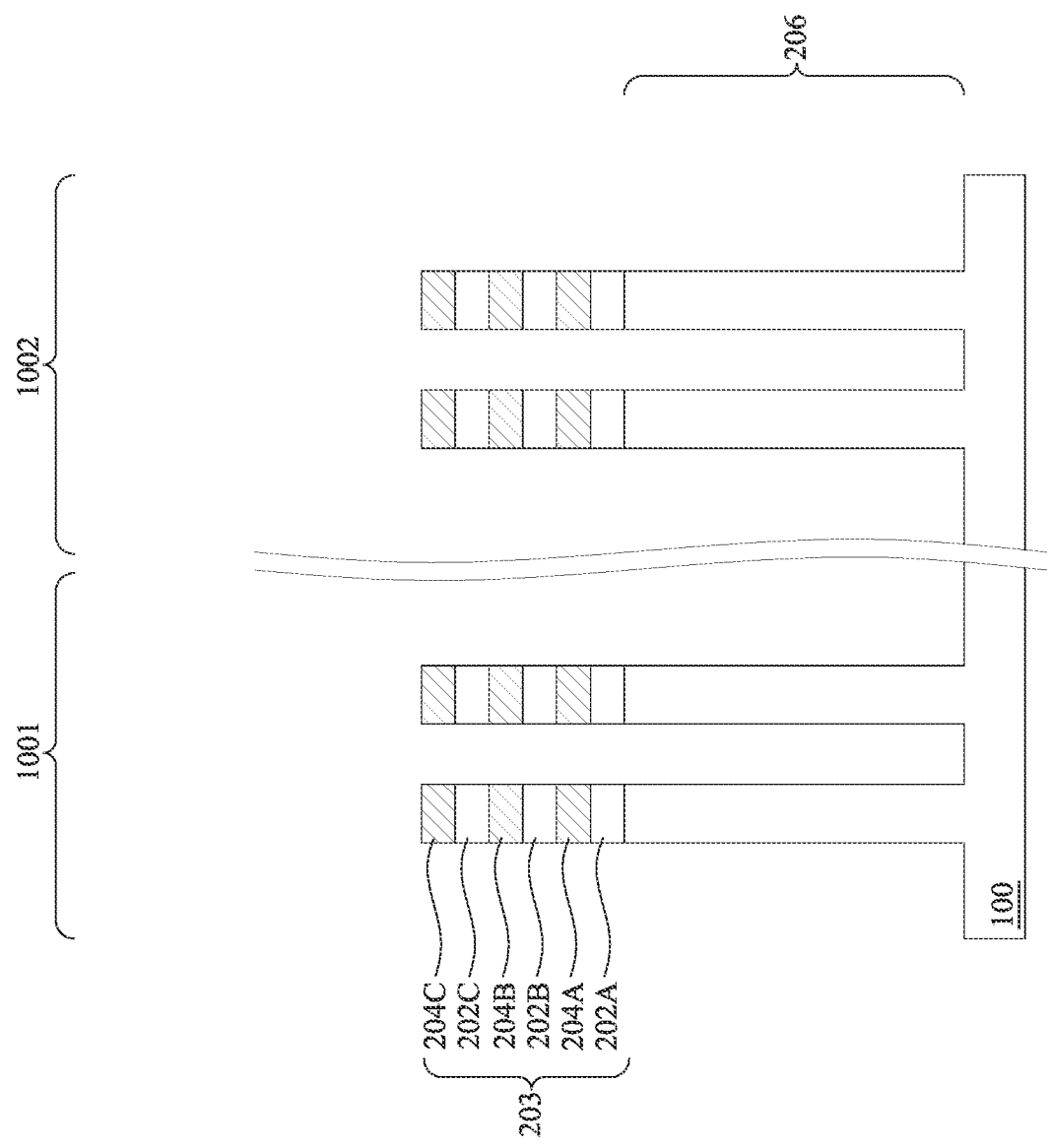

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches in the multi-layer stack 201 and the substrate 100. Each fin structure 206 and overlying nanostructures 203 can be collectively referred to as a fin extending from the substrate 100. The etching may be any acceptable etch process, such as a reactive ion etch (RIE), neutral beam etch (NBE), the like, or a combination thereof. The etching may be anisotropic. Forming the nanostructures 203 by etching the multi-layer stack 201 may further define first nanostructures 202A-C (collectively referred to as the first nanostructures 202) from the first semiconductor layers 202 and define second nanostructures 204A-C (collectively referred to as the second nanostructures 204) from the second semiconductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206.

FIG. 3 illustrates the fin structures 206 in the first device region 1001 and the second device region 1002 as having substantially equal widths for illustrative purposes. In some embodiments, widths of the fin structures 206 in the first device region 1001 may be greater or thinner than the fin structures 206 in the second device region 1002. Further, while each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostructures 203 continuously increases in a direction towards the substrate 100. In such embodiments, each of the nanostructures 203 may have a different width and be trapezoidal in shape.

Figure 4:
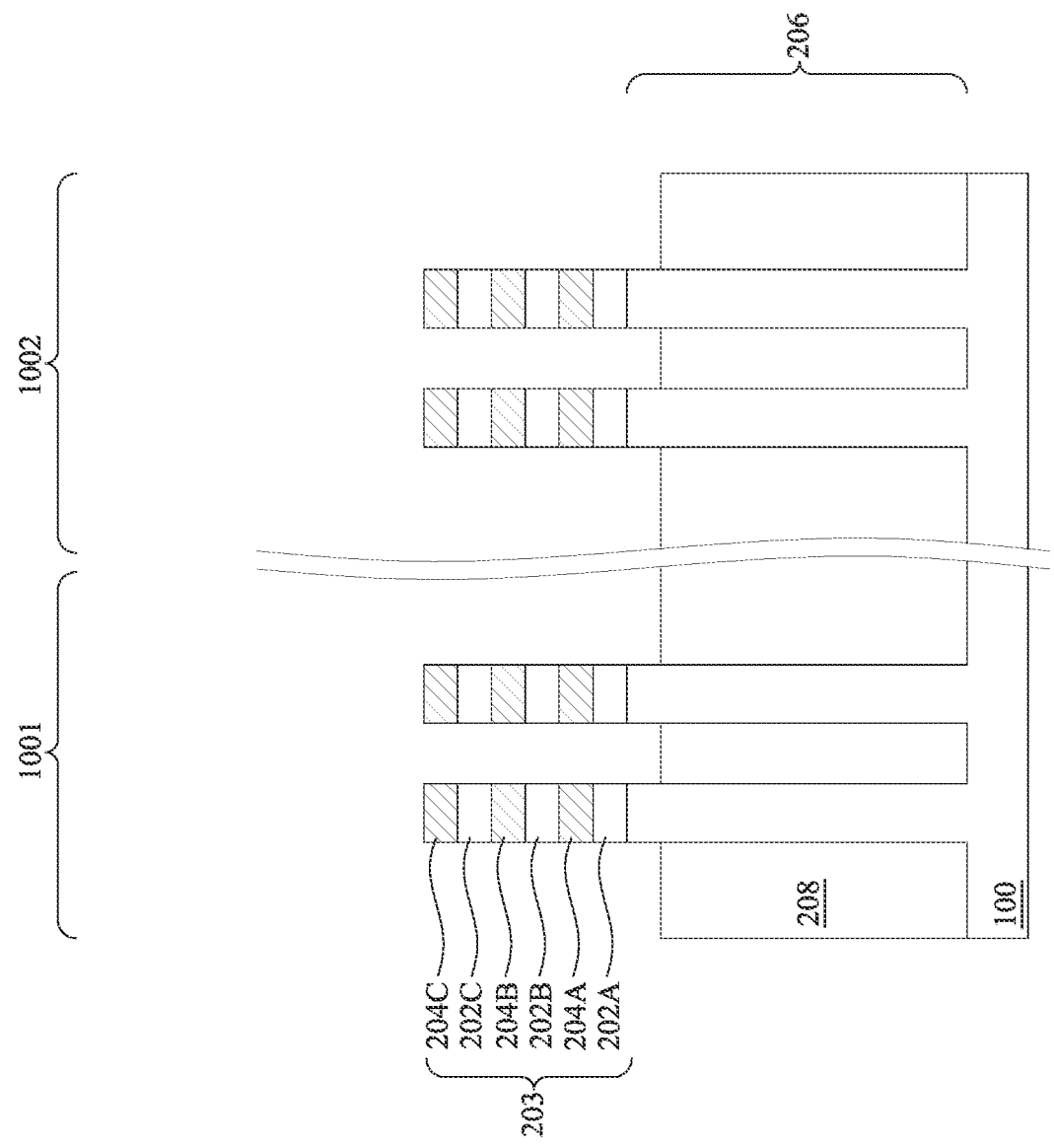

In FIG. 4, shallow trench isolation (STI) regions 208 are formed adjacent the fin structures 206. The STI regions 208 may be formed by depositing an insulation material over the substrate 100, the fin structures 206, and nanostructures 203, and between adjacent fin structures 206. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 203. Although the insulation material is illustrated as a single layer, some embodiments may utilize multiple layers. For example, in some embodiments a liner (not separately illustrated) may first be formed along a surface of the substrate 100, the fin structures 206, and the nanostructures 203. Thereafter, a fill material, such as those discussed above may be formed over the liner.

A removal process is then applied to the insulation material to remove excess insulation material over the nanostructures 203. In some embodiments, a planarization process such as a chemical mechanical polish (CMP), an etch-back process, combinations thereof, or the like may be utilized. The planarization process exposes the nanostructures 203 such that top surfaces of the nanostructures 203 and the insulation material are level after the planarization process is complete.

The insulation material is then recessed to form the STI regions 208. The insulation material is recessed such that upper portions of fin structures 206 in the first and second device regions 1001 and protrude from between neighboring STI regions 208. Further, the top surfaces of the STI regions 208 may have a flat surface as illustrated, a convex surface, a concave surface (such as dishing), or a combination thereof. The top surfaces of the STI regions 208 may be formed flat, convex, and/or concave by an appropriate etch. The STI regions 208 may be recessed using an acceptable etching process, such as one that is selective to the material of the insulation material (e.g., etches the material of the insulation material at a faster rate than the material of the fin structures 206 and the nanostructures 203). For example, an oxide removal using, for example, dilute hydrofluoric (dHF) acid may be used.

The process described above with respect to FIGS. 2 through 4 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting nano structures 202) and the second semiconductor layers (and resulting nanostructures 204) are illustrated and discussed herein as comprising the same materials in the second device region 1002 and the first device region 1001 for illustrative purposes only. As such, in some embodiments one or both of the first semiconductor layers and the second semiconductor layers may be different materials or formed in a different order in the first and second device regions 1001 and 1002.

Further in FIG. 4, appropriate wells (not separately illustrated) may be formed in the fin structures 206, the nanostructures 203, and/or the STI regions 208. In some embodiments with different well types in different device regions 1001 and 1002, different implant steps for the first device region 1001 and the second device region 1002 may be achieved using a photoresist or other masks (not separately illustrated). For example, a photoresist may be formed over the fin structures 206 and the STI regions 208 in the first device region 1001 and the second device region 1002. The photoresist is patterned to expose the second device region 1002. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the second device region 1002, and the photoresist may act as a mask to substantially prevent the first impurities from being implanted into the first device region 1001. After the implant, the photoresist is removed, such as by an acceptable ashing process.

Following or prior to the implanting of the second device region 1002, a photoresist or other masks (not separately illustrated) is formed over the fin structures 206, the nanostructures 203, and the STI regions 208 in the first device region 1001 and the second device region 1002. The photoresist is then patterned to expose the first device region 1001. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the first device region 1001, and the photoresist may act as a mask to substantially prevent p-type impurities from being implanted into the second device region 1002. After the implant, the photoresist may be removed, such as by an acceptable ashing process.

After one or more well implants of the first device region 1001 and the second device region 1002, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
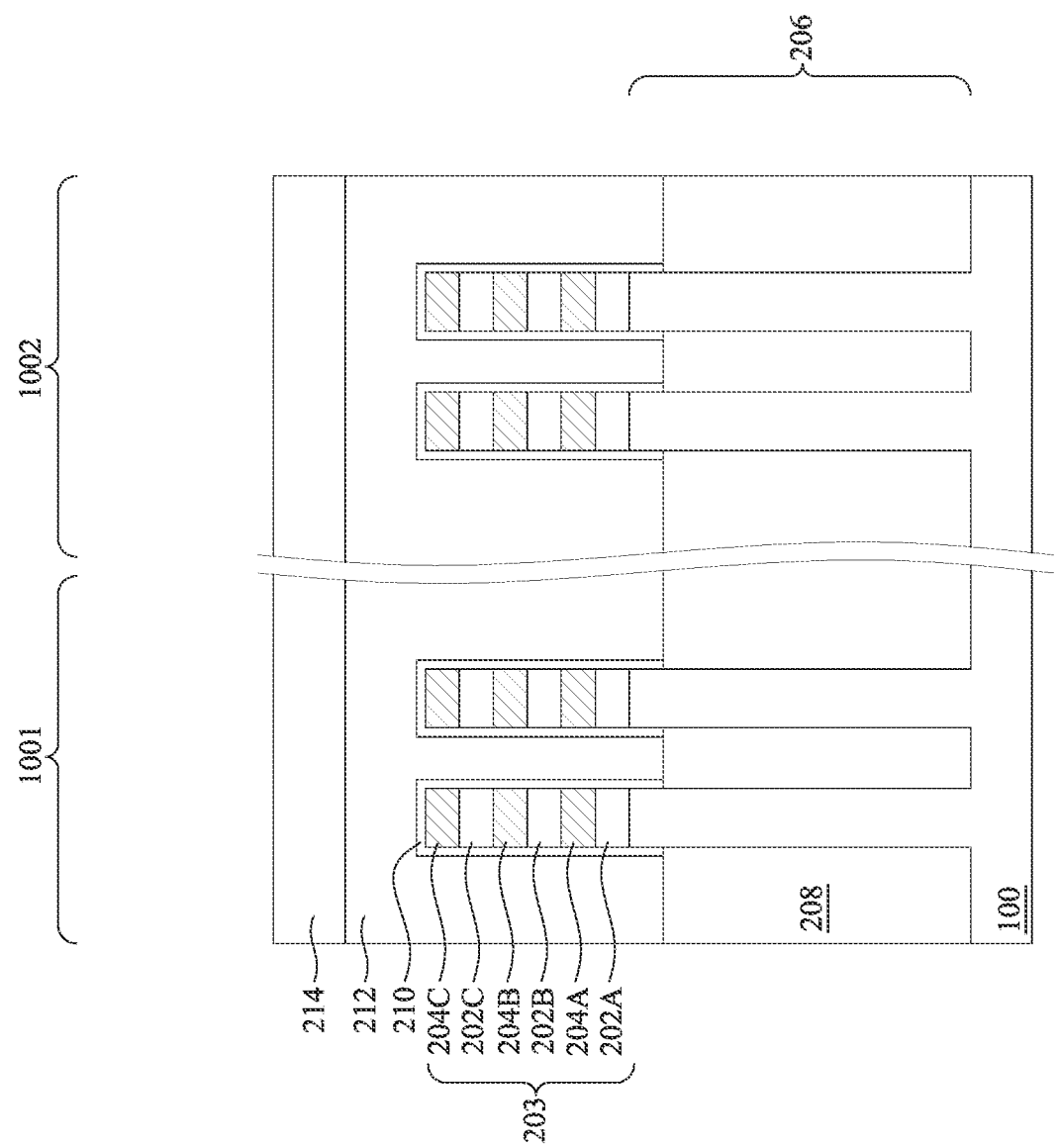

In FIG. 5, a dummy dielectric layer 210 is formed on the fin structures 206 and/or the nanostructures 203. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 212 may be deposited by physical vapor deposition (PVD), CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. In this example, a single dummy gate layer 212 and a single mask layer 214 are formed across the first device region 1001 and the second device region 1002. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 208, such that the dummy dielectric layer 210 extends between the dummy gate layer 212 and the STI regions 208.

Figure 6A:
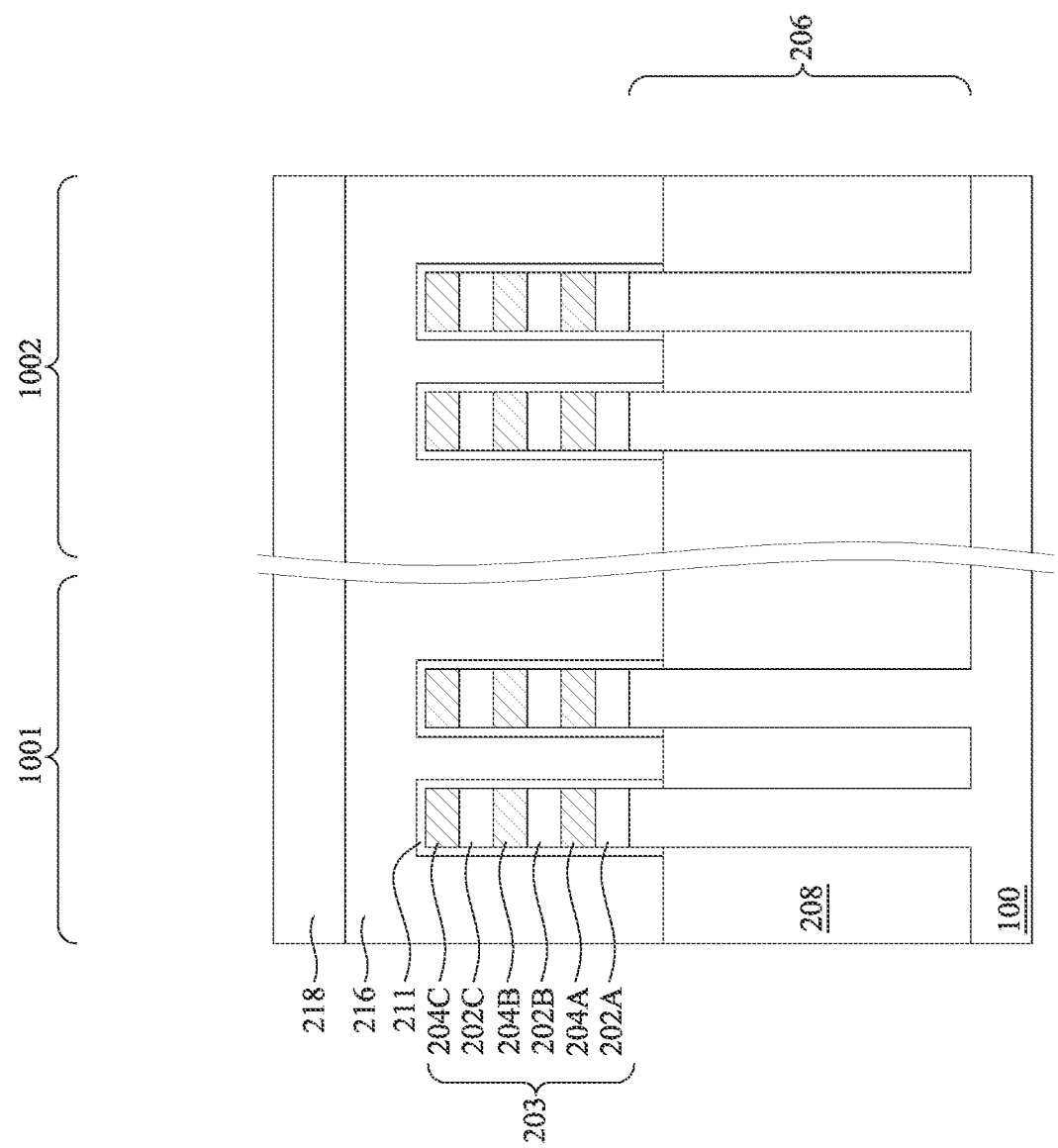
Figure 6B:
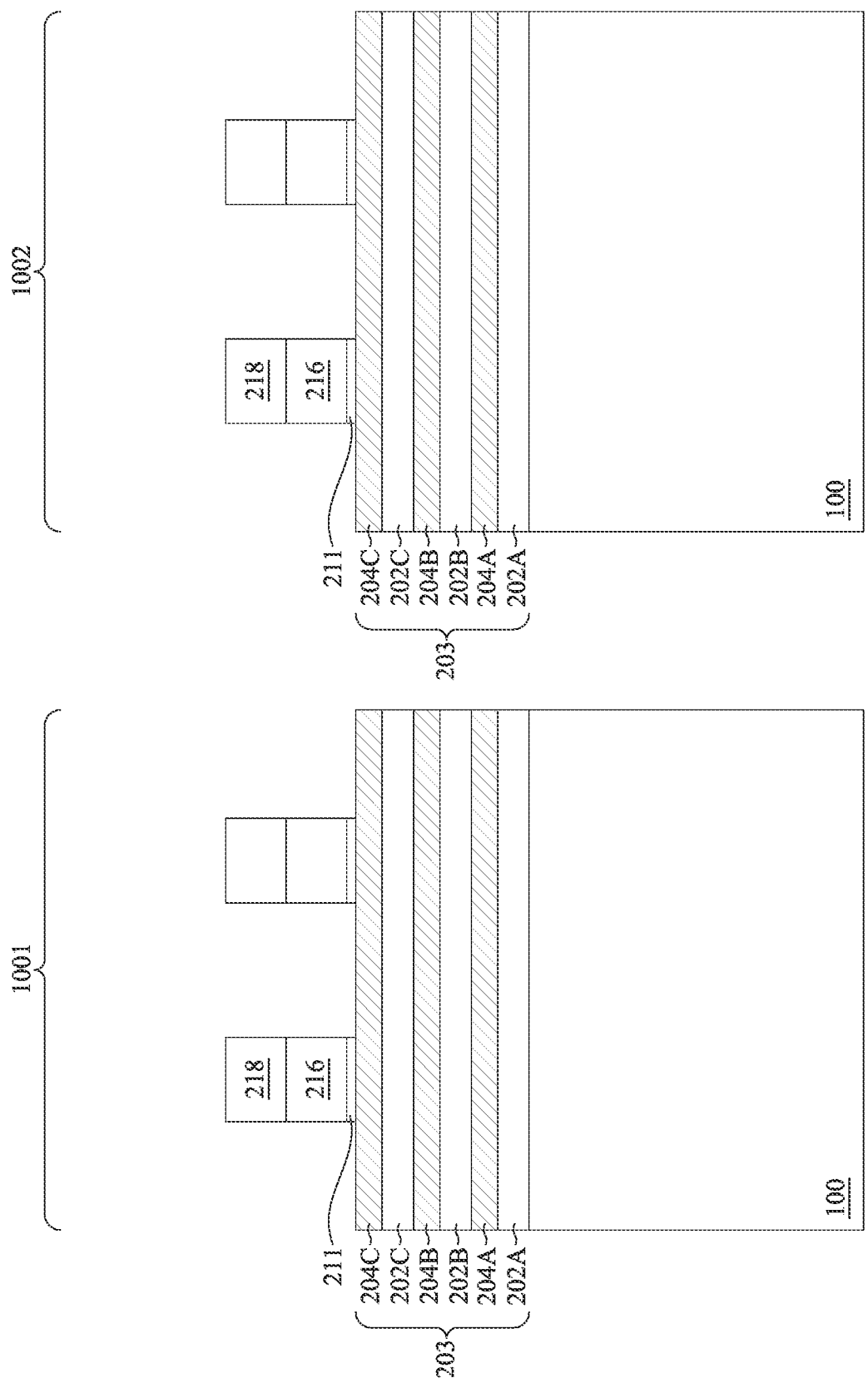

FIGS. 6A through 24B illustrate various following steps in the manufacturing of embodiment devices. FIGS. 6A, 7A, 8A, 9A, 10A, 11A, 12A, 12C, 13A, 13C, 14A, and 15A illustrate features in either the first device regions 1001 or the second device regions 1002. In FIGS. 6A and 6B, the mask layer 214 (see FIG. 5) may be patterned using acceptable photolithography and etching techniques to form masks 218. The pattern of the masks 218 then may be transferred to the dummy gate layer 212 and to the dummy dielectric layer 210 to form dummy gates 216 and dummy gate dielectrics 211, respectively. The dummy gates 216 cover respective channel regions of the fin structures 206. The pattern of the masks 218 may be used to physically separate each of the dummy gates 216 from adjacent dummy gates 216. The dummy gates 216 may also have a lengthwise direction substantially perpendicular to the lengthwise direction of respective fin structures 206.

Figure 7B:
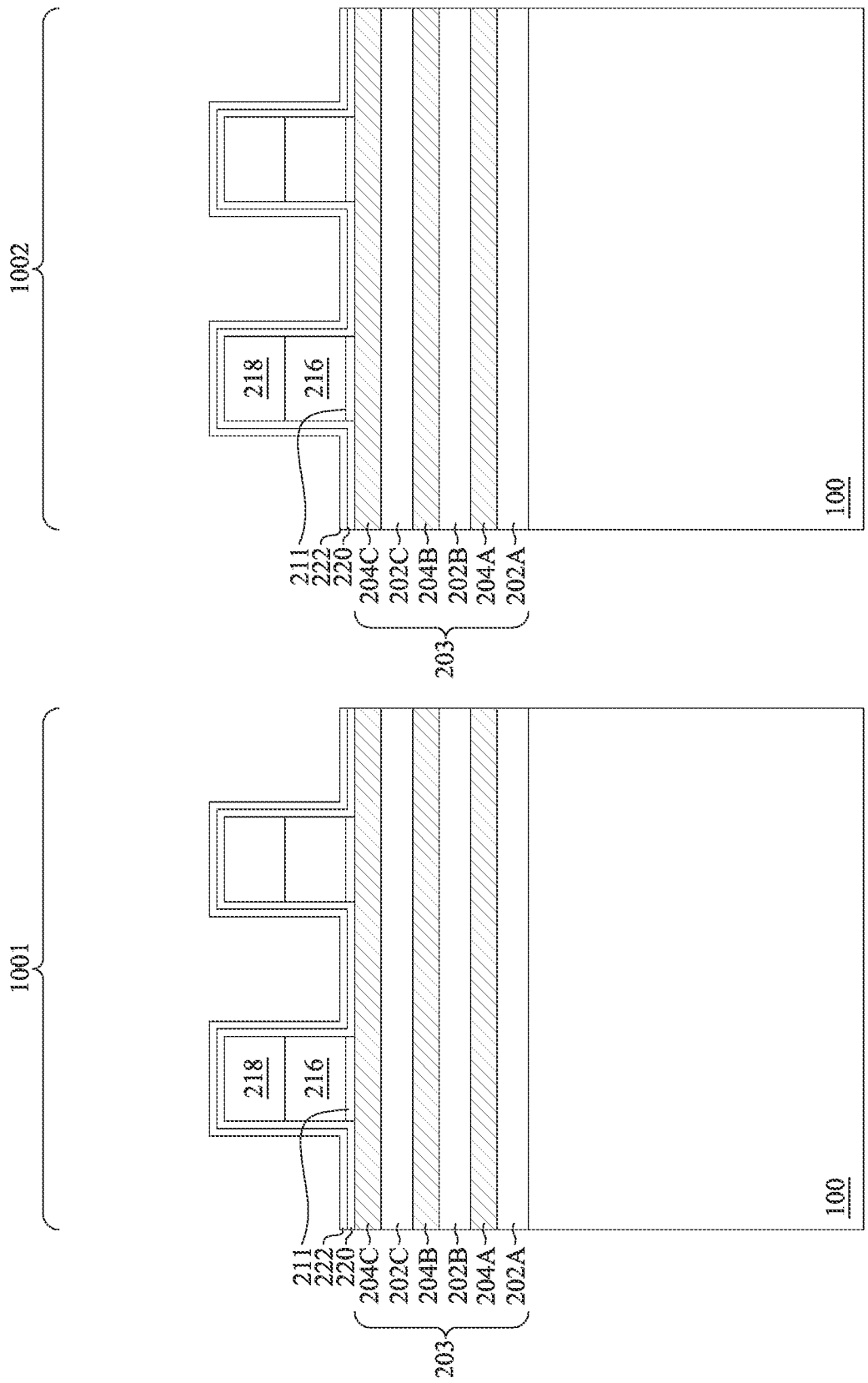

In FIGS. 7A and 7B, a first spacer layer 220 and a second spacer layer 222 are formed over the structures illustrated in FIGS. 6A and 6B, respectively. The first spacer layer 220 and the second spacer layer 222 will be subsequently patterned to act as spacers for forming self-aligned source/drain regions. In FIGS. 7A and 7B, the first spacer layer 220 is formed on top surfaces of the STI regions 208; top surfaces and sidewalls of the fin structures 206, the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 8B:
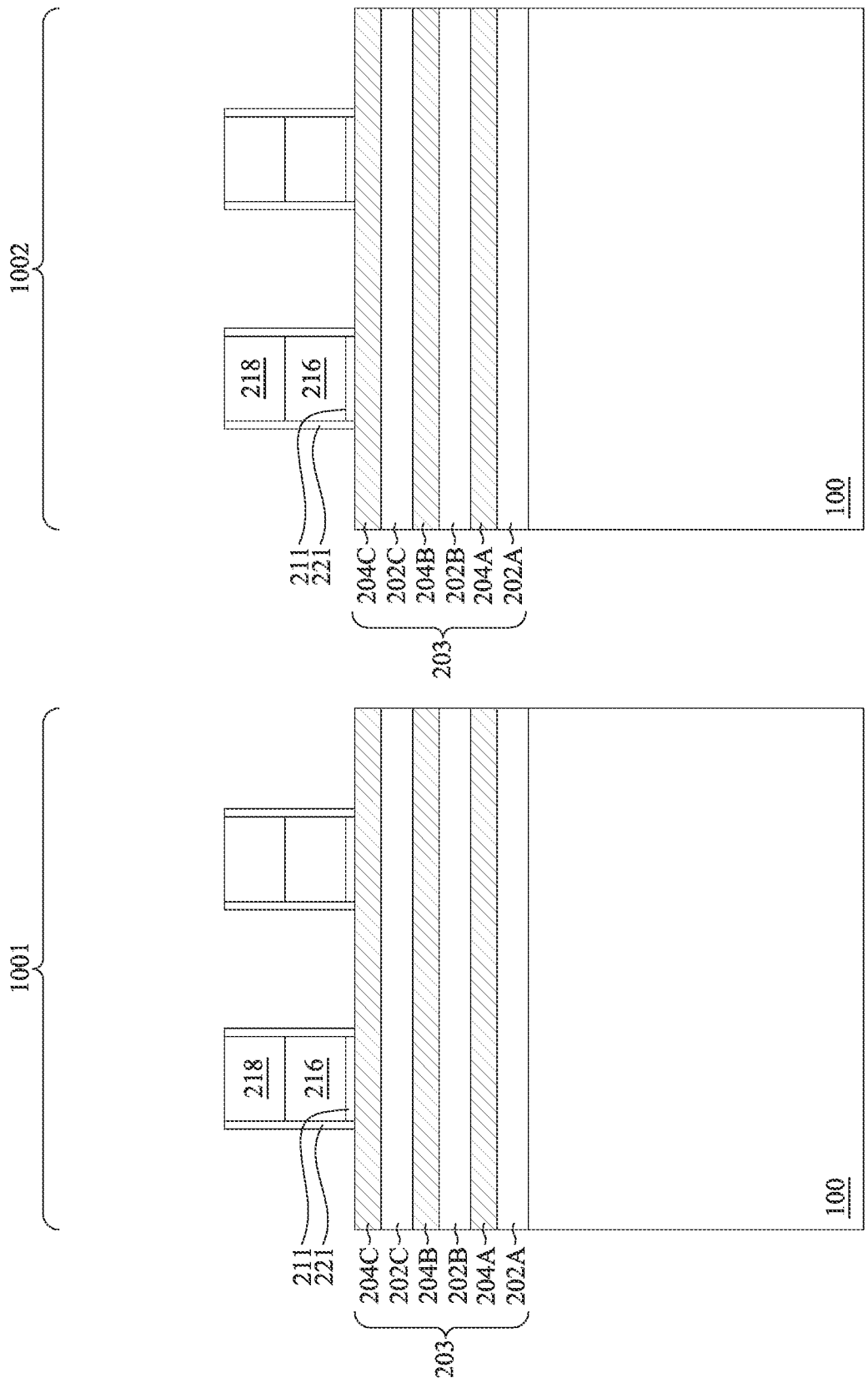

In FIGS. 8A and 8B, the first spacer layer 220 and the second spacer layer 222 are etched to form first spacers 221 and second spacers 223. As will be discussed in greater detail below, the first spacers 221 and the second spacers 223 act to self-align subsequently formed source and drain regions, as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 8A. Thereafter, the second spacers 223 acts as a mask while etching exposed portions of the first spacer layer 220, thereby forming first spacers 221 as illustrated in FIG. 8A.

As illustrated in FIG. 8A, the first spacers 221 and the second spacers 223 are disposed on sidewalls of the fin structures 206 and/or nanostructures 203. In some embodiments, the spacers 221 and 223 only partially remain on sidewalls of the fin structures 206. In some embodiments, no spacer remains on sidewalls of the fin structures 206. As illustrated in FIG. 8B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy dielectric layers 211. In other embodiments, a portion of the second spacer layer 222 may remain over the first spacer layer 220 adjacent the masks 218, the dummy gates 216, and the dummy gate dielectrics 211.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like. Furthermore, devices in first device region 1001 and devices in the second device region 1002 may be formed using different structures and steps.

Figure 9B:
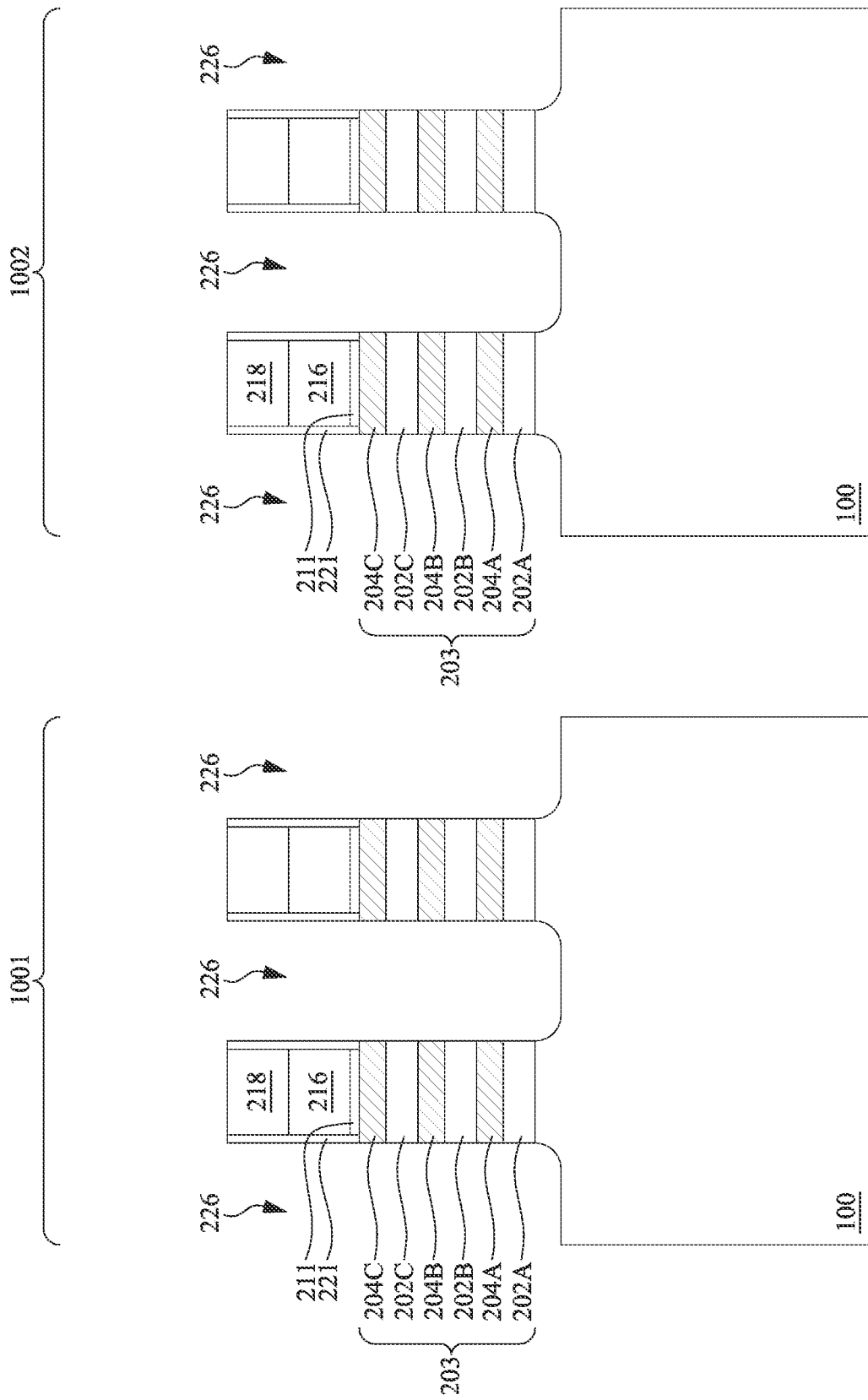

In FIGS. 9A and 9B, source/drain recesses 226 are formed in the fin structures 206, the nanostructures 203, and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in FIG. 9A, bottom surfaces of the source/drain recesses 226 may be level with top surfaces of the STI regions 208, as an example. In some other embodiments, the fin structures 206 may be etched such that bottom surfaces of the source/drain recesses 226 are disposed below the top surfaces of the STI regions 208, or above the top surfaces of the STI regions 208. The source/drain recesses 226 may be formed by etching the fin structures 206, the nanostructures 203, and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 10A:
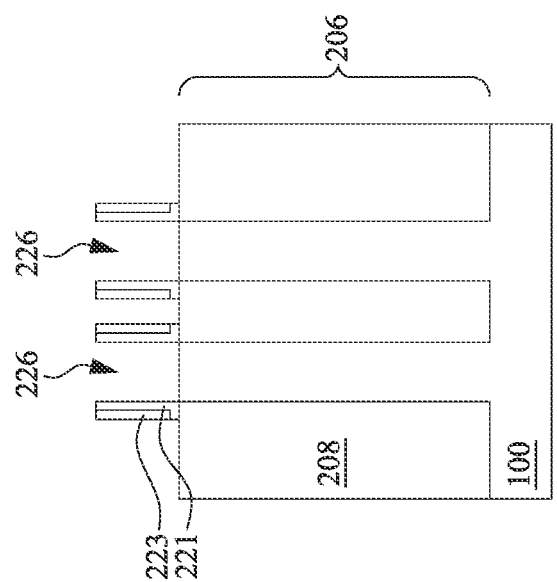
Figure 10B:
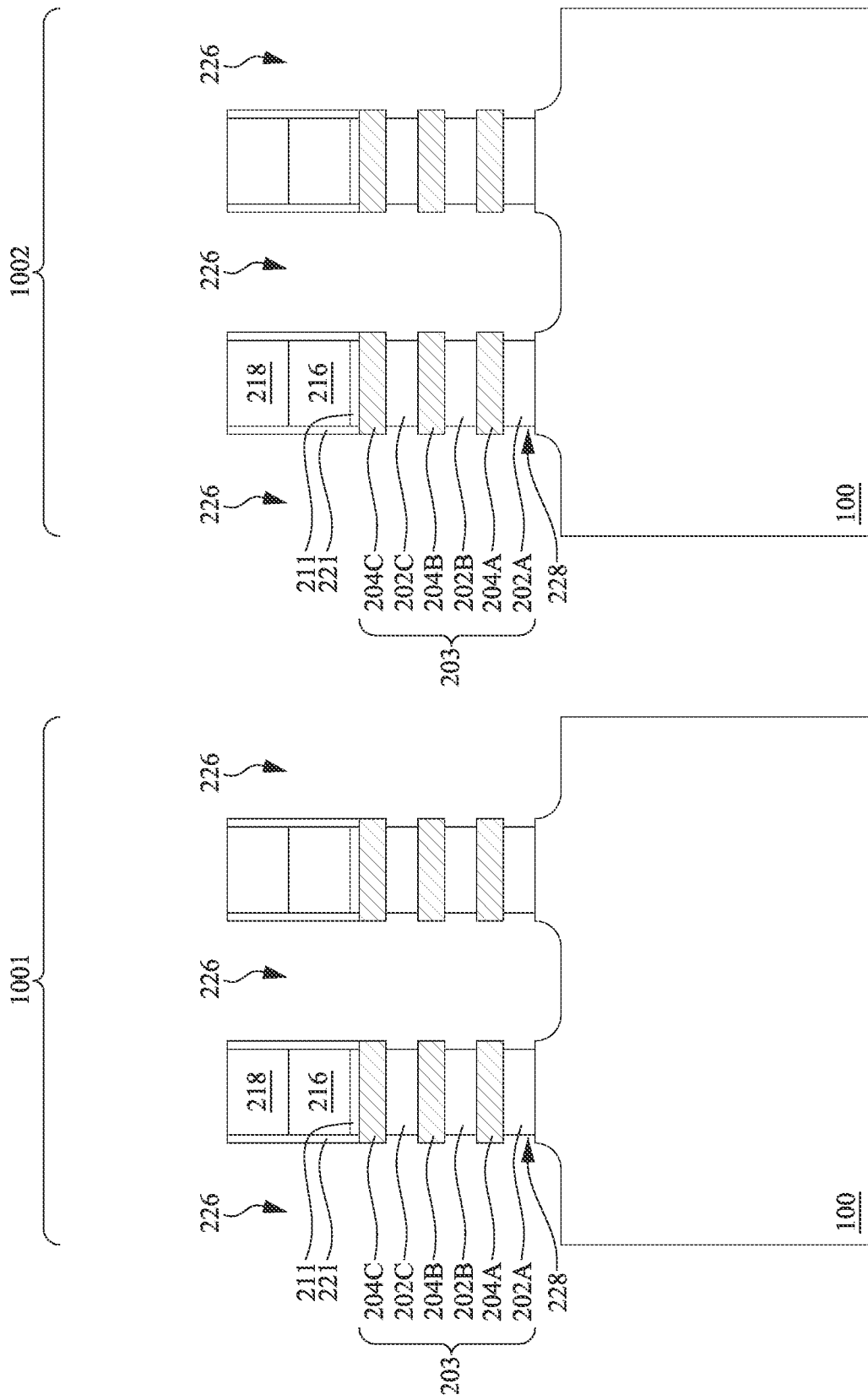

In FIGS. 10A and 10B, portions of sidewalls of the layers of the multi-layer stack 201 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in recesses 228 are illustrated as being straight in FIG. 10B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide (NH$_4$OH), or the like may be used to etch sidewalls of the first nanostructures 202.

Figure 11B:
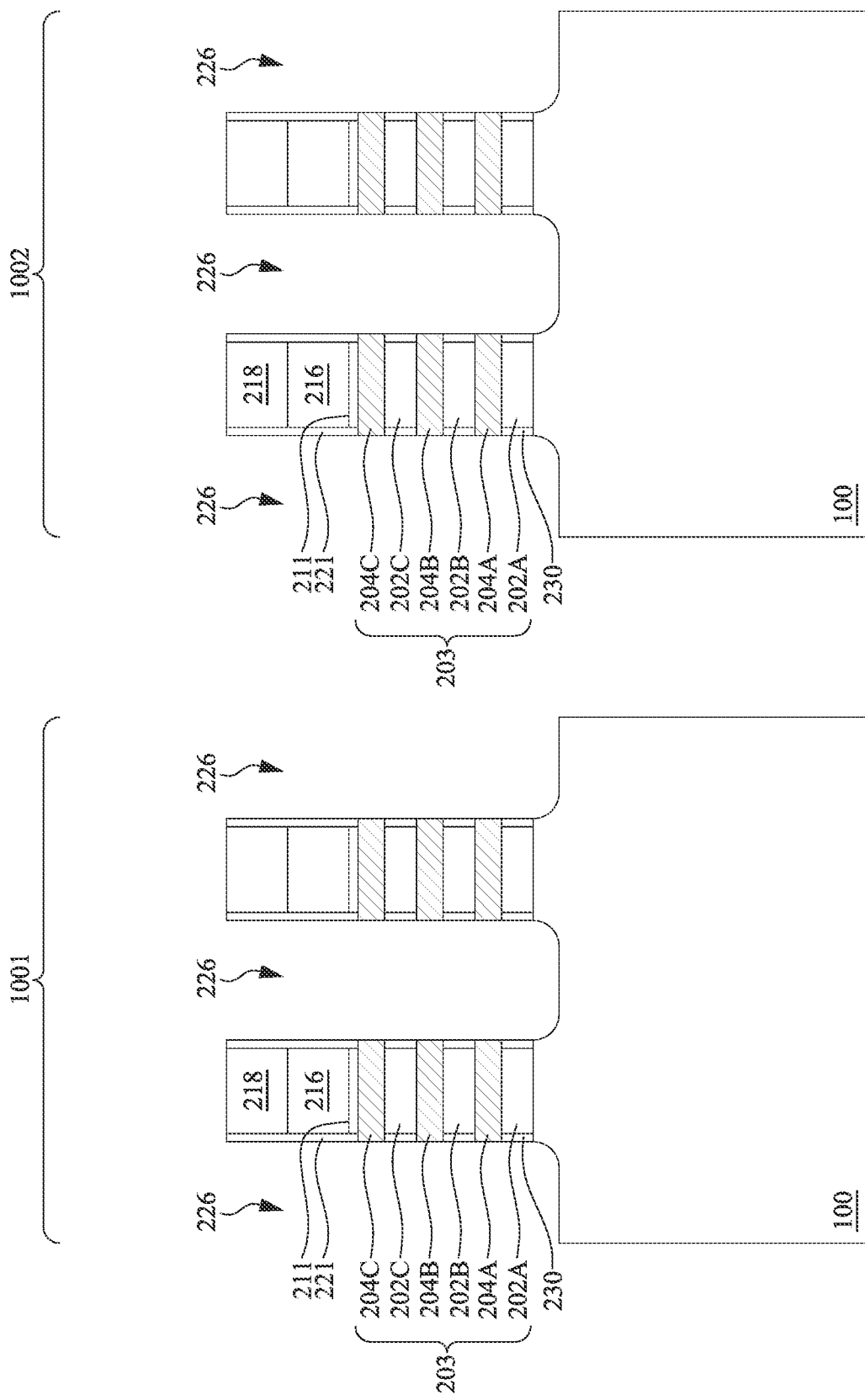
Figure 11C:
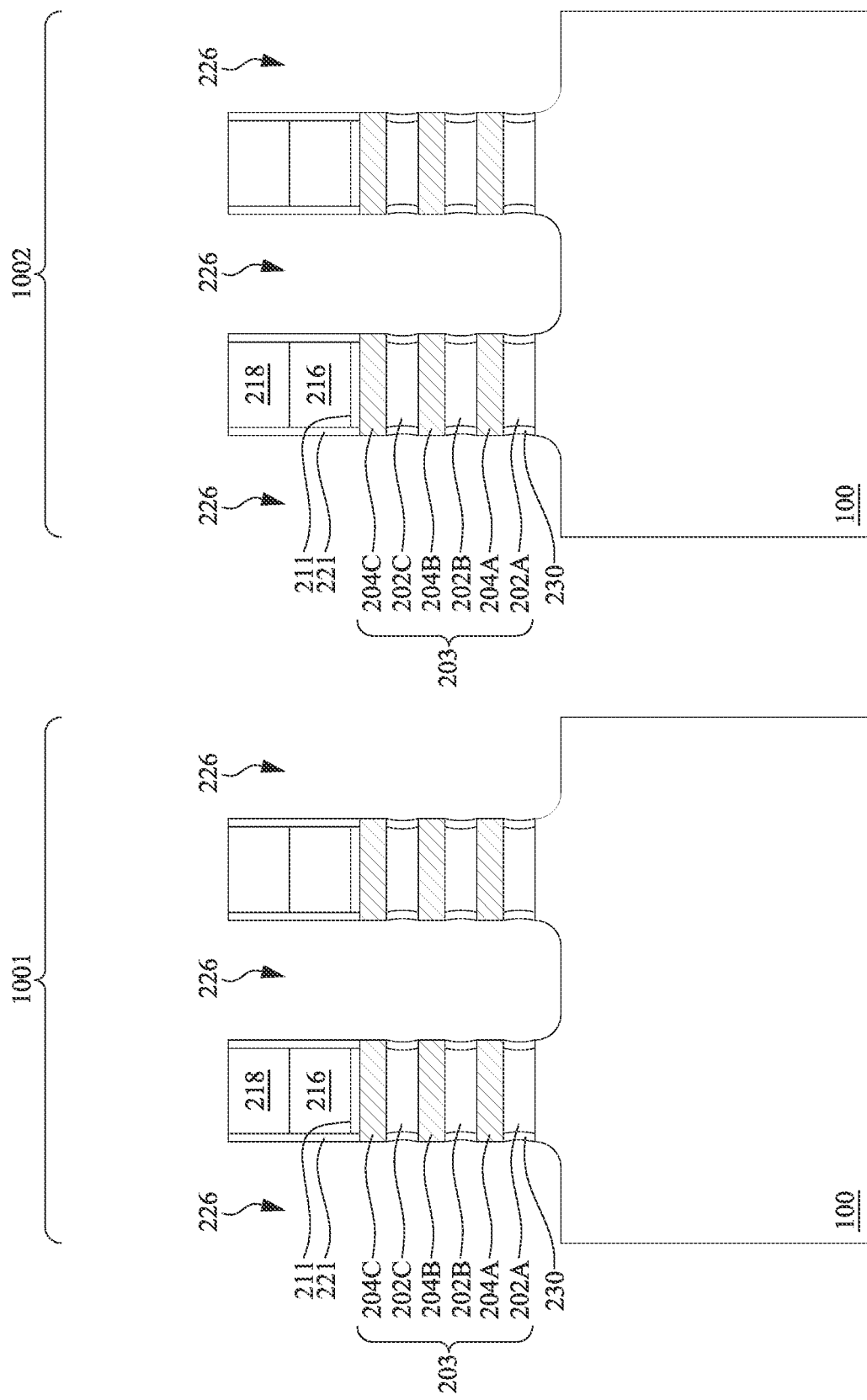

In FIGS. 11A-11C, inner spacers 230 are formed in the sidewall recess 228. The inner spacers 230 may be formed by depositing an inner spacer layer (not separately illustrated) over the structures illustrated in FIGS. 10A and 10B. The inner spacers 230 act as isolation features between subsequently formed source/drain regions and gate structure. As will be discussed in greater detail below, source/drain regions will be formed in the recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 11B, the outer sidewalls of the inner spacers 230 may be concave or convex. As an example, FIG. 11C illustrates an embodiment in which sidewalls of the first nanostructures 202 are concave, outer sidewalls of the inner spacers 230 are concave, and the inner spacers are recessed from sidewalls of the second nanostructures 204. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 12A-12D) by subsequent etching processes, such as etching processes used to form gate structures.

Figure 12B:
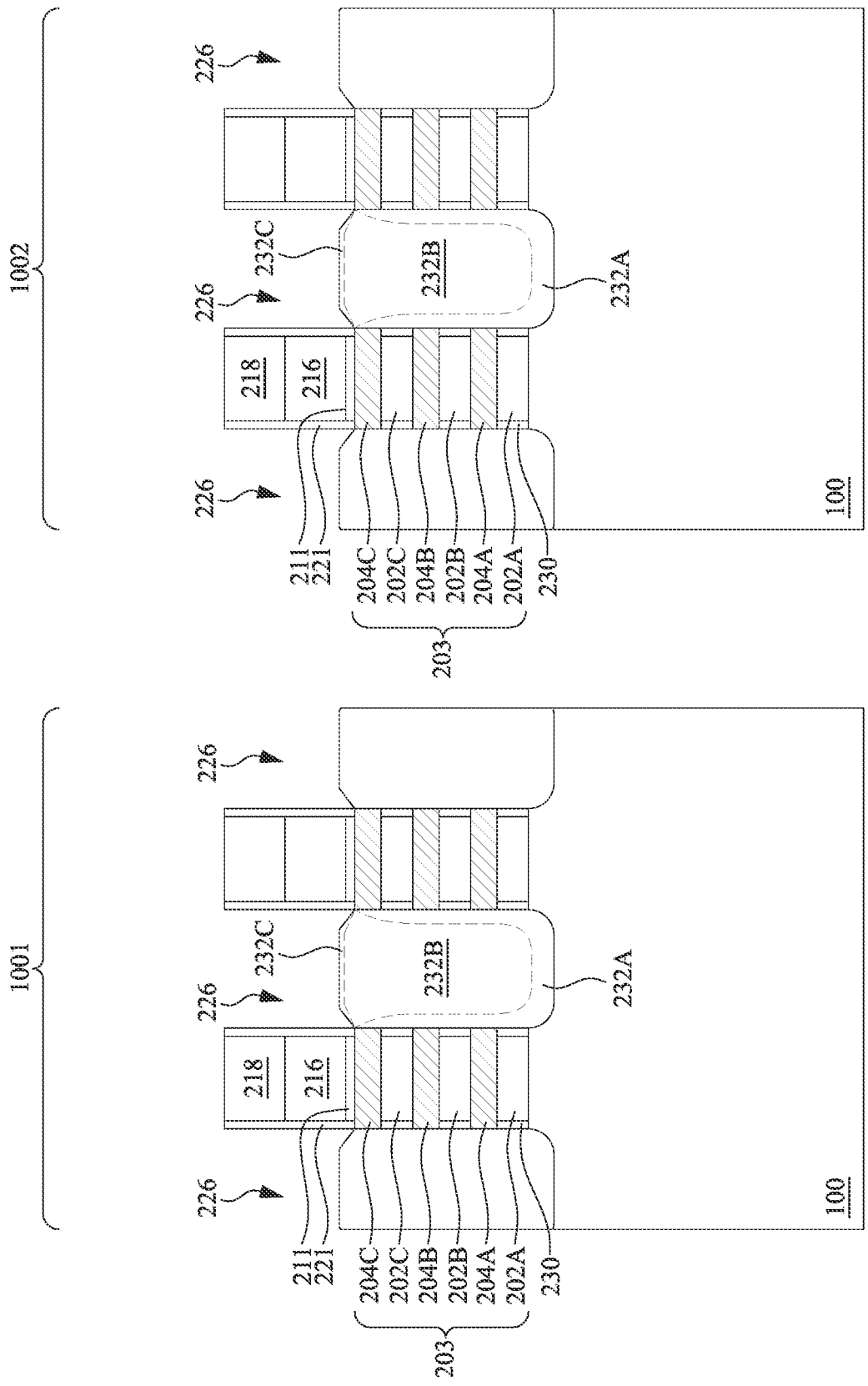

In FIGS. 12A-12D, epitaxial source/drain regions 232 are formed in the source/drain recesses 226. In some embodiments, the source/drain regions 232 may exert stress on the second nanostructures 204, thereby improving device performance. As illustrated in FIG. 12B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gates 216 and the inner spacers 230 are used to separate the epitaxial source/drain regions 232 from the first nanostructures 202 by an appropriate lateral distance so that the epitaxial source/drain regions 232 do not short out with subsequently formed gates of the resulting GAA-FETs.

In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets.

The epitaxial source/drain regions 232 may be implanted with dopants to form source/drain regions, followed by an anneal. The source/drain regions may have an impurity concentration of between about $1 \times 10^{17}$ atoms/cm$^3$ and about $1 \times 10^{22}$ atoms/cm$^3$. The n-type and/or p-type impurities for source/drain regions may be any of the impurities previously discussed. In some embodiments, the epitaxial source/drain regions 232 may be in situ doped during growth.

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 12A. In some other embodiments, adjacent epitaxial source/drain regions 232 remain separated after the epitaxy process is completed as illustrated by FIG. 12C. In the embodiments illustrated in FIGS. 12A and 12C, the first spacers 221 may be formed to a top surface of the STI regions 208 thereby blocking the lateral epitaxial growth. In some other embodiments, the first spacers 221 may cover portions of the sidewalls of the nanostructures 203 further blocking the epitaxial growth. In some other embodiments, the spacer etch used to form the first spacers 221 may be adjusted to remove the spacer material to allow the epitaxially grown region to extend to the surface of the STI region 208.

The epitaxial source/drain regions 232 may comprise one or more semiconductor material layers. For example, the epitaxial source/drain regions 232 may comprise a first semiconductor material layer 232A, a second semiconductor material layer 232B, and a third semiconductor material layer 232C. Any number of semiconductor material layers may be used for the epitaxial source/drain regions 232. Each of the first semiconductor material layer 232A, the second semiconductor material layer 232B, and the third semiconductor material layer 232C may be formed of different semiconductor materials and may be doped to different dopant concentrations. In some embodiments, the first semiconductor material layer 232A may have a dopant concentration less than the second semiconductor material layer 232B and greater than the third semiconductor material layer 232C. In embodiments in which the epitaxial source/drain regions 232 comprise three semiconductor material layers, the first semiconductor material layer 232A may be deposited, the second semiconductor material layer 232B may be deposited over the first semiconductor material layer 232A, and the third semiconductor material layer 232C may be deposited over the second semiconductor material layer 232B.

Figure 12D:
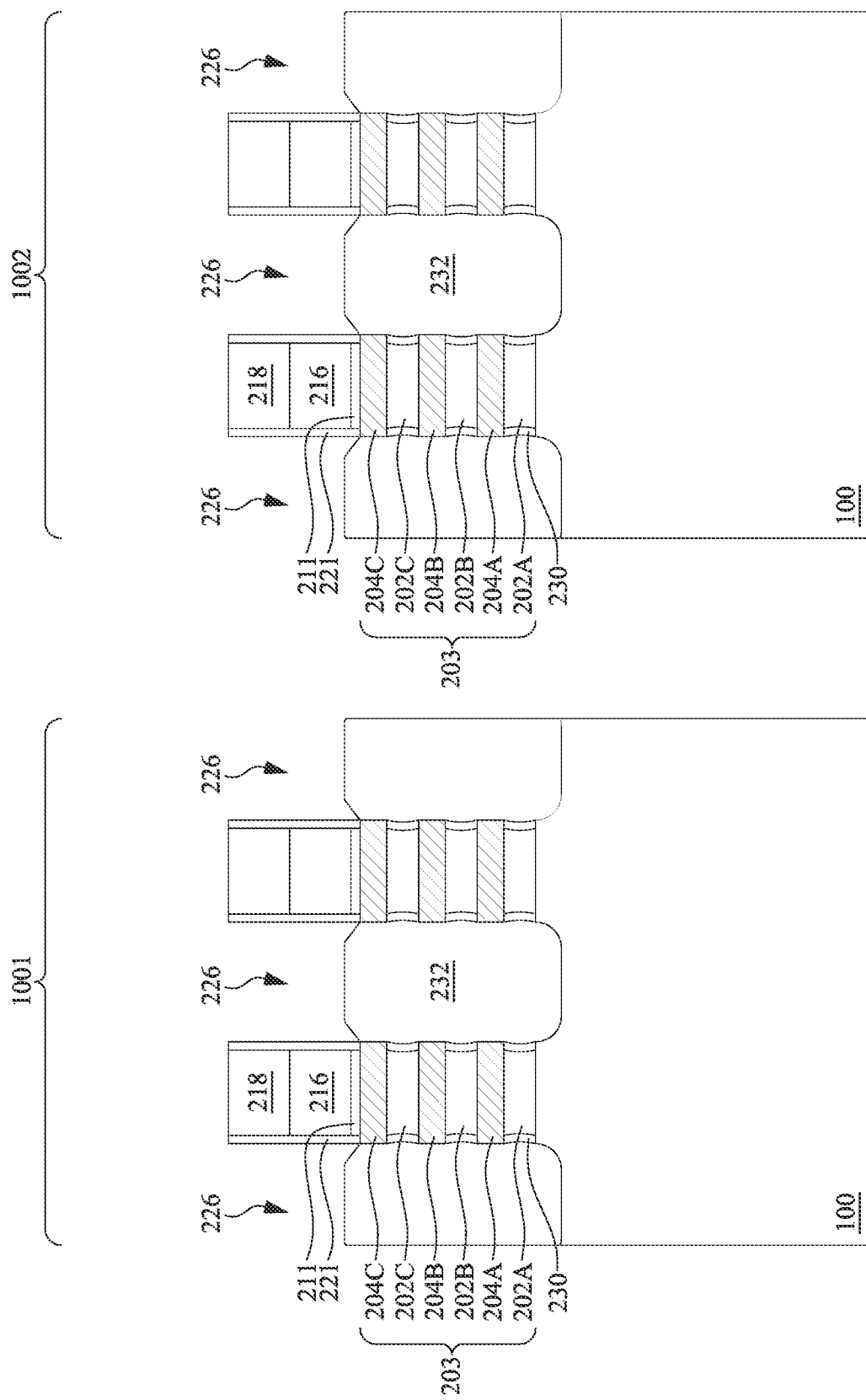

FIG. 12D illustrates an embodiment in which sidewalls of the first nanostructures 202 are concave, outer sidewalls of the inner spacers 230 are concave, and the inner spacers 230 are recessed from sidewalls of the second nanostructures 204. As illustrated in FIG. 12D, the epitaxial source/drain regions 232 may be formed in contact with the inner spacers 230 and may extend past sidewalls of the second nanostructures 204.

Figure 13A:
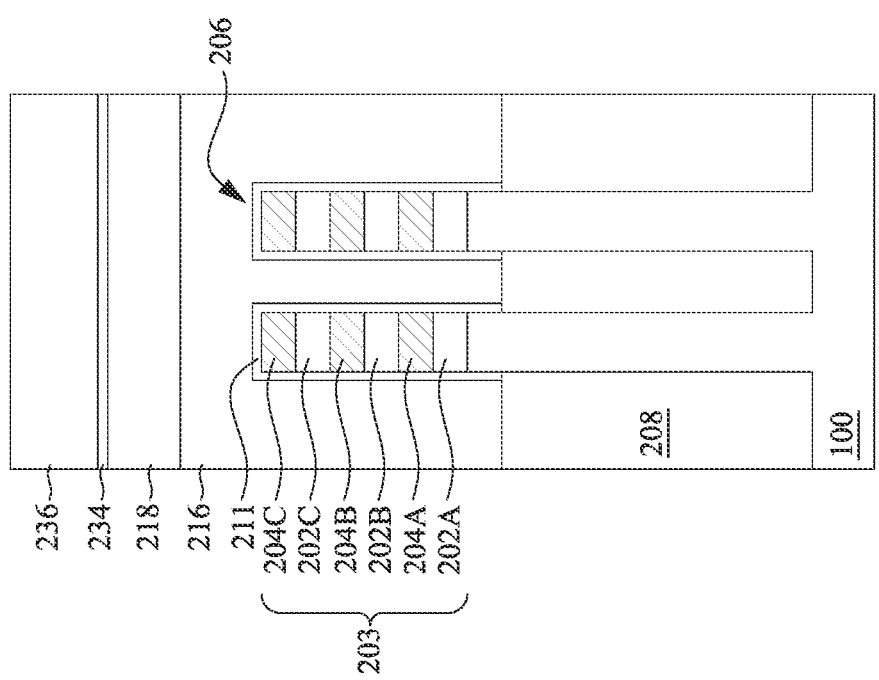
Figure 13B:
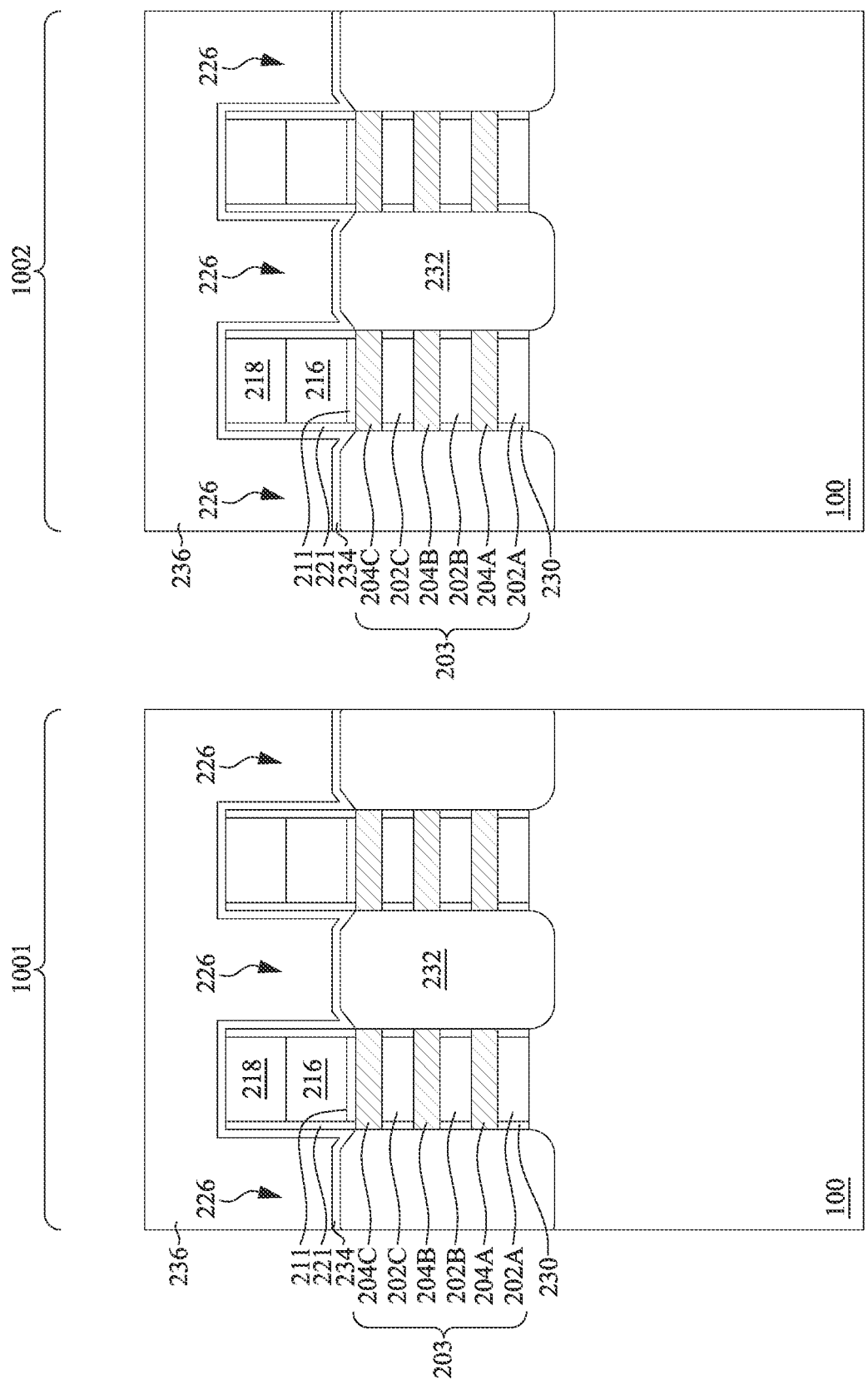

In FIGS. 13A-13C, an interlayer dielectric (ILD) layer 236 is deposited over the structure illustrated in FIGS. 12A-12D. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 218, and the first spacers 221. The CESL 234 may comprise a dielectric material, such as, silicon nitride, silicon oxide, silicon oxynitride, or the like, having a different etch rate than the material of the overlying ILD layer 236.

Figure 14A:
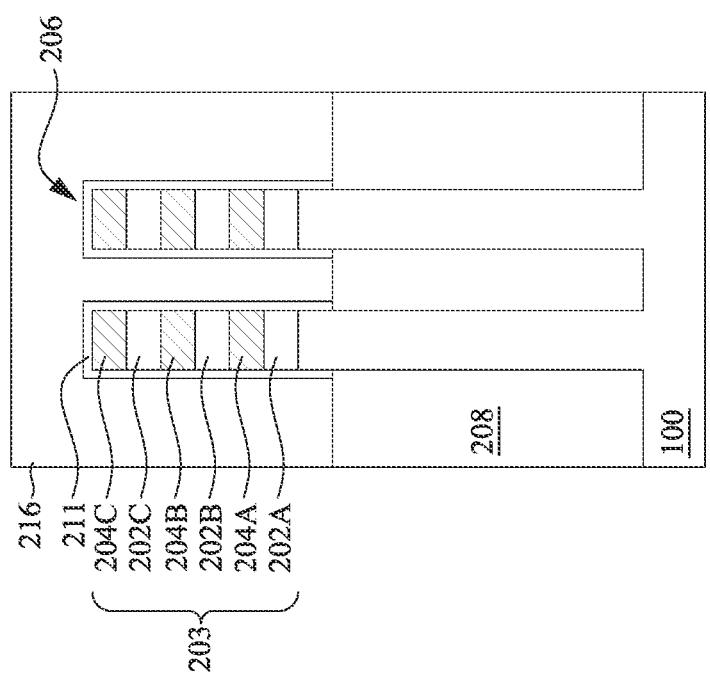
Figure 14B:
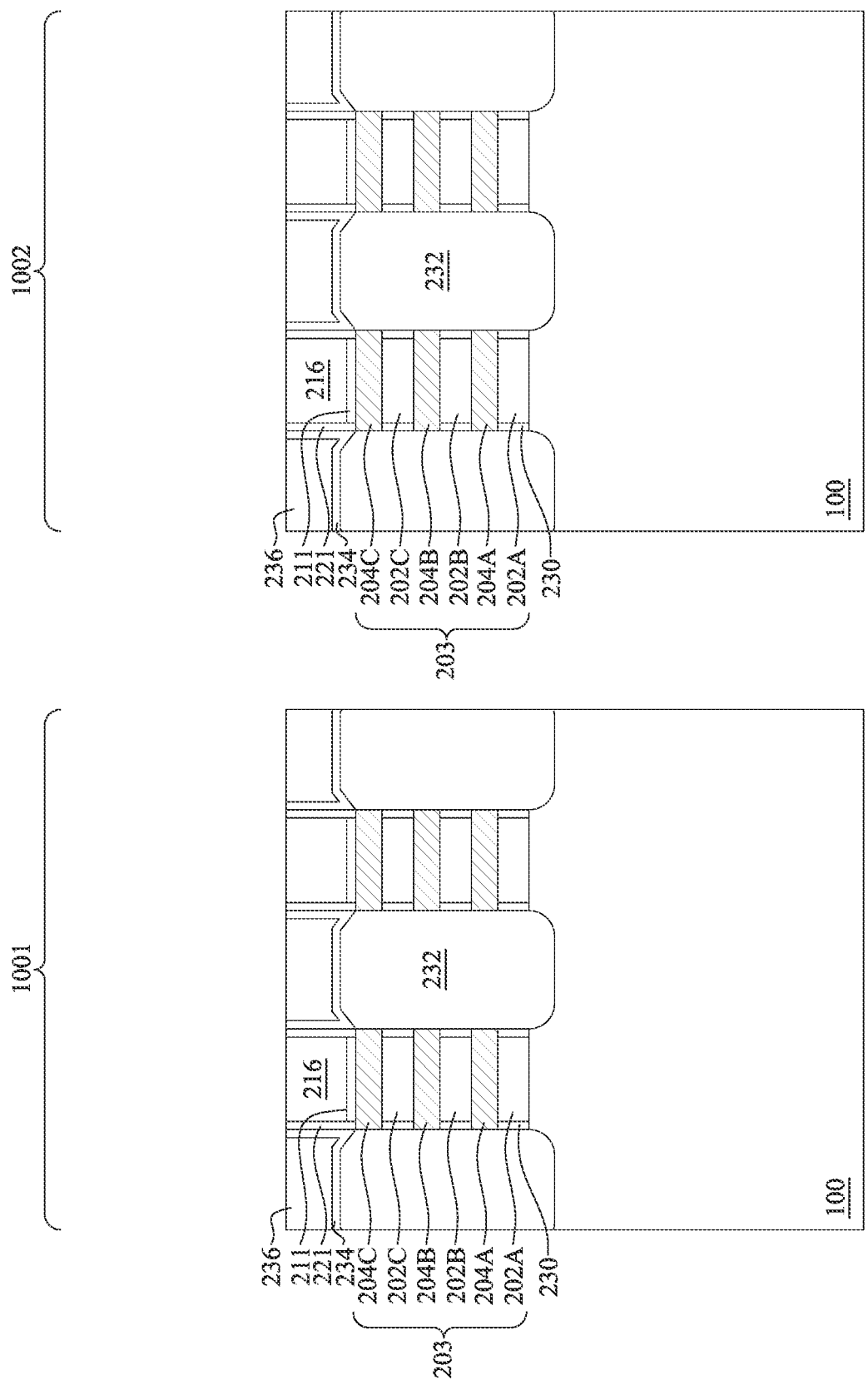

In FIGS. 14A-14B, a planarization process, such as a CMP, may be performed to level the top surface of the ILD layer 236 with the top surfaces of the dummy gates 216 or the masks 218. The planarization process may also remove the masks 218 on the dummy gates 216, and portions of the first spacers 221 along sidewalls of the masks 218. After the planarization process, top surfaces of the dummy gates 216, the first spacers 221, and the ILD layer 236 are level within process variations. Accordingly, the top surfaces of the dummy gates 216 are exposed through the ILD layer 236. In some embodiments, the masks 218 may remain, in which case the planarization process levels the top surface of the ILD layer 236 with top surface of the masks 218 and the first spacers 221.

Figure 15A:
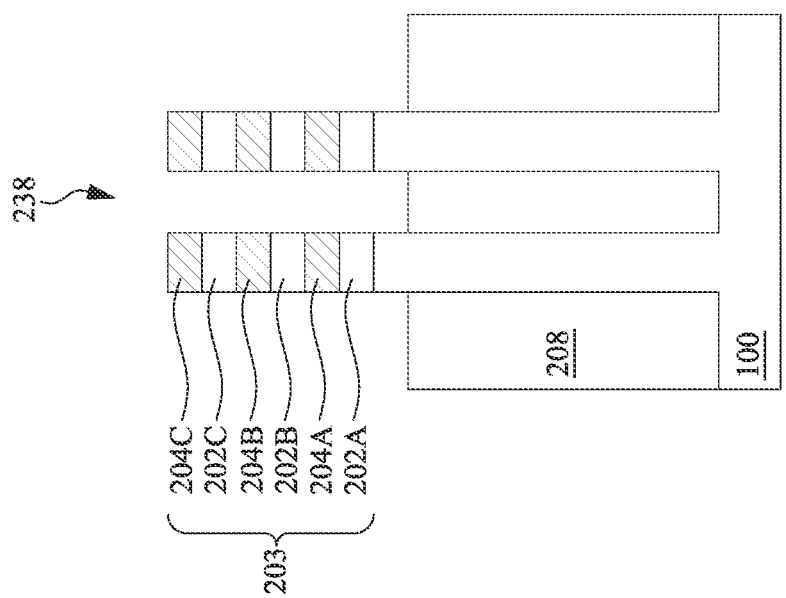
Figure 15B:
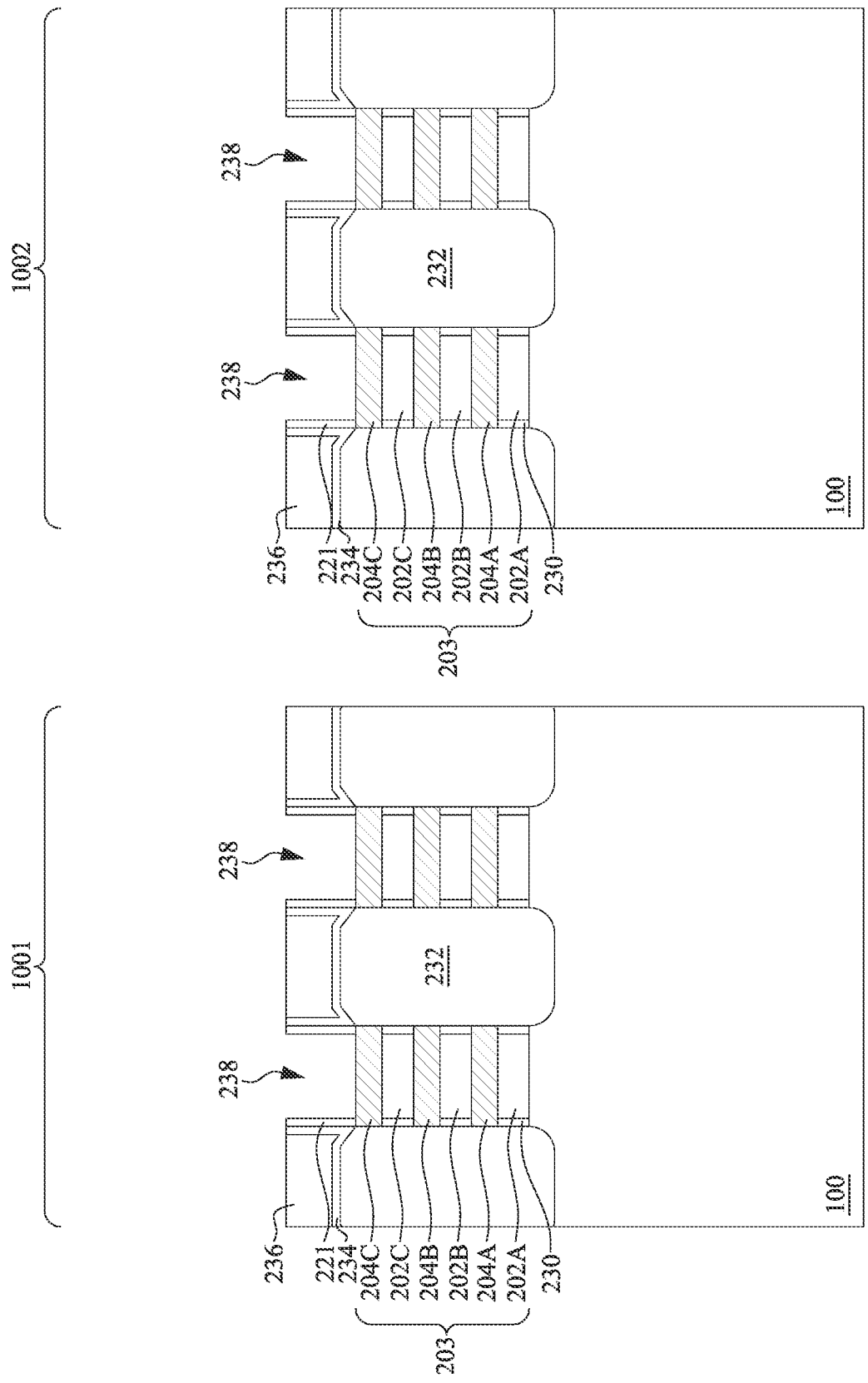

In FIGS. 15A and 15B, the dummy gates 216, and the masks 218 if present, are removed in one or more etching steps, so that gate trenches 238 are formed between corresponding gate spacers 221. In some embodiments, portions of the dummy gate dielectrics 211 in the gate trenches 238 are also be removed. In some embodiments, the dummy gates 216 and the dummy gate dielectrics 211 are removed by an anisotropic dry etch process. For example, the etching process may include a dry etch process using reaction gas(es) that selectively etch the dummy gates 216 at a faster rate than the ILD layer 236 or the first spacers 221. Each gate trench 238 exposes and/or overlies portions of nanostructures 204, which act as channel regions in subsequently completed GAA-FETs. The nanostructures 204 which act as the channel regions are disposed between neighboring pairs of the epitaxial source/drain regions 232. During the removal, the dummy dielectric layers 211 may be used as etch stop layers when the dummy gates 216 are etched. The dummy dielectric layers 211 may then be removed after the removal of the dummy gates 216.

In FIGS. 16A and 16B, the first nanostructures 202 in the gate trenches are removed by an isotropic etching process such as wet etching or the like using etchants which are selective to the materials of the first nanostructures 202. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-sheet spaces if the nanostructures 204 are nanosheets). This step can be referred to as a channel release process. At this interim processing step, the spaces between second nanostructures 204 may be filled with ambient environment conditions (e.g., air, nitrogen, etc). In some embodiments, the second nanostructures 204 can be referred to as nanosheets, nanowires, nanoslabs, nanorings having nano-scale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide ($NH_4OH$) or the like may be used to remove the first nanostructures 202. In some embodiments, both the channel release step and the previous step of laterally recessing first nanostructures 202 (i.e., the step as illustrated in FIGS. 10A-10B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

Figure 17A:
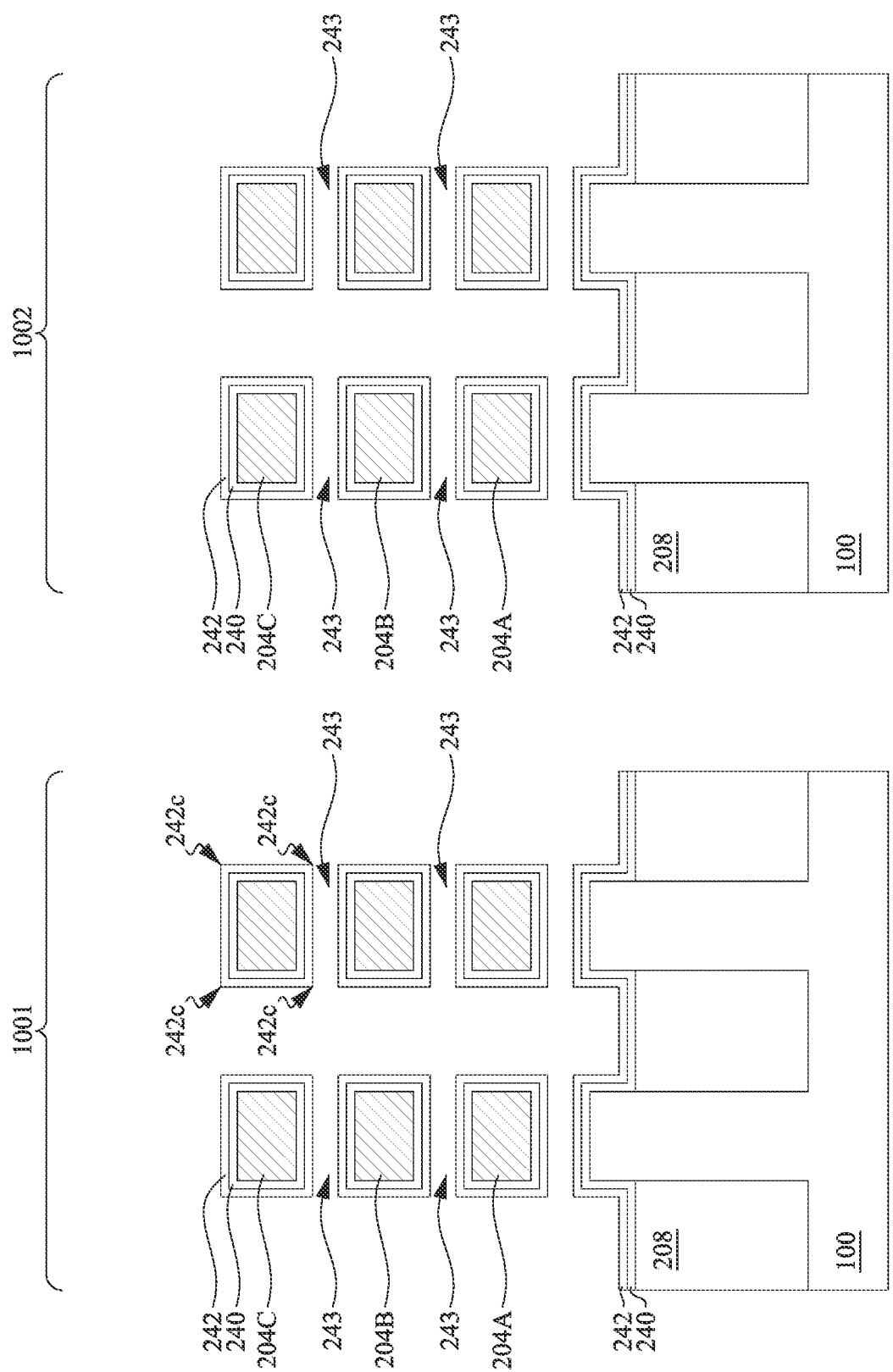
Figure 17B:
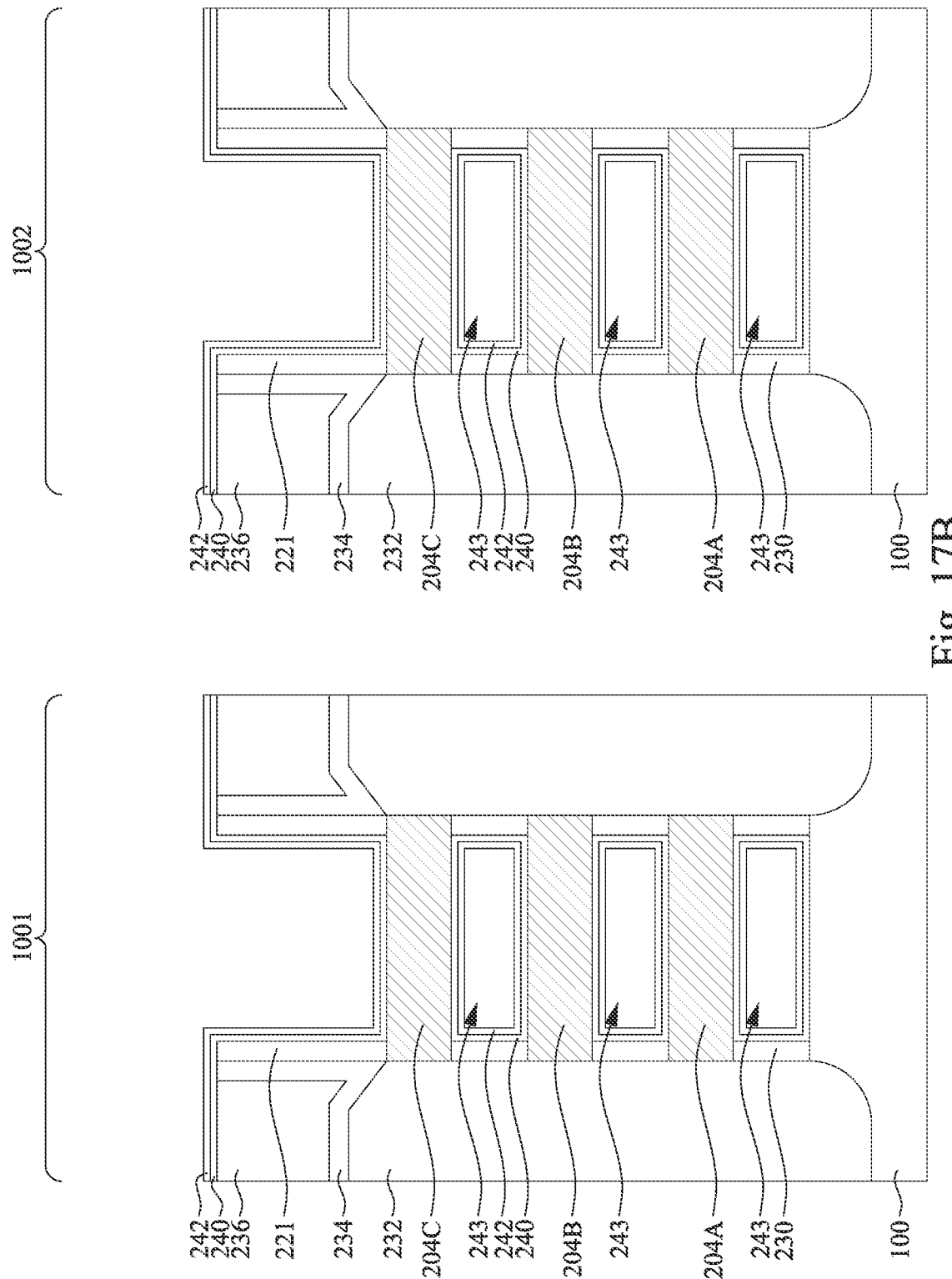

In FIGS. 17A and 17B, gate dielectrics are deposited conformally in the gate trenches 238 in both the first device region 1001 and the second device region 1002. The gate dielectrics comprise one or more dielectric layers, such as an oxide, one or more metal oxides, the like, or combinations thereof. For example, in some embodiments, the gate dielectrics may comprise a first gate dielectric layer 240 and a second gate dielectric layer 242 over the first gate dielectric layer 240. In some embodiments, the first and second gate dielectric layers 240 and 242 both include a high-k dielectric material, and in these embodiments, the first and second gate dielectric layers 240 and 242 may have a k value greater than about 7.0, and may include a metal oxide or a silicate of hafnium, aluminum, zirconium, lanthanum, manganese, barium, titanium, lead, and combinations thereof. In some embodiments, the first gate dielectric layer 240 comprises a different high-k dielectric material than the second gate dielectric layer 242. For example, the first high-k gate dielectric layer 240 is made of hafnium oxide ($HfO_2$), and the second high-k gate dielectric layer 242 is made of lanthanum oxide ($La_2O_3$). The gate dielectric layers 240 and 242 may be globally deposited over the first and second device regions 1001 and 1002 by using, for example, molecular-beam deposition (MBD), ALD, PECVD, or the like.

In FIGS. 18A through 19E, a hard mask layer 244 is deposited on the gate trenches 238 in both the first device region 1001 and the second device region 1002. In some embodiments, the hard mask layer 244 includes aluminum oxide ($AlO_x$), which is deposited over the second gate dielectric layer 242 by using an ALD process performed in an ALD tool.

Figure 25:
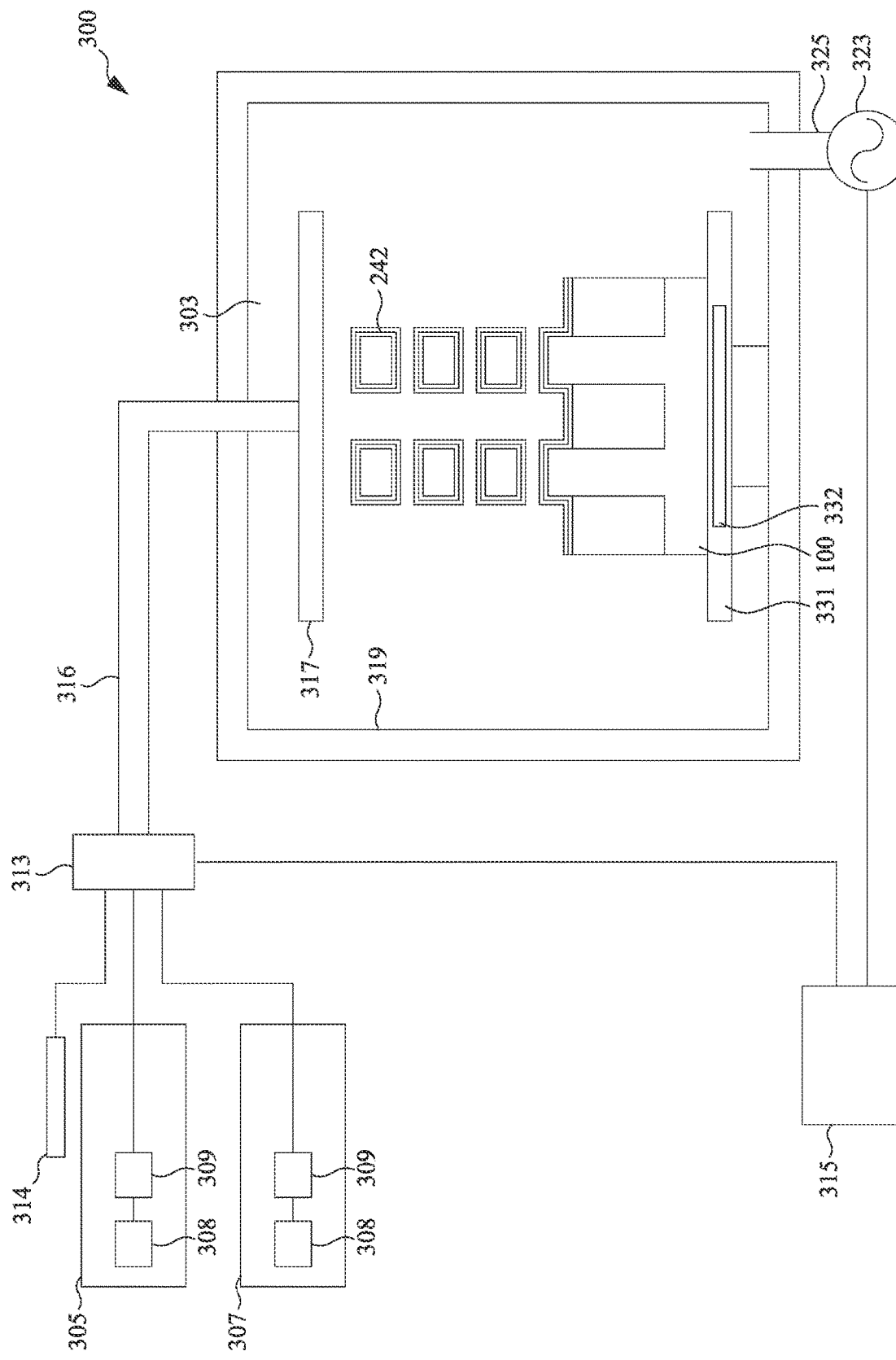
FIG. 25 illustrates an example atomic layer deposition (ALD) tool that may be used to form a hard mask layer during fabricating gate stacks of GAA-FETs, in accordance with some embodiments of the present disclosure.

FIG. 25 illustrates an example ALD tool 300 that may be utilized to form the hard mask layer 244. In some embodiments, the ALD tool 300 may receive precursor materials from a first precursor delivery system 305 and a second precursor delivery system 307, and form the hard mask layer 244 onto the second gate dielectric layer 242 over the substrate 100. The formation of the hard mask layer may be performed in a deposition chamber 303 which receives the first precursor material and the second precursor material.

The first precursor delivery system 305 and the second precursor delivery system 307 may work in conjunction with one another to supply the various different precursor materials to the deposition chamber 303 where the substrate 100 is placed. The first precursor delivery system 305 and the second precursor delivery system 307 may have physical components that are similar with each other. In other embodiments, fewer or more precursor delivery systems may be used.

For example, the first precursor delivery system 305 and the second precursor delivery system 307 may each include a gas supply 308 and a flow controller 309. In some embodiment in which the first precursor material is stored in a gaseous state, the gas supply 308 may supply the first precursor material to the deposition chamber 303. The gas supply 308 may be a vessel, such as a gas storage tank, that is located either locally to the deposition chamber 303 or else may be located remotely from the deposition chamber 303. Alternatively, the gas supply 308 may be a facility that independently prepares and delivers the first precursor material to the flow controller 309. Any suitable source for the first precursor material may be utilized as the gas supply 308, and all such sources are fully intended to be included within the scope of the embodiments.

The gas supply 308 may supply the desired precursor to the flow controller 309. The flow controller 309 may be used to control the flow of the precursor to the gas controller 313 and, eventually, to the deposition chamber 303, thereby also helping to control the pressure within the deposition chamber 303. The flow controller 309 may be, e.g., a proportional valve, a modulating valve, a needle valve, a pressure regulator, a mass flow controller, combinations of these, or the like. However, any suitable method for controlling and regulating the flow of the precursor materials may be used, and all such components and methods are fully intended to be included within the scope of the embodiments.

However, it is understood that, while the first precursor delivery system 305 and the second precursor delivery system 307 have been described herein as having identical components, this is merely an illustrative example and is not intended to limit the embodiments in any fashion. Any type of suitable precursor delivery system, with any type and number of individual components identical to or different from any of the other precursor delivery systems within the ALD tool 300, may alternatively be utilized. All such precursor systems are fully intended to be included within the scope of the embodiments.

Additionally, in an embodiment in which the first precursor material is stored in a solid or liquid state, the gas supply 308 may store a carrier gas and the carrier gas may be introduced into a precursor canister (not separately illustrated), which stores the first precursor in the solid or liquid state. The carrier gas is then used to push and carry the first precursor as it either evaporates or sublimates into a gaseous section of the precursor canister before being sent to the gas controller 313. Any suitable method and combination of units may be utilized to provide the first precursor, and all such combination of units are fully intended to be included within the scope of the embodiments. In some embodiments, the carrier gas may be nitrogen ($N_2$), helium (He), argon (Ar), combinations of these, or the like, although other suitable carrier gases may alternatively be used.

The first precursor delivery system 305 and the second precursor delivery system 307 may supply their individual precursor materials into a gas controller 313. The gas controller 313 connects and isolates the first precursor delivery system 305 and the second precursor delivery system 307, from the deposition chamber 303 in order to deliver the desired precursor materials to the deposition chamber 303. The gas controller 313 may include such devices as valves, flow meters, sensors, and the like to control the delivery rates of each of the precursors, and may be controlled by instructions received from the control unit 315. In some embodiments a purge gas delivery system 314 may be connected to the gas controller 313 and provide a purge gas to the deposition chamber 303. The purge gas delivery system 314 may include a gaseous tank or other facility that provides a purge gas such as nitrogen ($N_2$), helium (He), argon (Ar), xenon (Xe), or combinations of these, or the like, or other non-reactive gas to the deposition chamber 303.

The gas controller 313, upon receiving instructions from the control unit 315, may open and close valves so as to connect one or more of the first precursor delivery system 305 or the second precursor delivery system 307 to the deposition chamber 303 and direct a desired precursor material through a manifold 316 to a showerhead 317 in the deposition chamber 303. The showerhead 317 may be used to disperse the chosen precursor materials into the deposition chamber 303 and may be designed to evenly disperse the precursor materials in order to minimize undesired process conditions that may arise from uneven dispersal. In an embodiment the showerhead 317 may have a circular design with openings dispersed evenly around the showerhead 317 to allow for the dispersal of the desired precursor materials into the deposition chamber 303.

However, the introduction of precursor materials to the deposition chamber 303 through a single showerhead 317 or through a single point of introduction as described above is intended to be illustrative only and is not intended to be limiting to the embodiments. Any number of separate and independent showerheads 317 or other openings to introduce precursor materials into the deposition chamber 303 may alternatively be used. All such combinations of showerheads and other points of introduction are fully intended to be included within the scope of the embodiments.

The deposition chamber 303 may receive the desired precursor materials and expose the precursor materials to the semiconductor device 100. The deposition chamber 303 may be any desired shape that may be suitable for dispersing the precursor materials and contacting the precursor materials with the semiconductor device 100. In the embodiment illustrated in FIG. 25, the deposition chamber 303 has a cylindrical sidewall and a bottom. However, the deposition chamber 303 is not limited to a cylindrical shape, and any other suitable shape, such as a hollow square tube, an octagonal shape, or the like, may be used. Furthermore, the deposition chamber 303 may be surrounded by a housing 319 made of material that is inert to the various process materials. As such, while the housing 319 may be any suitable material that can withstand the chemistries and pressures involved in the deposition process, in an embodiment the housing 319 may be steel, stainless steel, nickel, aluminum, alloys of these, combinations of these, and like.

Within the deposition chamber 303 the semiconductor wafer 100 may be placed on a mounting platform 331 in order to position and control the semiconductor wafer 100 during the deposition processes. The mounting platform 331 may include a heater 332 or other heating mechanism in order to heat the semiconductor wafer 100 during the ALD process. Furthermore, while a single mounting platform 331 is illustrated in FIG. 25, any number of mounting platforms 331 may additionally be included within the deposition chamber 303.

Additionally, the deposition chamber 303 and the mounting platform 331 may be part of a cluster tool system (not shown). The cluster tool system may be used in conjunction with an automated handling system in order to position and place the semiconductor wafer 100 into the deposition chamber 303 prior to the ALD processes, position, hold the semiconductor wafer 100 during the ALD process, and remove the semiconductor wafer 100 from the deposition chamber 303 after the deposition process.

The deposition chamber 303 may also have an exhaust outlet 325 for exhaust gases to exit the deposition chamber 303. A vacuum pump 323 may be connected to the exhaust outlet 325 of the deposition chamber 303 in order to help evacuate the exhaust gases. The vacuum pump 323, under control of the control unit 315, may also be utilized to reduce and control the pressure within the deposition chamber 303 to a desired pressure and may also be used to evacuate precursor materials or reaction byproducts from the deposition chamber 303 in preparation for another step of the deposition process.

Figure 18A:
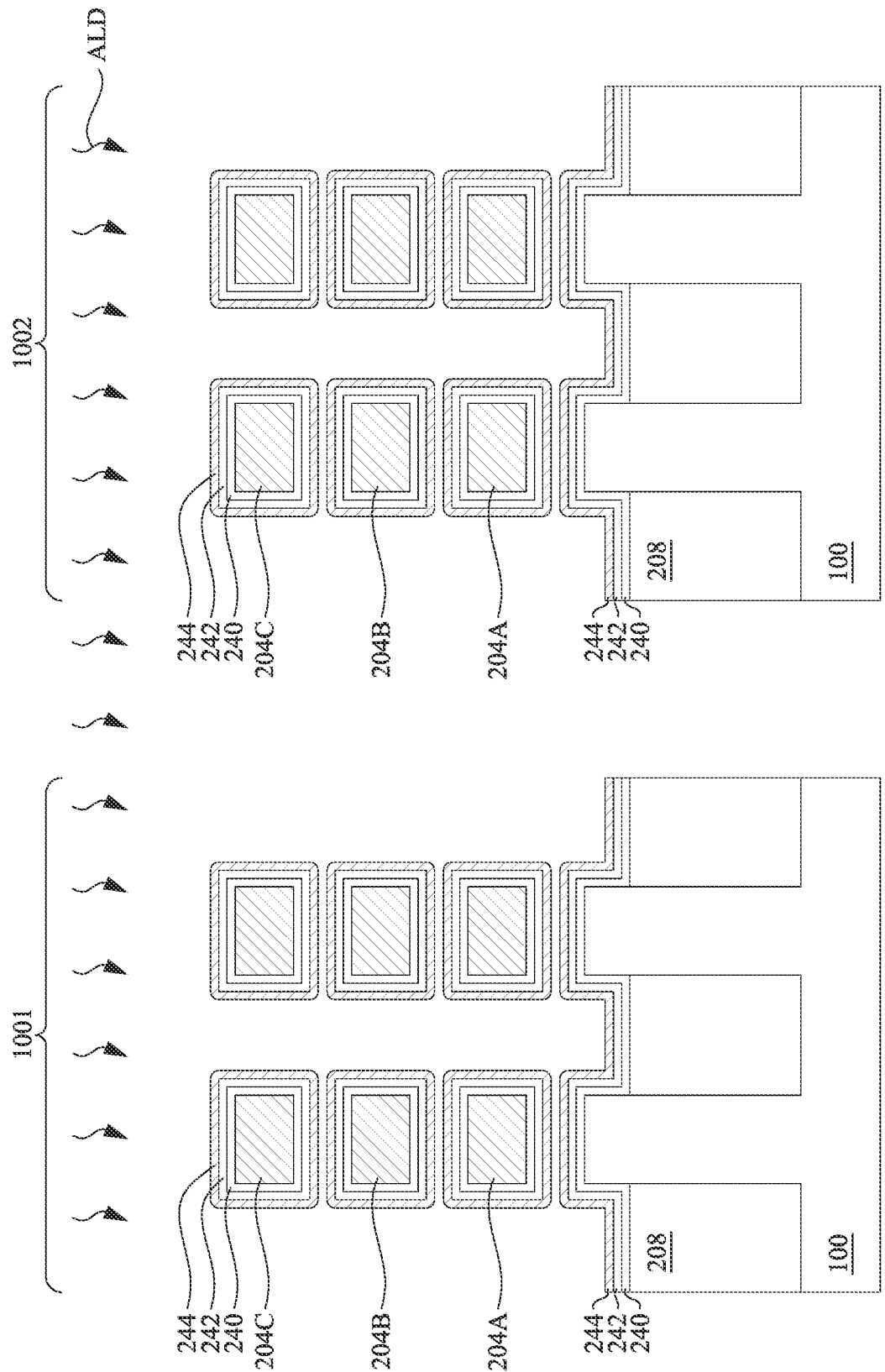
Figure 18B:
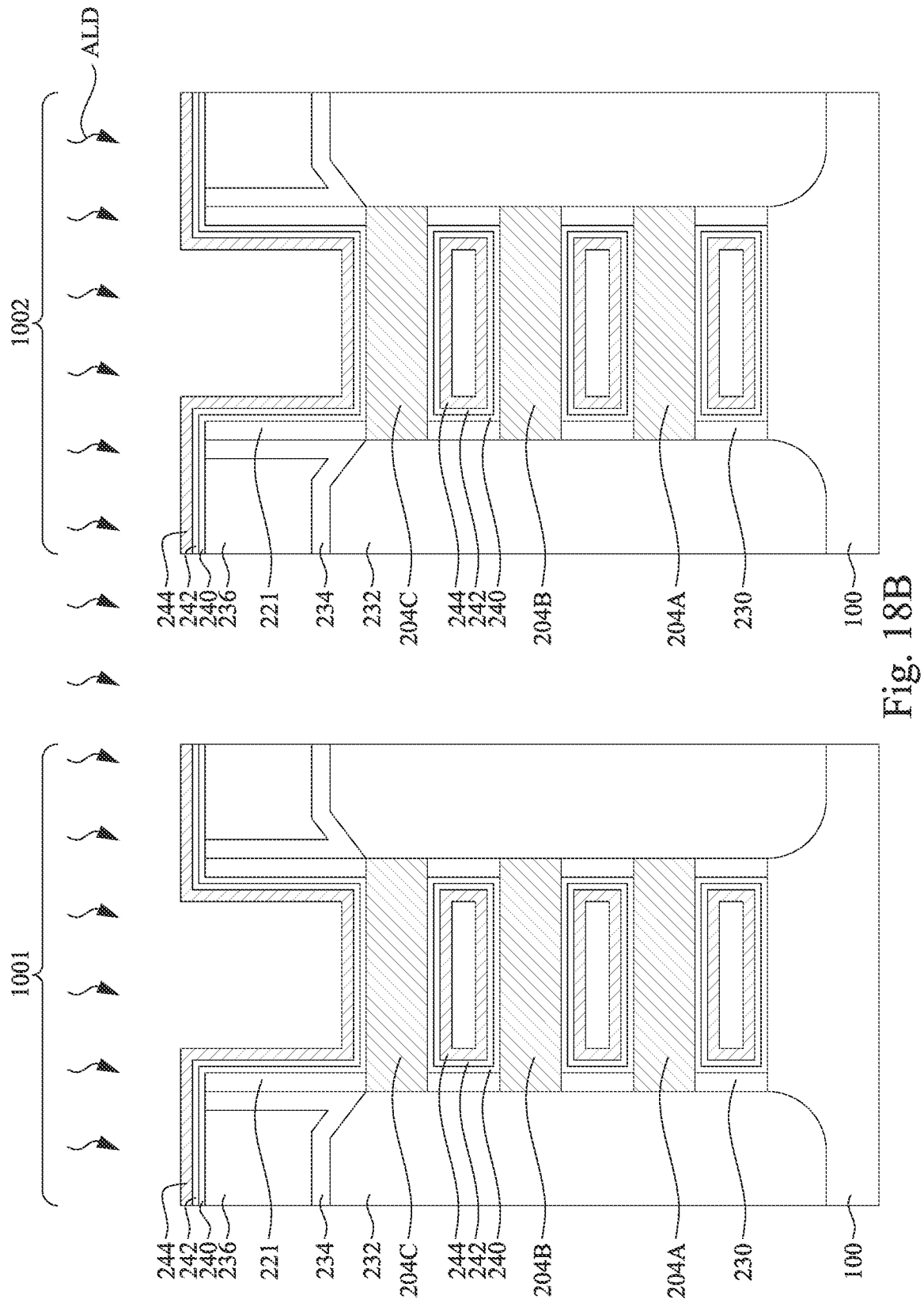
Figure 26:
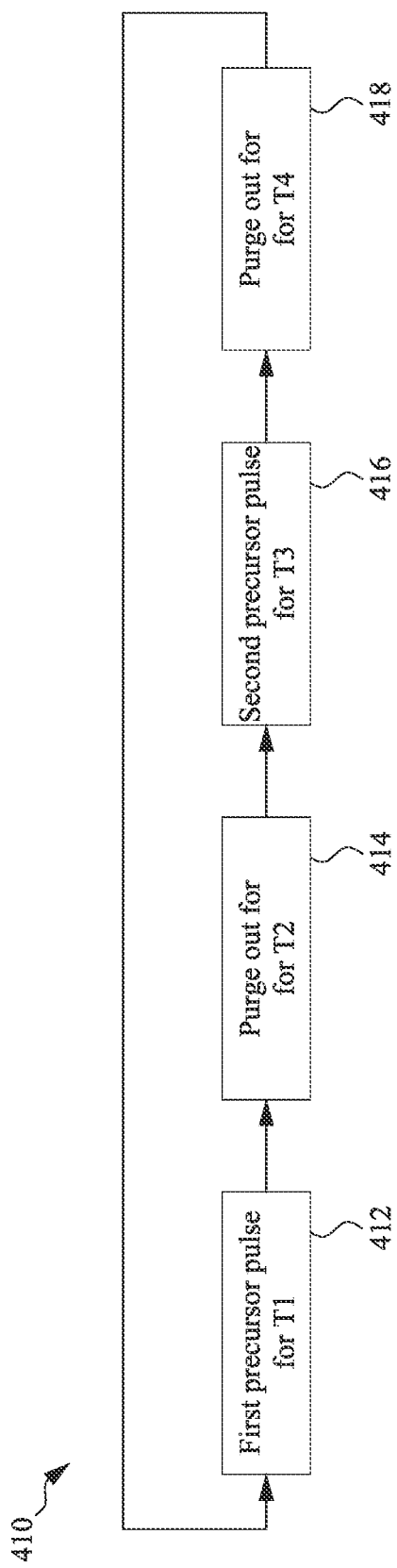
FIG. 26 illustrates an ALD process that may be used to form a hard mask layer during fabricating gate stacks of GAA-FETs, in accordance with some embodiments of the present disclosure.

The tool 300 of FIG. 25 may be utilized to form the hard mask layer 244 through an ALD process as illustrated in FIGS. 18A-19E, wherein FIGS. 18A and 18B illustrate cross-sectional views of an initial stage of the ALD film growth, and FIGS. 19A-19E illustrate cross-sectional views of various embodiments of a final stage of the ALD film growth. Referring now to FIG. 26, a summary of an embodiment ALD process flow of forming the hard mask layer 244 is illustrated. In some embodiments where the hard mask layer 244 is a binary compound such as aluminum oxide, the ALD process includes one or more deposition cycles 410 to deposit one or more monolayers of aluminum oxide. Each deposition cycle 410 includes pulsing an oxygen-containing precursor into an ALD chamber (step 412) for a first pulse time T1, purging the oxygen-containing precursor from the ALD chamber (step 414) for a first purge time T2, pulsing an aluminum-containing precursor into the ALD chamber (step 416) for a second pulse time T3, and purging the aluminum-containing precursor from the ALD chamber (step 418) for a second purge time T4. The aluminum-containing precursor reacts with the oxygen-containing precursor to deposit a monolayer of aluminum oxide on exposed surfaces of the second gate dielectric layer 242. Each deposition cycle 410 deposits a single monolayer of aluminum oxide, and any number of deposition cycles 410 may be performed to deposit a target quantity of titanium nitride monolayers. It is observed that pulsing the oxygen-containing precursor before pulsing the aluminum-containing precursor in each cycle may achieve a better aluminum oxide film quality (e.g., better thickness uniformity) than pulsing the aluminum-containing precursor before pulsing the oxygen-containing precursor. Therefore, the sequence of pulsing the oxygen-containing precursor prior to pulsing the aluminum-containing precursor can aid in improving the resultant aluminum oxide film quality.

Figure 19A:
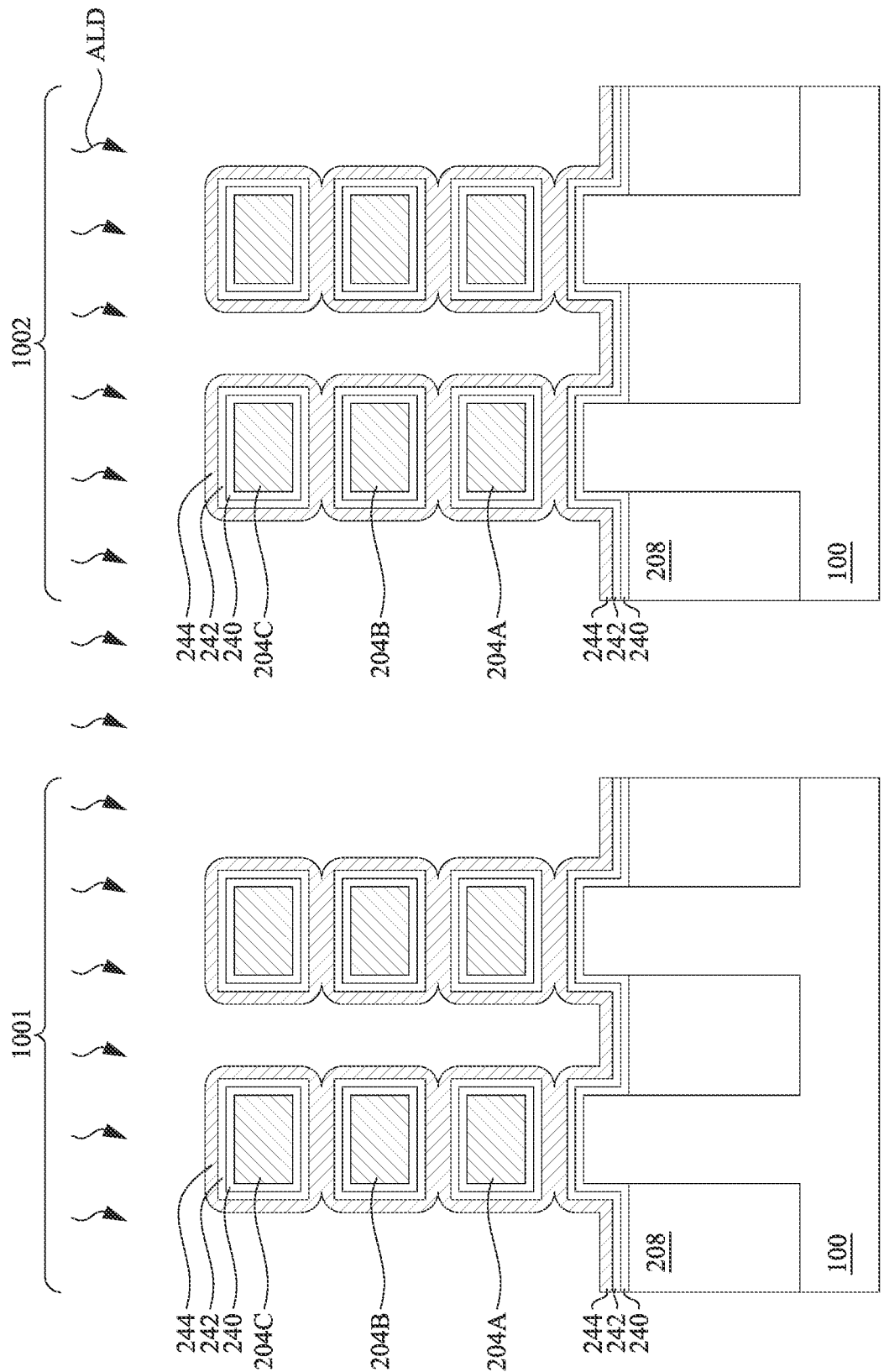
Figure 19B:
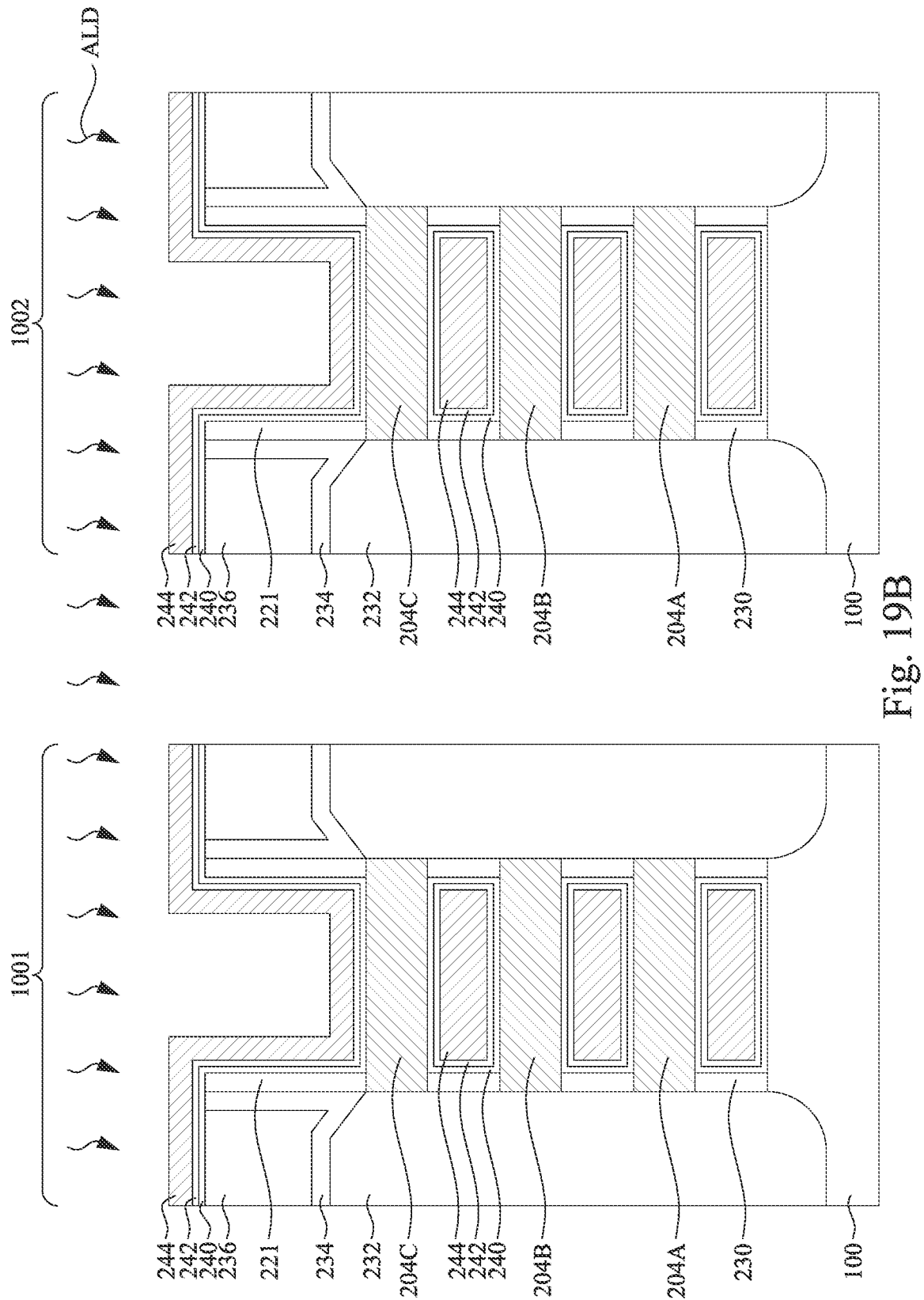
Figure 19C:
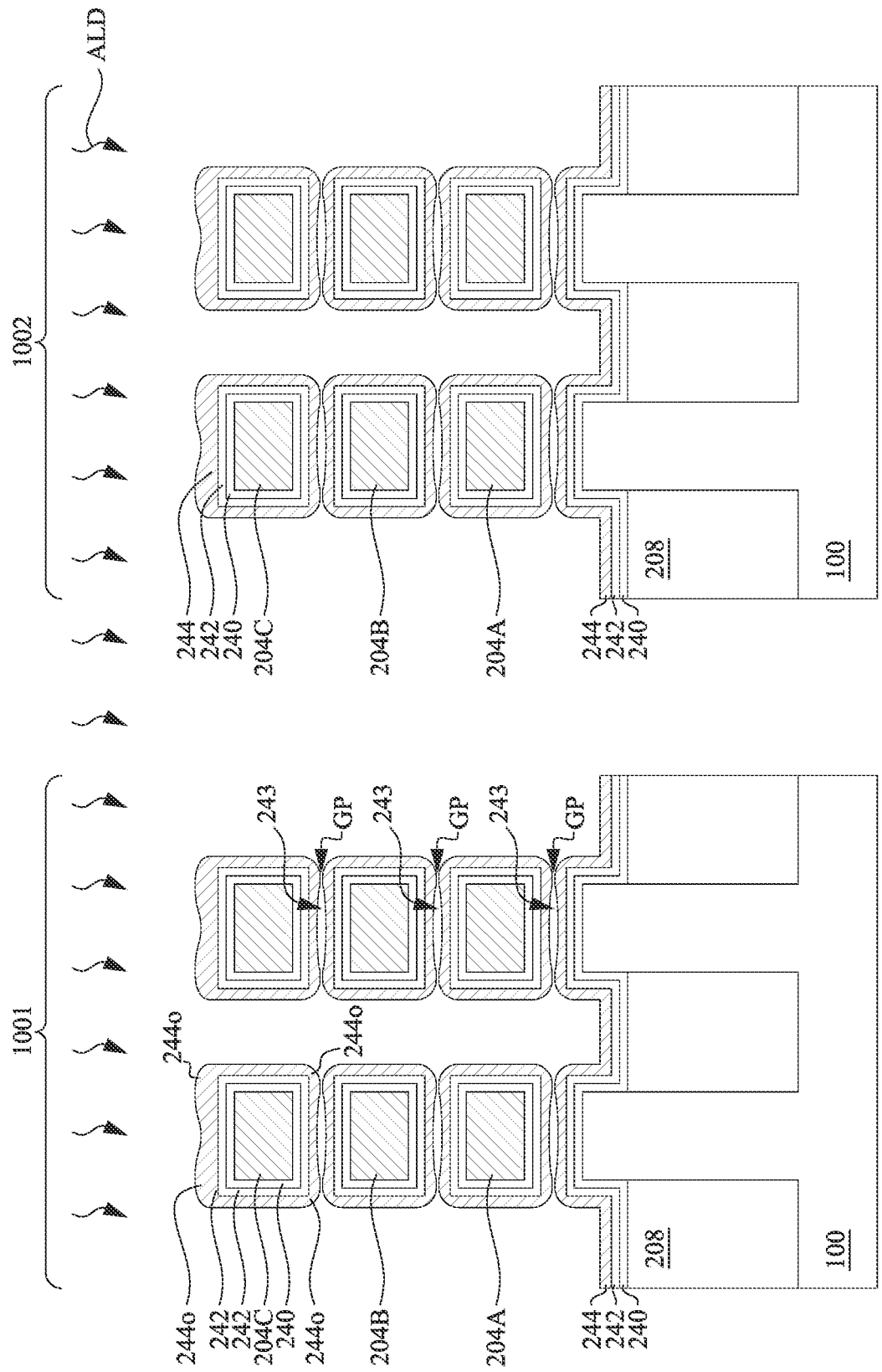
Figure 19D:
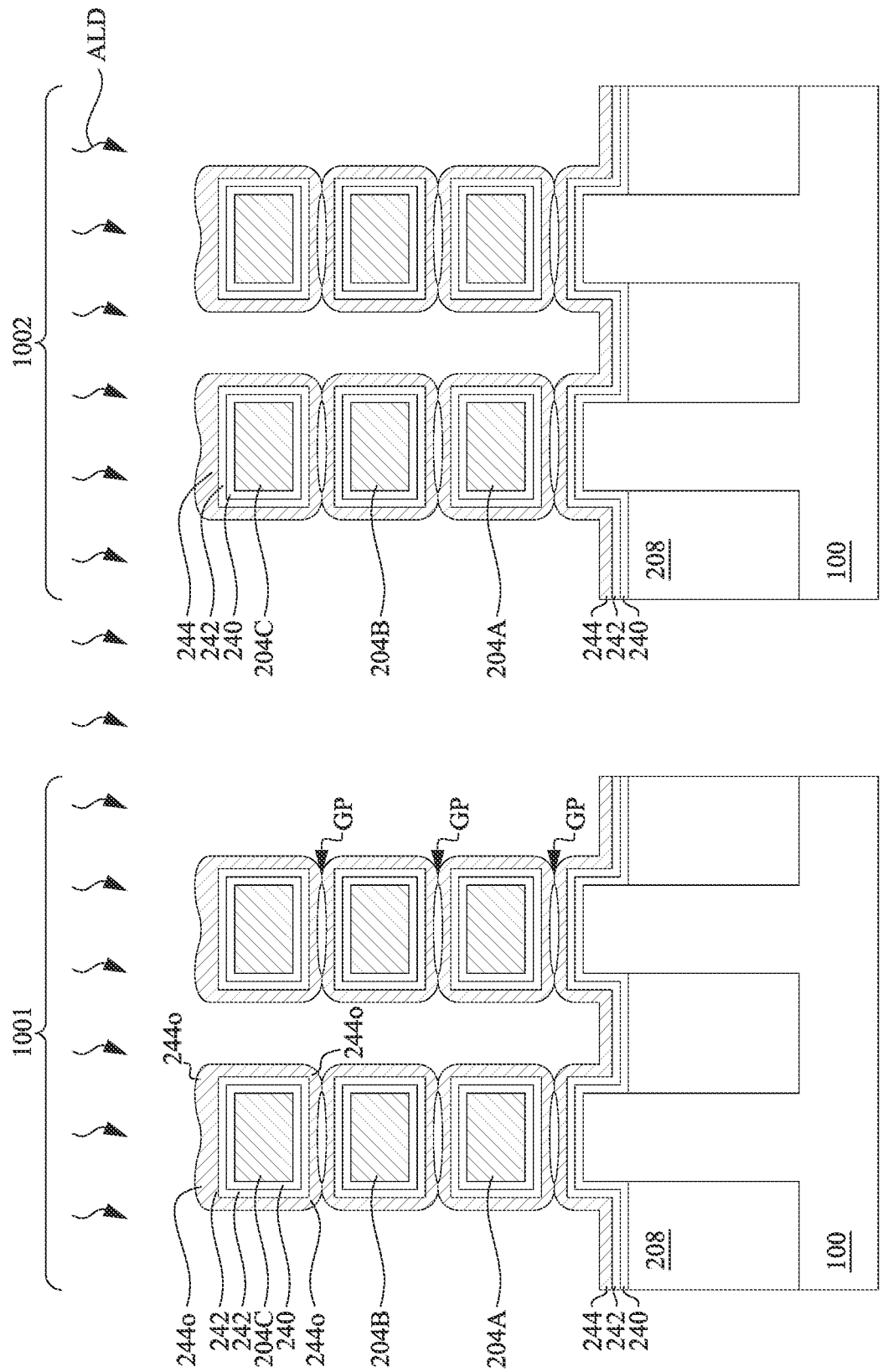
Figure 19E:
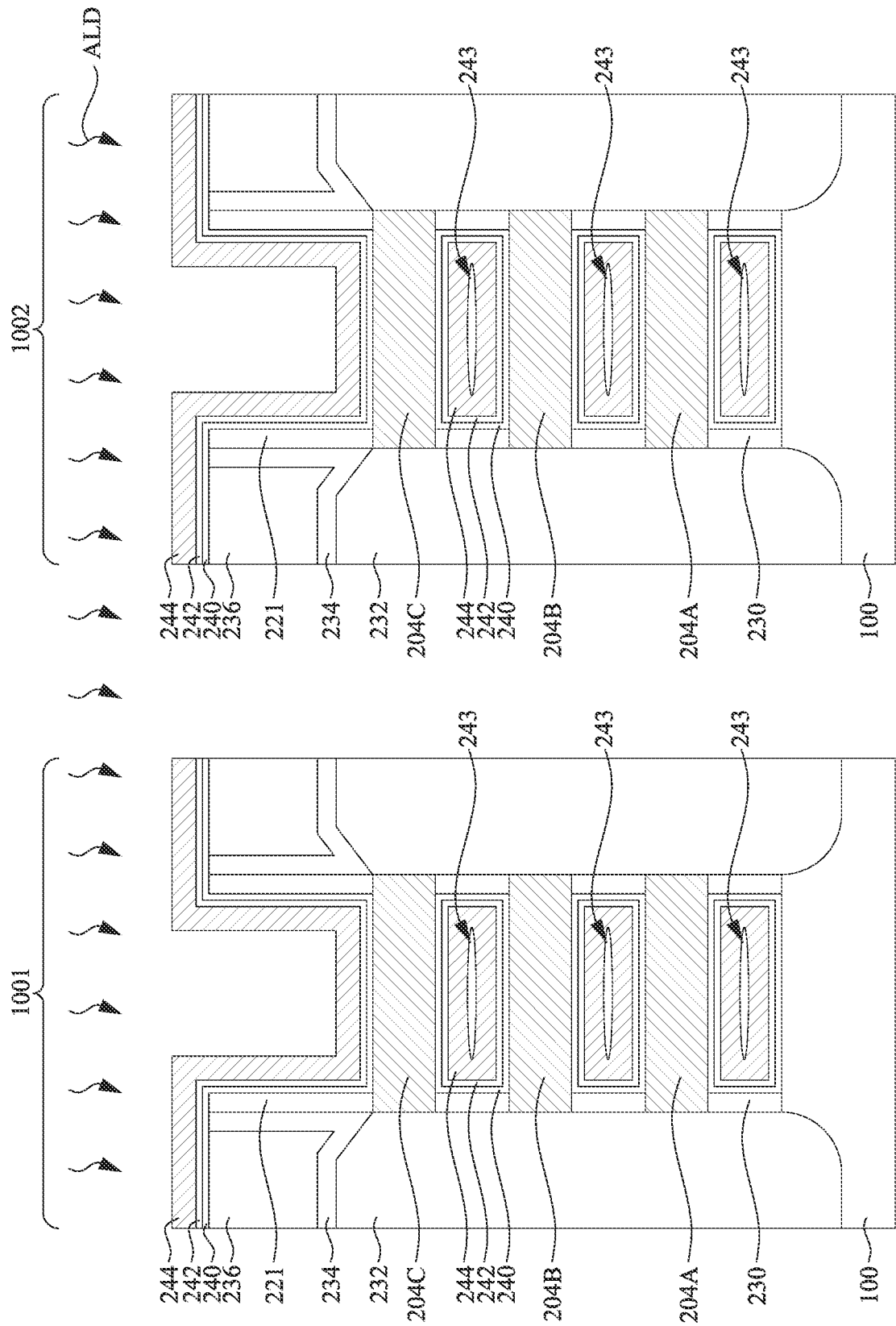

If the oxygen-containing precursor pulse time T1 and/or the aluminum-containing precursor pulse time T3 are shorter than 1 second, overhangs 244o may be formed at each corner 242c of the second gate dielectric layer 242, as illustrated in FIGS. 19C and 19D. In some embodiments, as the ALD cycle 410 repeats, the overhangs 244o would extend toward each other to form seam-holes, voids or gaps GP in each space 243 between neighboring nanostructures 204 (interchangeably referred to as sheet-sheet spaces), as illustrated in FIG. 19C. In some embodiments, as the ALD cycles 410 repeats, the overhangs 244o may merge, sealing off the sheet-sheet spaces 243 with seam-holes, voids or gaps GP sealed in each sheet-sheet space 243, as illustrated in FIGS. 19D and 19E. In the scenario of FIG. 19C, a BARC material may inadvertently flow into the seam-holes GP in a following BARC coating process (as illustrated in FIG. 20C), which in turn may leave BARC residues in the sheet-sheet spaces 243, thus impeding following deposition of gate metal materials in the sheet-sheet spaces 243.

Therefore, in some embodiments of the present disclosure, the oxygen-containing precursor pulse time T1 and/or the aluminum-containing precursor pulse time T3 are lengthened to reduce a number of seam-holes GP in the hard mask layer 244 to an acceptable amount, or to form a seam-free hard mask layer 244. For example, the oxygen-containing precursor is pulsed for the pulse time T1 greater than about 1 second, about 2 seconds, about 3 seconds, about 4 seconds, about 5 seconds, about 6 seconds, or even more, and the aluminum-containing precursor is pulsed for the pulse time T3 greater than about 1 second, about 2 seconds, about 3 seconds, about 4 seconds, about 5 seconds, about 6 seconds, or even more. When the oxygen-containing precursor pulse time T1 and/or the aluminum-containing precursor pulse time T3 are great than about 1 second, the pulse time durations are long enough to aid in diffusing the oxygen-containing precursor and/or the aluminum-containing precursor deeper into the sheet-sheet spaces 243, which in turn can inhibit formation of overhangs at some or all corners 242c of the second gate dielectric layer 242, which in turn can reduce the number or percentage of seam-holes GP in the hard mask layer 244. Seam-hole percentage in this context may be referred to as a ratio of total seam-hole size of all seam holes to a size of the hard mask layer. A seam-free hard mask layer 244 (as illustrated in FIG. 19A) may aid in reducing the risk that BARC flows in the sheet-sheet spaces 243 in following processing. A hard mask layer having an acceptable amount of seam-holes may be advantageous for following hard mask removal process, because it takes less time to remove the hard mask layer by wet etching.

Moreover, in some embodiments, the oxygen-containing precursor purge time T2 and/or the aluminum-containing precursor purge time T3 are lengthened to get rid of by-products resulting from the oxygen-containing precursor pulse step 412 and/or the aluminum-containing precursor pulse step 416, which in turn can reduce the risk that by-products merge above the topmost nanostructure 204C in the gate trench in the cross-section of FIG. 19B.

In some embodiments, the oxygen-containing precursor purge time T2 is at least about fifteen times the oxygen-containing precursor pulse time T1. Because the oxygen-containing precursor pulse time T1 is more than about 1 second, the oxygen-containing precursor purge time T2 is more than about 15 seconds. Similarly, if the oxygen-containing precursor pulse time T1 is more than 2 second, the oxygen-containing precursor purge time T2 is more than about 30 seconds, and so on. In some embodiments, the aluminum-containing precursor purge time T4 is at least about ten times the aluminum-containing precursor pulse time T3. Because the aluminum-containing precursor pulse time T3 is more than about 1 second, the aluminum-containing precursor purge time T4 is more than about 10 seconds. Similarly, if the aluminum-containing precursor pulse time T3 is more than 2 second, the aluminum-containing precursor purge time T4 is more than about 20 seconds, and so on.

In some embodiments, a ratio of the oxygen-containing precursor purge time T2 to the oxygen-containing precursor pulse time T1 is greater than a ratio of the aluminum-containing precursor purge time T4 to the aluminum-containing precursor pulse time T3, because it is easier to purge out the aluminum-containing precursor gas (e.g., TMA) than purging out the oxygen-containing precursor gas (e.g., $H_2O$). For example, the ratio of the oxygen-containing precursor purge time T2 to the oxygen-containing precursor pulse time T1 is at least about 15:1, and the ratio of the aluminum-containing precursor purge time T4 to the aluminum-containing precursor pulse time T3 is at least about 10:1.

In some embodiments, the oxygen-containing precursor pulse time T1 is substantially the same as the aluminum-containing precursor pulse time T3. In this scenario, the oxygen-containing precursor purge time T2 is longer than the aluminum-containing precursor purge time T4. For example, when the oxygen-containing precursor pulse time T1 is substantially the same as the aluminum-containing precursor pulse time T3, a ratio of the oxygen-containing precursor purge time T2 to the aluminum-containing precursor purge time T4 is about 3:2. For example, when the oxygen-containing precursor pulse time T1 and the aluminum-containing precursor pulse time T3 are the same and both greater than about 1 second, the oxygen-containing precursor purge time T2 is greater than about 15 seconds, and the aluminum-containing precursor purge time T4 is greater than about 10 seconds and less than the oxygen-containing precursor purge time T2.

In some embodiments, the aluminum-containing precursor used in the ALD deposition cycle 410 includes, for example, trimethylaluminum, the chemical compound with the formula $Al_2(CH_3)_6$, abbreviated as $Al_2Me_6$, $(AlMe_3)_2$ or the abbreviation TMA. In some embodiments, the oxygen-containing precursor used in the ALD deposition cycle 410 is water ($H_2O$), oxygen ($O_2$), ozone ($O_3$), hydrogen peroxide ($H_2O_2$), or the like. In some embodiments, the ALD deposition cycle 410 uses $H_2O$ as the first precursor and TMA as the second precursor. In some embodiments, in each step in the ALD deposition cycle 410, the deposition chamber may be held at a constant pressure (isobaric) lower than about 1.5 torr, and a constant temperature (isothermal) greater than about 250° C. In some embodiments, the number of deposition cycles 410 is in a range from about 20 to about 60. If the process conditions (e.g., pressure, temperature, and cycle number) are outside the above selected ranges, the hard mask layer 244 may be formed with an unacceptable number or percentage of seam-holes.

In the embodiments as discussed above the hard mask layer 244 is made of aluminum oxide. However, in some other embodiments, other materials may be used as the hard mask layer 244, as long as the hard mask layer 244 has an etch selectivity with an underlying layer (e.g., the second gate dielectric layer 242) to be patterned. By way of example and not limitation, the hard mask layer 244 may include titanium oxide ($TiO_x$), zirconium oxide ($ZrO_x$), zinc oxide (ZnO), tin oxide ($SnO_x$), silicon nitride, silicon carbide, silicon carbon nitride, combinations or multiple layers or the like. In some embodiments, the ALD process for forming these materials may use a first precursor gas and a second precursor gas, wherein the first precursor gas may include, for example, diethyl zinc (DEZ, $Zn(C_2H_5)_2$), tetrakis(dimethylamino)titanium (TDMAT, $Ti[(CH_3)_2N]_4$), titanium isopropoxide (TTIP, $T[(CH_3)_2OCH]_4$), titanium tetrachloride ($TiCl_4$), bis(tertiary-butyl-amino)silane (BTBAS, $[NH(C_4H_9)]_2SiH_2$), bis(diethylamino)silane (BDIS, $SiH_2[N(C_2H_5)_2]_2$), tris(dimethylamino)silane (3DMAS, $SiH[N(CH_3)_2]_3$), tetrakis(dimethylamido)zirconium (TDMAZ, $Zr[N(CH_3)_2]_4$), zirconium tetrachloride ($ZrCl_4$), tetrakis(dimethylamido)tin (TDMASn, $Sn[N(C_2H_5)_4]$), or the like, and the second precursor gas may include, for example, an oxygen source (e.g., water ($H_2O$), oxygen ($O_2$), ozone ($O_3$), hydrogen peroxide ($H_2O_2$), nitrous oxide ($N_2O$), or the like), another reacting compound (e.g., nitrogen ($N_2$), ammonia ($NH_3$), or the like), combinations thereof, or the like.

Figure 20A:
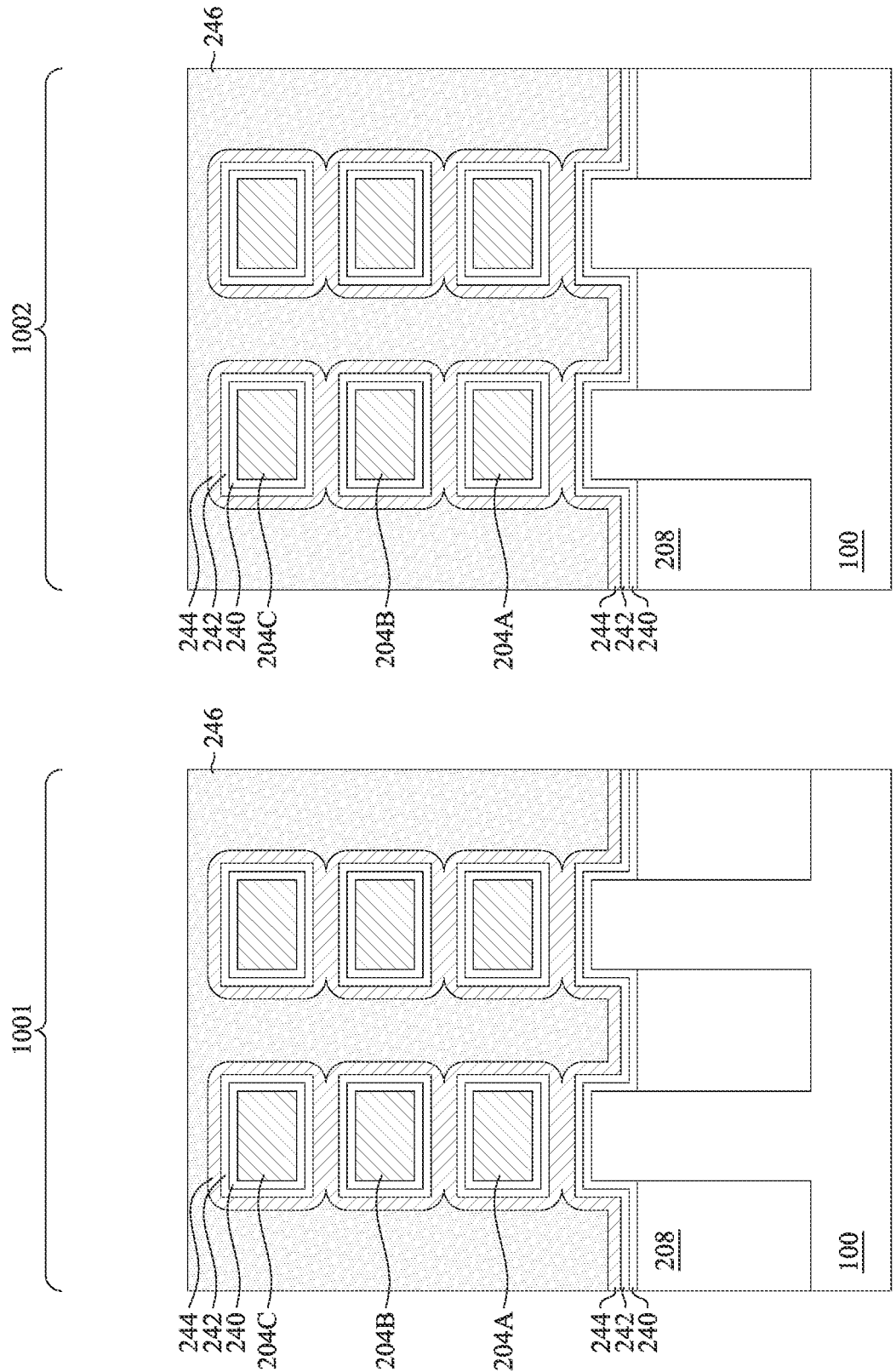
Figure 20B:
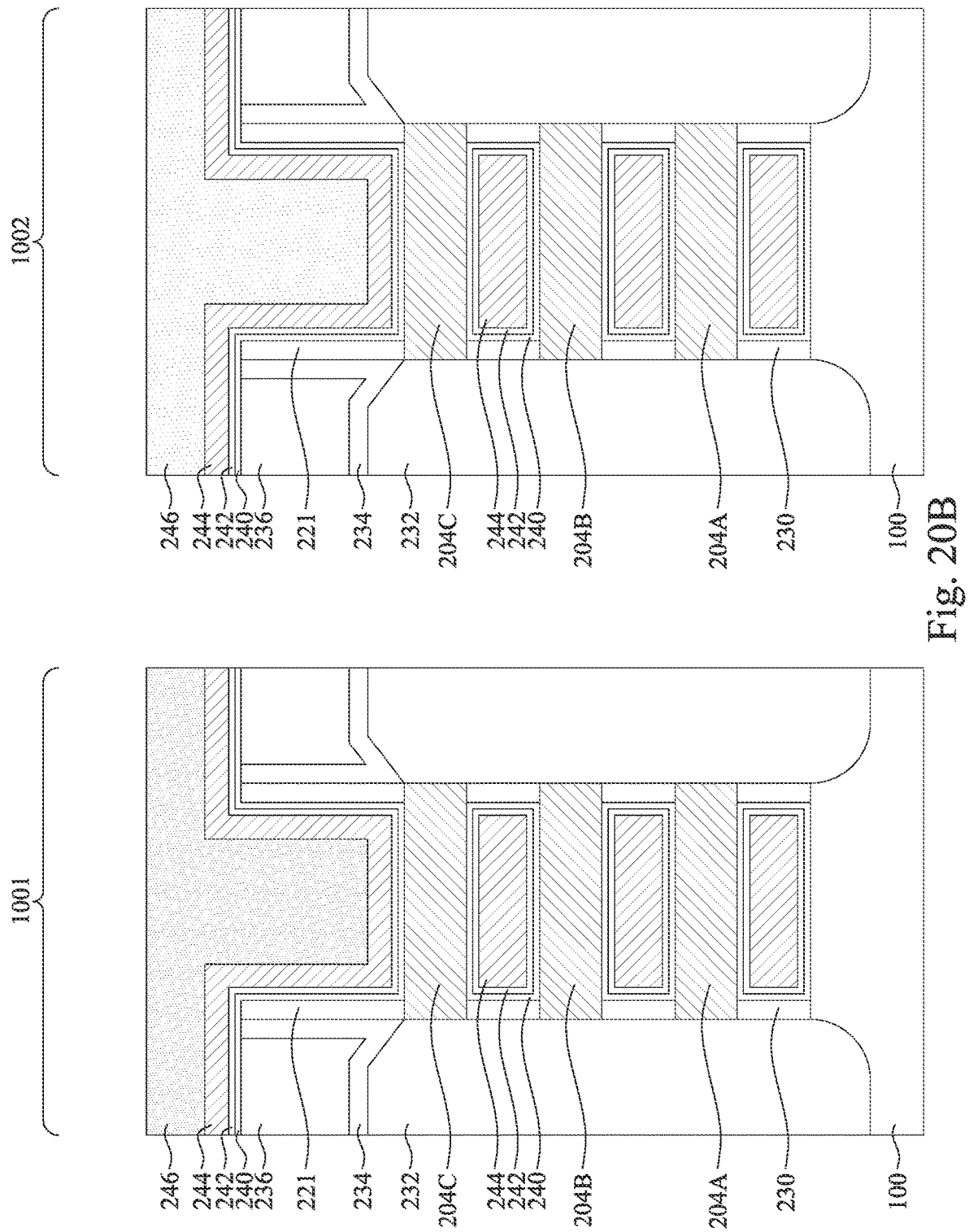
Figure 20C:
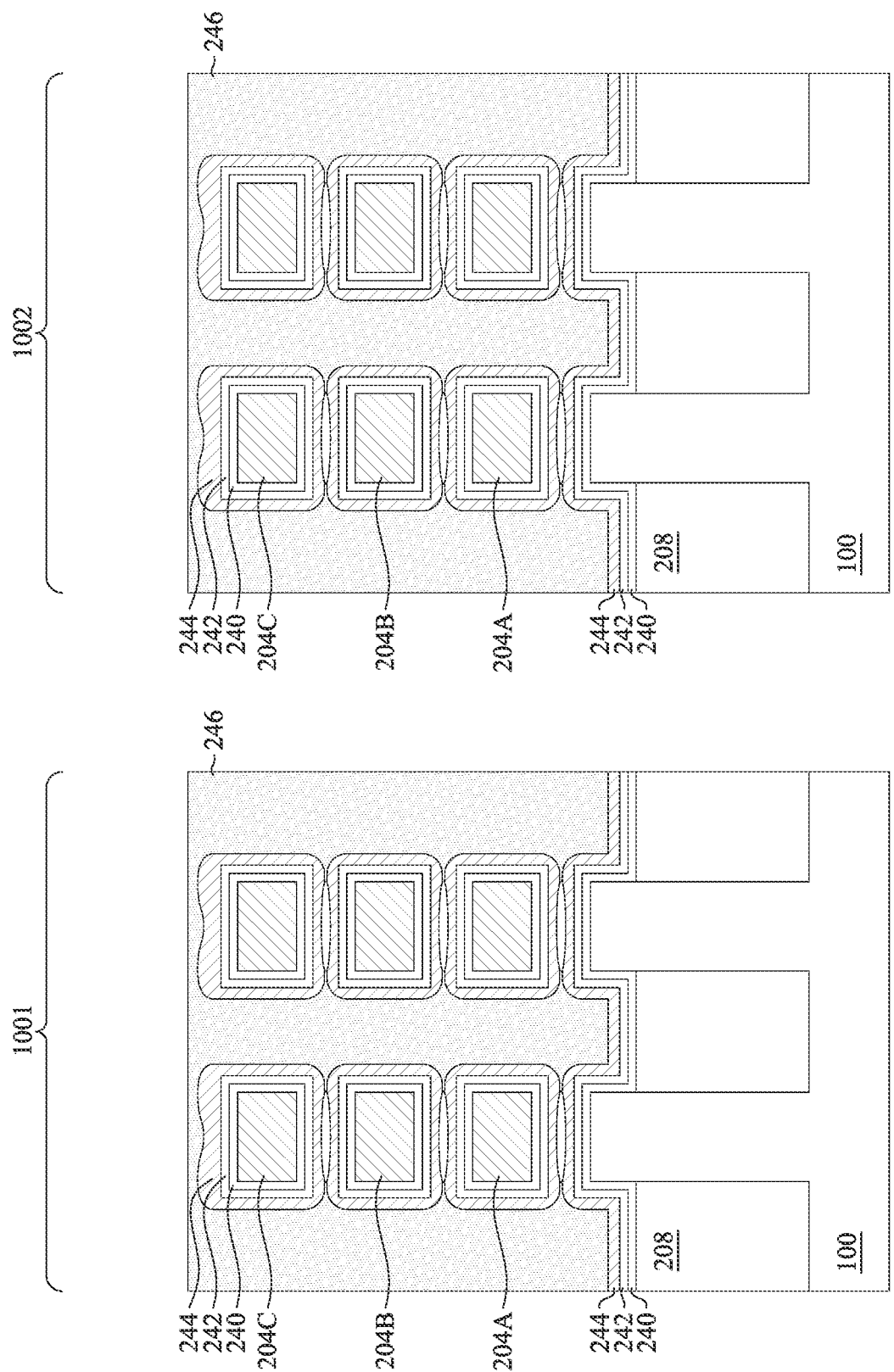
Figure 20D:
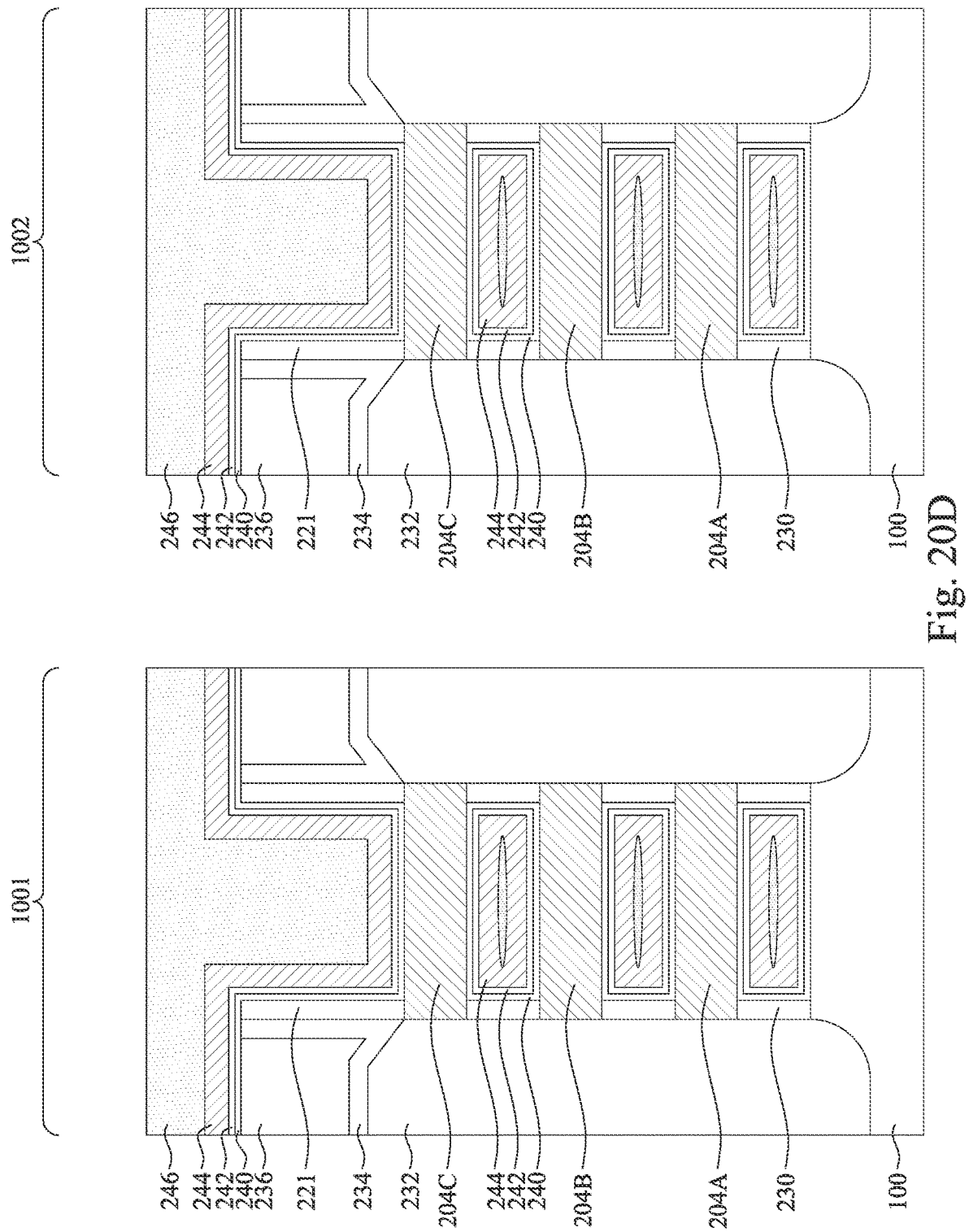

In FIGS. 20A-20D, a bottom anti-reflective coating (BARC) layer 246 is formed over the hard mask layer 244. The BARC layer 246 serves to reduce reflection during a following lithography exposure process. In some embodiments, the BARC layer 246 may be an organic BARC layer spin-coated on both the first device region 1001 and the second device region 1002. If the hard mask layer 244 includes unsealed seam-holes GP in the sheet-sheet spaces 243 as illustrated in FIG. 19C, BARC materials may inadvertently flow into the seam-holes GP, as illustrated in FIGS. 20C and 20D. In a following plasma ashing process for removing the BARC layer 246, it is difficult to remove BARC materials in the seam-holes GP, which in turn may leave BARC residues in the sheet-sheet spaces, thus impeding following deposition of gate metal materials in the sheet-sheet spaces. In contrast, if the hard mask layer 244 is seam-free as illustrated in FIG. 19A, no BARC material flows into the sheet-sheet spaces as illustrated in FIG. 20A, and thus no BARC residue remains in the sheet-sheet spaces after the following plasma ashing process is complete, which in turn facilitates following deposition of gate metal materials in the sheet-sheet spaces.

Figure 21A:
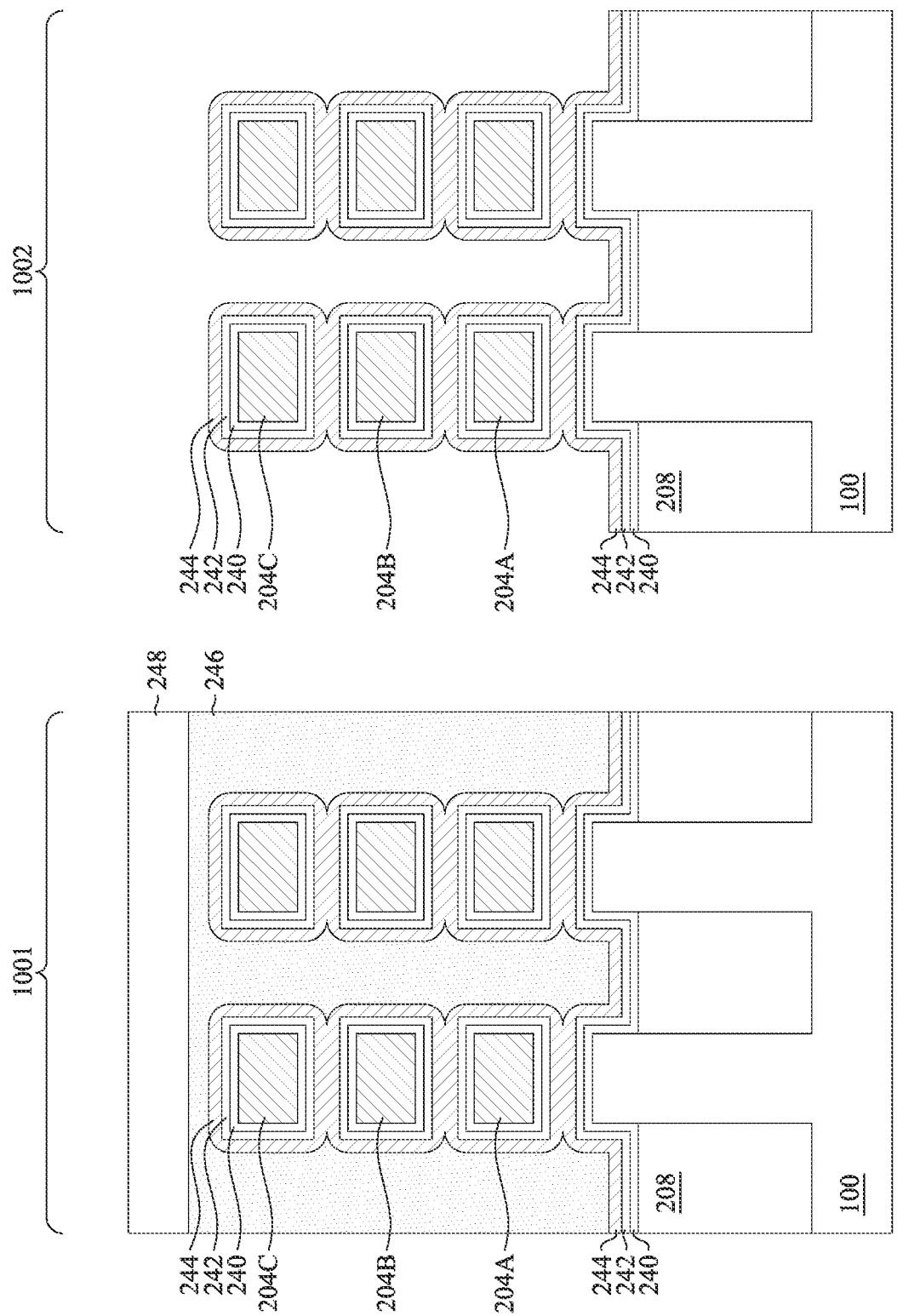

In FIGS. 21A and 21B, a photoresist layer 248 is then formed over the BARC layer 246 and patterned to expose the second device region 1002 but not expose the first device region 1001. In some embodiments, the photoresist layer 248 is an organic material formed using a spin-on coating process, followed by patterning the organic material to expose the second device region 1002 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. The BARC layer 246 serves to reduce reflection during the exposure of the photoresist material. A bake or cure operation may be performed to harden the exposed photoresist material, and a developer may be used to remove either the exposed or unexposed portions of the photoresist material depending on whether a positive or negative resist is used.

After the patterned photoresist layer 248 is formed, the exposed portion of the BARC layer 246 in the second device region 1002 is removed by using the patterned photoresist layer 248 as an etch mask, so that the hard mask layer 244 is exposed in the second device region 1002. In some embodiments, the hard mask layer 244 may be etched by using a plasma dry etching using fluorine-based and/or chlorine-based etchants.

Figure 22A:
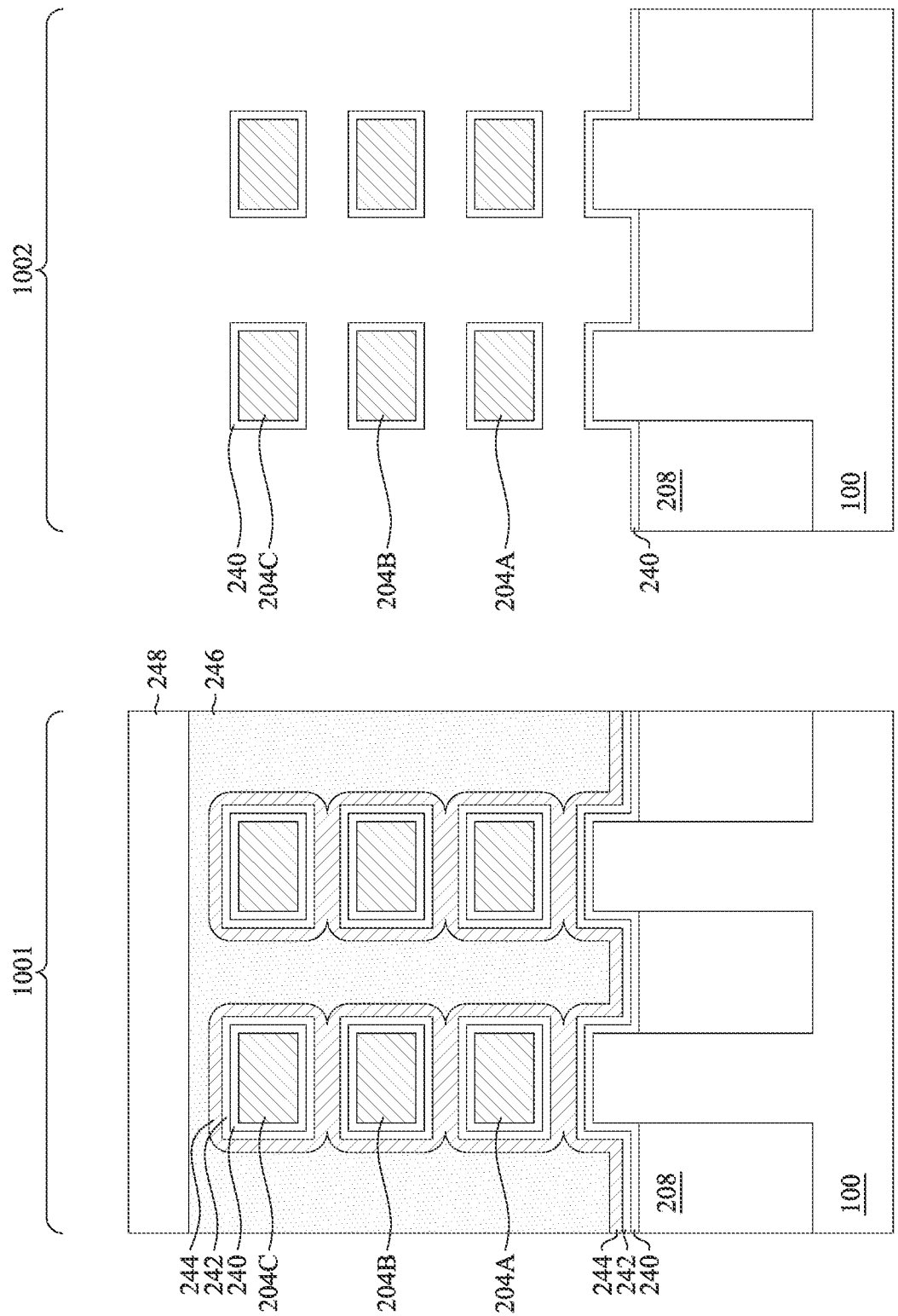
Figure 22B:
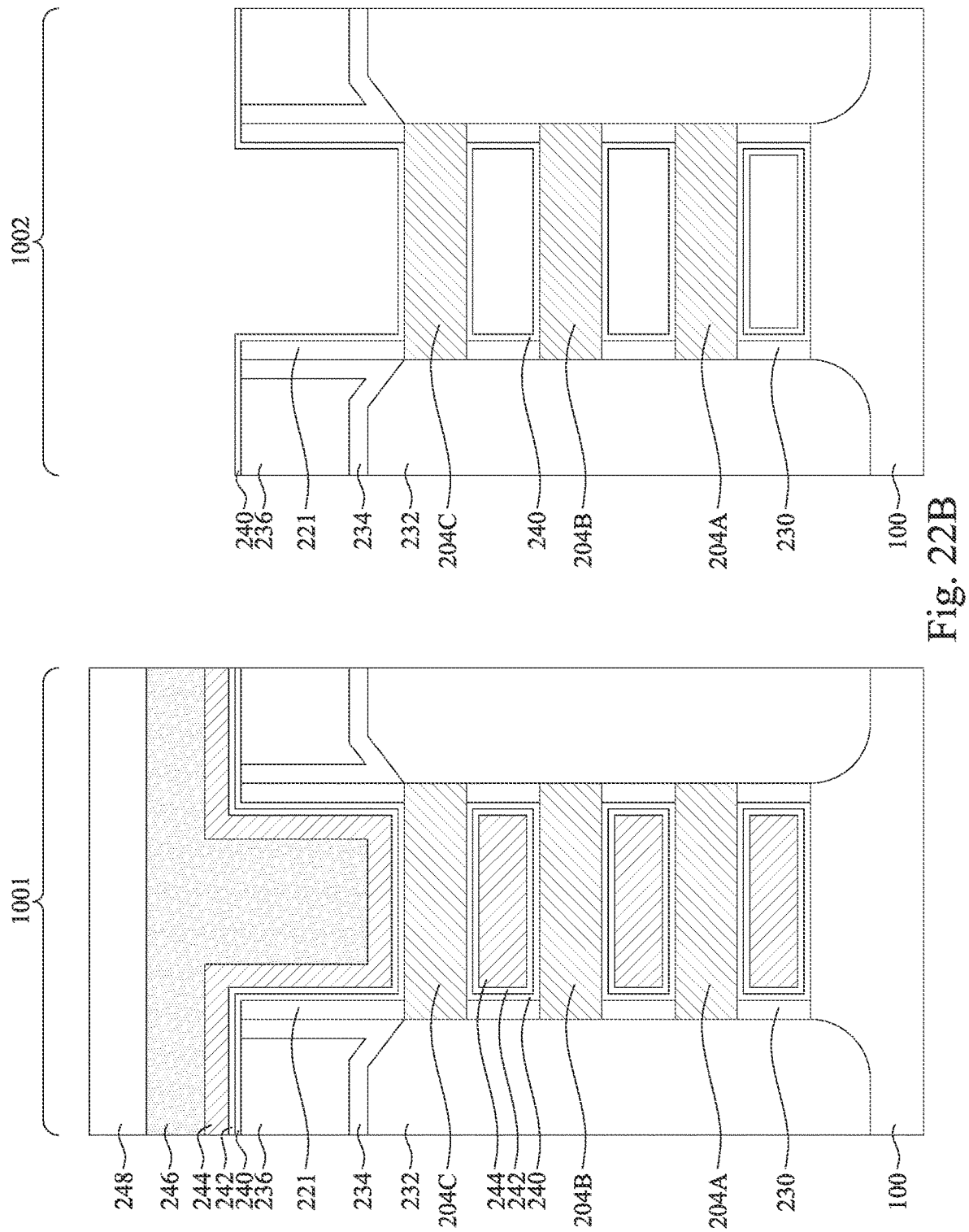

Next, in FIGS. 22A and 22B, exposed portion of the hard mask layer 244 in the second device region 1002 and the underlying portion of the second gate dielectric layer 242 in the second device region 1002 are removed by using the photoresist layer 248 as an etch mask, so that the first gate dielectric layer is exposed in the second device region. In some embodiments, the hard mask layer 244, and the second gate dielectric layer 242 may be etched by using a plasma dry etching using fluorine-based and/or chlorine-based etchants. In some embodiments, the BARC layer 246, the hard mask layer 244, and the second gate dielectric layer 242 in the second device region 1002 are etched in a continuous plasma etching process using a same etchant. In some other embodiments, two or more of the BARC layer 246, the hard mask layer 244, and the second gate dielectric layer 242 in the second device region 1002 are etched in different etching processes using different etchants. For example, the hard mask layer 244 may be removed by a wet etching process using an etchant that is selective to the material of the hard mask layer 244. Stated differently, the etchant used in removing the hard mask layer 244 etches the material (e.g., aluminum oxide) of the hard mask layer 244 at a faster etch rate than etching the material (e.g., lanthanum oxide) of the second gate dielectric layer 242. After the hard mask layer 244 removal is complete, the exposed second gate dielectric layer 242 is removed by dry etching or wet etching using an etchant that is selective to the material of the second gate dielectric layer 242. In this scenario, the etchant used in removing the second gate dielectric layer 242 etches the material (e.g., lanthanum oxide) of the second gate dielectric layer 242 at a faster etch rate than etching the material (e.g., hafnium oxide) of the first gate dielectric layer 240, so as to prevent damaging the first gate dielectric layer 240.

Figure 23A:
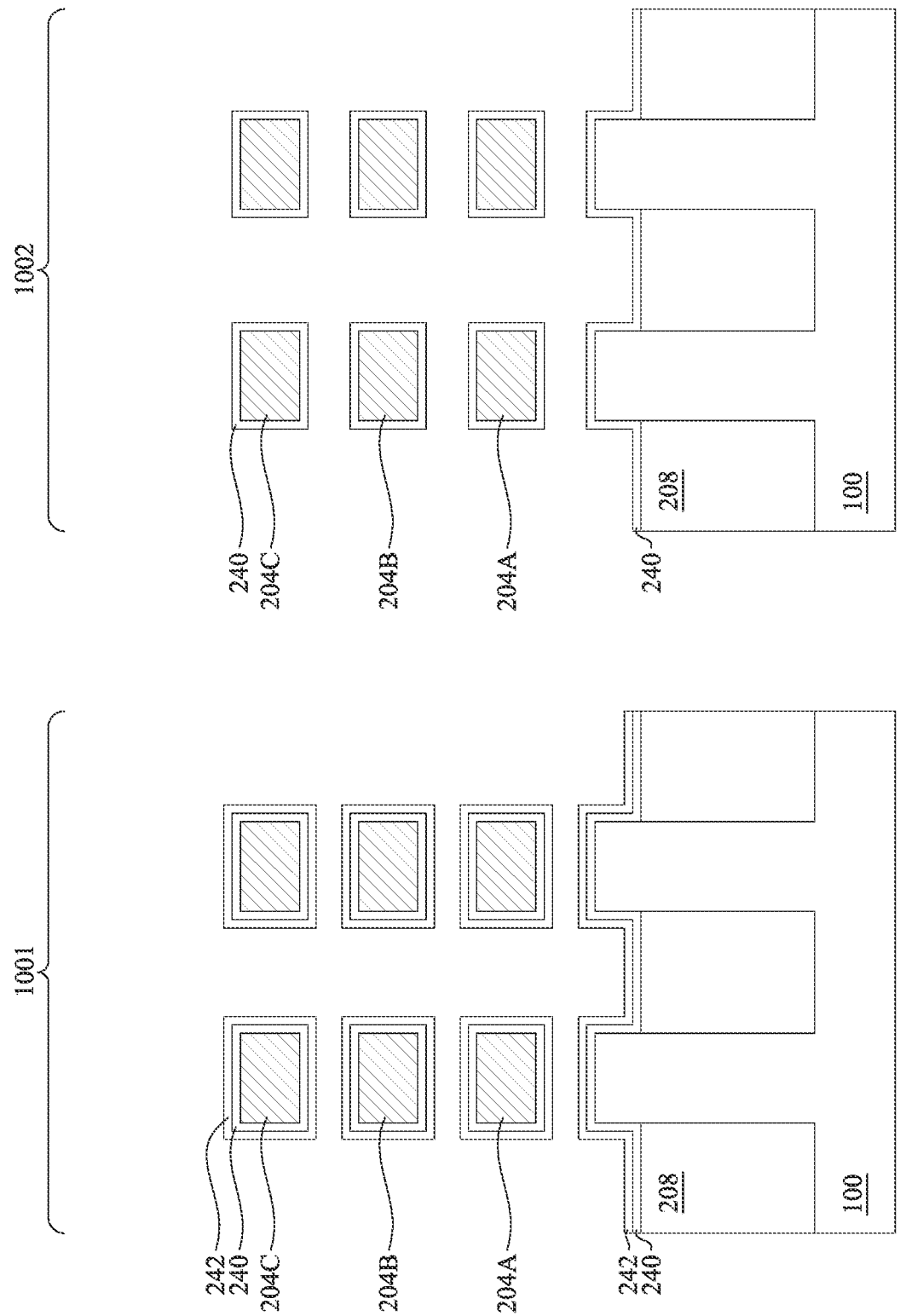
Figure 23B:
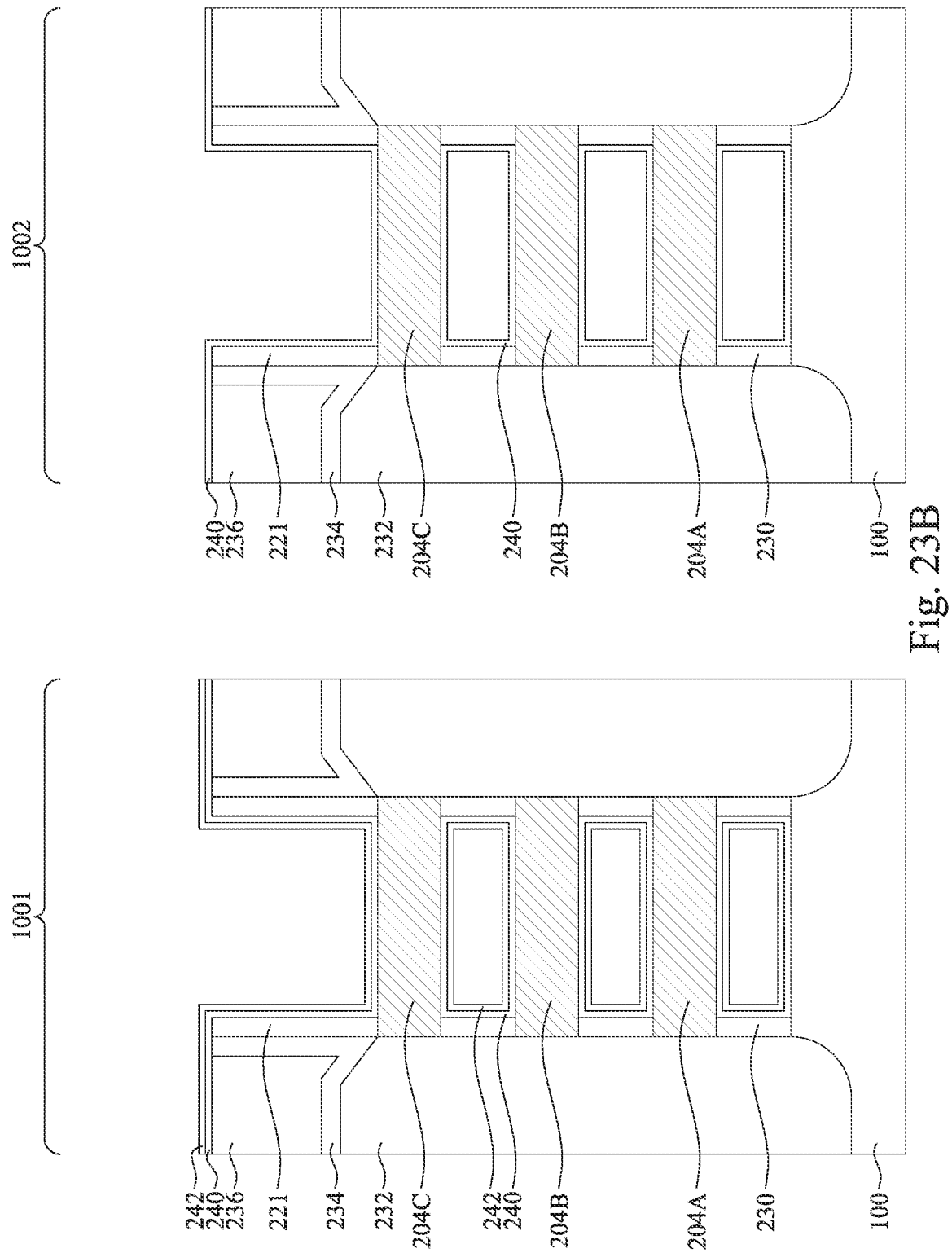

Next, the photoresist layer 248 and the BARC layer 246 are removed from the first device region 1001 by using, for example, a plasma ash process. The resultant structure is illustrated in FIGS. 23A and 23B. In some embodiments, a plasma ash process is performed such that the temperature of the organic materials of the photoresist and BARC are increased until these organic materials experience a thermal decomposition and may be removed. The remaining hard mask layer 244 is removed from the first device region 1001 by, for example, a wet etching process using an etchant that is selective to the material of the hard mask layer 244. Stated differently, the etchant used in removing the hard mask layer 244 from the first device region 1001 etches the material (e.g., aluminum oxide) of the hard mask layer 244 at a faster etch rate than etching the material (e.g., lanthanum oxide) of the second gate dielectric layer 242.

In FIGS. 23A and 23B, a transistor in the first device region 1001 has a first gate dielectric layer 240 and a second gate dielectric layer 242, whereas a transistor in the second device region 1002 has a first gate dielectric layer 240 but is free of a second gate dielectric layer 242. Therefore, the transistor in the first device region 1001 has a different gate dielectric composition than the transistor in the second device region 1002, which in turn results in threshold voltage difference between the transistor in the first device region 1001 and the transistor in the second device region 1002.

Figure 24A:
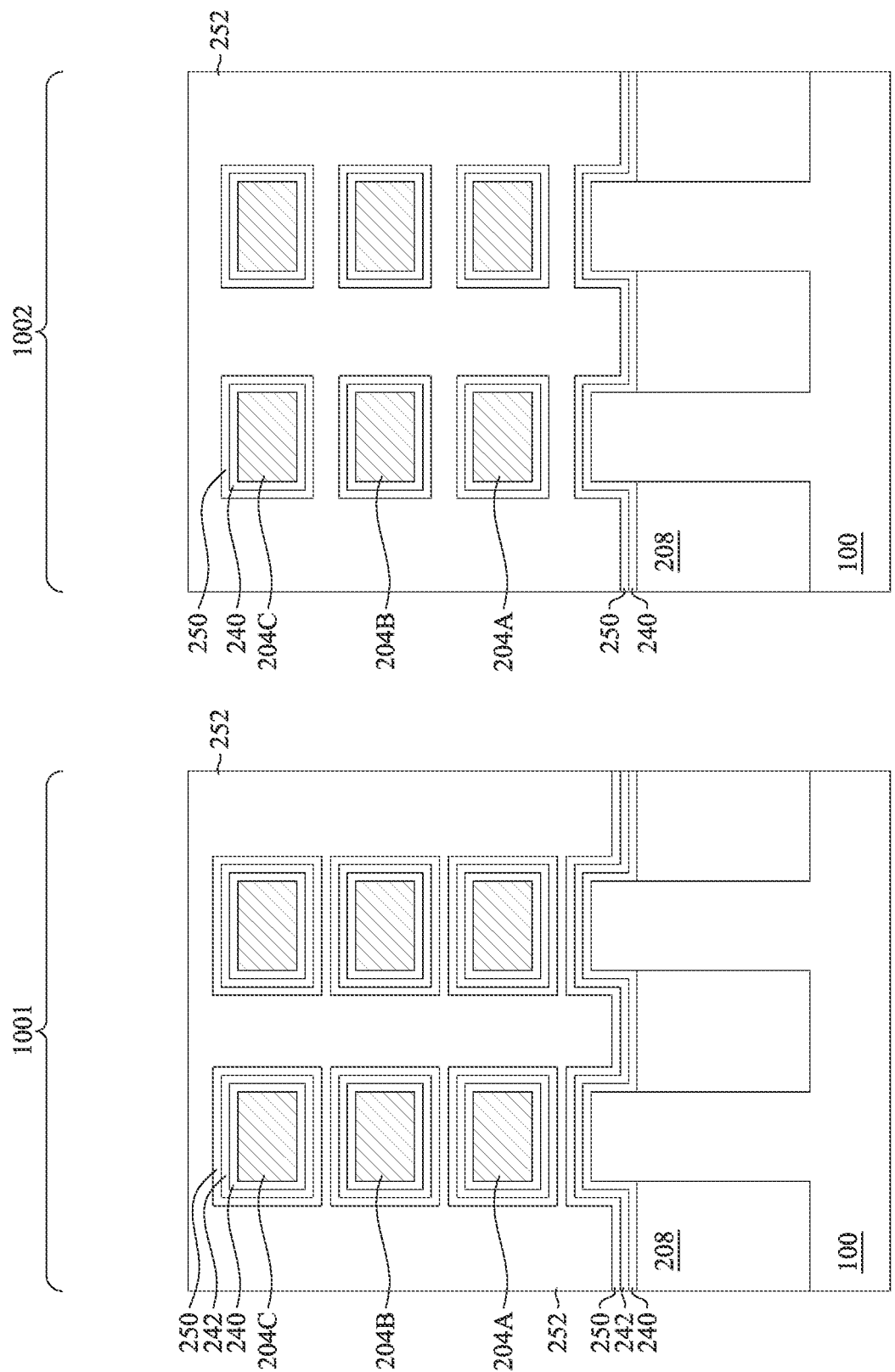

In FIGS. 24A and 24B, one or more work function metal layers 250 is deposited on the second gate dielectric layer 242 in the first device region 1001, and on the first gate dielectric layer 240 in the second device region 1002, followed by depositing a fill metal 252 on the one or more work function metal layers 250 to fill a remainder of gate trenches. A CMP is then performed on the fill metal 252 until the ILD layer 236 is exposed, resulting in the fill metal 252, the one or more work function metal layers 250, the first and second gate dielectric layers 240, 242, the CESL 234, and the ILD layer 236 having substantially level top surfaces.

In some embodiments, a number of work function metal layers 250 in the first device region 1001 is the same as a number of the work function metal layers 250 in the second device region 1002, if the gate dielectric composition difference achieves a satisfactory threshold voltage tuning result. In some other embodiments, a number of the work function metal layer 250 in the first device region 1001 may be more or fewer than a number of the work function metal layer 250 in the second device region 1002 for further aiding in threshold voltage tuning. Gate stacks having different numbers of work function metal layers 250 may be fabricated using suitable photolithography and etching processes as described previously with respect to FIGS. 18A-22B. For example, first and second work function metal layers are globally deposited over the first and second device region 1001 and 1002, and a hard mask layer is then deposited over the second work function metal layer by using the ALD process as described previously with respect to FIGS. 18A-19E, and the hard mask layer is then patterned to expose a portion of the second work function metal layer in one of the first and second device regions 1001 and 1002, followed by removing the exposed portion of the second work function metal layer. As a result, a first gate stack in a first one of the first and second device regions 1001 and 1002 has two work function metal layers, and a second gate stack in a second one of the first and second device regions 1001 and 1002 has one work function metal layer.

The one or more work function metal layers 250 may include one or more work function metals to provide a suitable work function for the high-k/metal gate structures. For an n-type GAA FET, the one or more work function metal layers 250 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the one or more work function metal layers 250 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 252 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that lengthened pulse time and/or purge time in each ALD cycle of hard mask deposition can reduce a number of seam-holes to an acceptable amount in a resultant hard mask layer or even form a seam-free hard mask layer. Another advantage is that a seam-free hard mask layer can aid in reducing the risk that organic materials (e.g., BARC materials) flow into sheet-sheet spaces between corresponding nanosheets. Another advantage is that a hard mask layer having an acceptable amount of seam-holes may be advantageous for the hard mask removal process.

In some embodiments, a method comprises forming a first fin and a second fin over a substrate, the first and second fins each comprising alternately stacking first semiconductor layers and second semiconductor layers; forming dummy gate structures over the first and second fins, and gate spacers on either side of the dummy gate structures; removing the dummy gate structures to form a first gate trench over first fin and a second gate trench over the second fin; removing the first semiconductor layers such that the second semiconductor layers are suspended in the first and second gate trenches; depositing a first gate dielectric layer around each of the second semiconductor layers and a second gate dielectric layer around the first gate dielectric layer; performing an atomic layer deposition (ALD) process to form a hard mask layer around the second gate dielectric layer, the ALD process comprising pulsing a first precursor into a deposition chamber for a first pulse time longer than about one second; patterning the hard mask layer; and with the patterned hard mask layer in place, etching a portion of the second gate dielectric layer in the second gate trench. In some embodiments, the ALD process further comprises after pulsing the first precursor into the deposition chamber, pulsing a second precursor into the deposition chamber for a second pulse time longer than about one second. In some embodiments, the first pulse time is substantially the same as the second pulse time. In some embodiments, the first precursor is oxygen-containing, and the second precursor is metal-containing. In some embodiments, the first precursor is oxygen-containing, and the second precursor is aluminum-containing. In some embodiments, the ALD process further comprises after pulsing the first precursor into the deposition chamber and before pulsing the second precursor into the deposition chamber, purging the deposition chamber for a purge time, and the purge time is at least about fifteen times the first pulse time. In some embodiments, the ALD process further comprises after pulsing the second precursor into the deposition chamber, purging the deposition chamber for a purge time, and the purge time is at least about ten times the second pulse time. In some embodiments, the second gate dielectric layer and the hard mask layer are metal oxide layers having different metal compositions. In some embodiments, the second gate dielectric layer comprises lanthanum oxide, and the hard mask layer comprises aluminum oxide. In some embodiments, the first gate dielectric layer comprises hafnium oxide. In some embodiments, the method further comprises after etching the portion of the second gate dielectric layer in the second gate trench, removing the patterned hard mask layer; and after removing the patterned hard mask layer, depositing one or more metal materials in the first and second gate trenches.

In some embodiments, a method comprises forming first and second fins over a substrate, the first and second fins each comprising alternately stacking first semiconductor layers and second semiconductor layers; forming first and second dummy gate structures across the first and second fins; forming first gate spacers on either side of the first dummy gate structure and second gate spacers on either side of the second dummy gate structure; removing the first and second dummy gate structures to form a first gate trench between the first gate spacers and a second gate trench between the second gate spacers; selectively etching the first semiconductor layers in the first and second gate trenches; depositing a first gate dielectric layer in the first and second gate trenches and a second gate dielectric layer over the first gate dielectric layer; forming a hard mask layer over the second gate dielectric layer by using one or more atomic layer deposition (ALD) cycles each comprising sequentially performing a first pulse step, a first purge step for a first purge time, a second pulse step, and a second purge step for a second purge time, wherein the first purge time is longer than the second purge time; patterning the hard mask layer to expose a portion of the second gate dielectric layer; and etching the exposed portion of the second gate dielectric layer. In some embodiments, the first pulse step pulses an oxygen-containing precursor for a pulse time shorter than both the first and second purge times. In some embodiments, the first purge time is at least about fifteen times the pulse time. In some embodiments, the second pulse step pulses an aluminum-containing precursor for a pulse time shorter than both the first and second purge times. In some embodiments, the second purge time is at least about ten times the pulse time. In some embodiments, the first pulse step continues for a first pulse time, and the second pulse step continues for a second pulse time, and a ratio of the first purge time to the first pulse time is greater than a ratio of the second purge time to the second pulse time.

In some embodiments, a method comprises forming a first fin and a second fin, the first and second fins each comprising alternately stacking first semiconductor layers and second semiconductor layers; forming dummy gate structures across the first and second fins, respectively; forming gate spacers on either side of the dummy gate structures; removing the dummy gate structures and the first semiconductor layers to form a plurality of spaces between corresponding ones of the second semiconductor layers; depositing in sequence a first gate dielectric layer and a second gate dielectric layer into the plurality of spaces between corresponding ones of the second semiconductor layers; performing an atomic layer deposition (ALD) process to form a hard mask layer on the second gate dielectric layer, the ALD process comprising pulsing a first precursor into a deposition chamber for a first pulse time, and purging the first precursor from the deposition chamber for a first purge time, the first purge time being at least about fifteen times the first pulse time; patterning the hard mask layer to expose a portion of the second gate dielectric layer; and etching the exposed portion of the second gate dielectric layer. In some embodiments, the first pulse time is greater than about one second. In some embodiments, the ALD process further comprises after purging the first precursor from the deposition chamber, pulsing a second precursor into the deposition chamber for a second pulse time, the second pulse time being greater than about one second.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    depositing a first gate dielectric layer over a first semiconductor channel and a second semiconductor channel;
    depositing a second gate dielectric layer over the first gate dielectric layer;
    forming a layer over the second gate dielectric layer by using one or more atomic layer deposition (ALD) cycles each comprising sequentially performing a first pulse step for a first pulse time, a first purge step for a first purge time, a second pulse step for a second pulse time, and a second purge step for a second purge time, wherein a ratio of the first purge time to the first pulse time is greater than a ratio of the second purge time to the second pulse time;
    patterning the layer to expose a portion of the second gate dielectric layer; and
    etching the exposed portion of the second gate dielectric layer.

2. The method of claim 1, wherein the first purge time is greater than the second purge time.

3. The method of claim 1, wherein the first pulse time is the same as the second pulse time.

4. The method of claim 1, wherein the first pulse step comprises pulsing an oxygen-containing precursor to the second gate dielectric layer.

5. The method of claim 4, wherein the oxygen-containing precursor is $H_2O$.

6. The method of claim 1, wherein the second pulse step comprises pulsing an aluminum-containing precursor to the second gate dielectric layer.

7. The method of claim 6, wherein the aluminum-containing precursor is $Al_2(CH_3)_6$.

8. The method of claim 1, wherein etching the exposed portion of the second gate dielectric layer is performed such that the exposed portion of the second gate dielectric layer is removed from the second semiconductor channel, while leaving a portion of the second gate dielectric layer over the first semiconductor channel.

9. The method of claim 1, further comprising:
depositing a gate metal material over the first semiconductor channel and the second semiconductor channel after etching the exposed portion of the second gate dielectric layer.

10. A method, comprising:
forming a multi-layer high-k dielectric stack spanning a first device region and a second device region;
depositing a layer over the multi-layer high-k dielectric stack by using one or more ALD cycles each comprising sequentially performing a first pulse step for a first pulse time, a first purge step for a first purge time, a second pulse step for a second pulse time, and a second purge step for a second purge time, wherein a difference between the first purge time and the second purge time is greater than a difference between the first pulse time and the second pulse time;
patterning the layer to expose a portion of the multi-layer high-k dielectric stack; and
with the patterned layer in place, trimming the exposed portion of the multi-layer high-k dielectric stack.

11. The method of claim 10, wherein after trimming the exposed portion of the multi-layer high-k dielectric stack, a number of layers of the multi-layer high-k dielectric stack within the first device region is greater than a number of layers of the multi-layer high-k dielectric stack within the second device region.

12. The method of claim 10, wherein the first pulse time is longer than a time within a range of 0.8 seconds to 1.2 seconds.

13. The method of claim 10, wherein the second pulse time is longer than a time within a range of 0.8 seconds to 1.2 seconds.

14. The method of claim 10, further comprising:
after trimming the exposed portion of the multi-layer high-k dielectric stack, removing the patterned layer; and
after removing the patterned layer, depositing a gate metal over the multi-layer high-k dielectric stack.

15. A method, comprising:
forming a multi-layer dielectric stack over a first set of nanosheets and a second set of nanosheets;
forming a layer over the multi-layer dielectric stack by using one or more ALD cycles each comprising sequentially performing a first pulse step for a first pulse time, a first purge step for a first purge time, a second pulse step for a second pulse time, and a second purge step for a second purge time, wherein the first purge time is greater than the second pulse time;
patterning the layer to expose a portion of the multi-layer dielectric stack;
trimming the portion of the multi-layer dielectric stack; and
depositing a gate metal over the trimmed portion of the multi-layer dielectric stack and an untrimmed portion of the multi-layer dielectric stack.

16. The method of claim 15, wherein the second purge time is less than the first purge time.

17. The method of claim 15, wherein the first purge time is at least a time within a range of twelve times the first pulse time to eighteen times the first pulse time.

18. The method of claim 15, wherein the first purge time is at least a time within a range of twelve times the second pulse time to eighteen times the second pulse time.

19. The method of claim 15, wherein the trimmed portion of the multi-layer dielectric stack is over the first set of nanosheets, and the untrimmed portion of the multi-layer dielectric stack is over the second set of nanosheets.

20. The method of claim 15, wherein the second purge time is at least a time within a range of eight times the second pulse time to twelve times the second pulse time.

* * * * *